US 9,100,034 B2

(12) United States Patent
Oshima et al.

(10) Patent No.: US 9,100,034 B2
(45) Date of Patent: Aug. 4, 2015

(54) SEMICONDUCTOR INTEGRATED CIRCUIT DEVICE

(71) Applicant: RENESAS ELECTRONICS CORPORATION, Kanagawa (JP)

(72) Inventors: Takashi Oshima, Tokyo (JP); Tatsuji Matsuura, Kanagawa (JP); Yuichi Okuda, Kanagawa (JP); Hideo Nakane, Kanagawa (JP); Takaya Yamamoto, Kanagawa (JP); Keisuke Kimura, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/203,052

(22) Filed: Mar. 10, 2014

(65) Prior Publication Data

US 2014/0253352 A1 Sep. 11, 2014

(30) Foreign Application Priority Data

Mar. 11, 2013 (JP) ................................. 2013-047712

(51) Int. Cl.
H03M 1/10 (2006.01)
H03M 1/38 (2006.01)
H03M 1/46 (2006.01)

(52) U.S. Cl.
CPC ............ H03M 1/1038 (2013.01); *H03M 1/109* (2013.01); *H03M 1/38* (2013.01); *H03M 1/46* (2013.01)

(58) Field of Classification Search
None
See application file for complete search history.

(56) References Cited

U.S. PATENT DOCUMENTS

| 7,961,131 | B2* | 6/2011 | Craninckx | 341/172 |
|---|---|---|---|---|
| 8,319,675 | B2* | 11/2012 | Ogawa et al. | 341/155 |
| 8,421,658 | B1* | 4/2013 | Yau et al. | 341/120 |
| 8,456,335 | B2* | 6/2013 | Oshima | 341/118 |
| 8,610,616 | B2* | 12/2013 | Baghini et al. | 341/172 |
| 2014/0203958 | A1* | 7/2014 | Okuda et al. | 341/172 |

FOREIGN PATENT DOCUMENTS

JP 2000-68830 A 3/2000

OTHER PUBLICATIONS

Liu et al., "A 12b 22.5/45MS/s 3.0mW 0.059 mm2 CMOS SAR ADC Achieving Over 90dB SFDR", IEEE 2010 International Solid State Circuits Conference, pp. 380-381, Feb. 2010.

* cited by examiner

*Primary Examiner* — Howard Williams
(74) *Attorney, Agent, or Firm* — McDermott Will & Emery LLP

(57) ABSTRACT

A digital-correction-type A/D converter which is a charge sharing type and performing successive approximation is realized in a small area. The A/D converter is configured with an A/D conversion unit which is a charge sharing type and performing successive approximation, a digital correction unit which receives a digital output of the A/D conversion unit and performs digital correction to the digital output, and a holding unit which holds a test signal. A test signal of a common value from the holding unit is inputted into the A/D conversion unit in the first period and the second period. The A/D conversion correction coefficient for the digital correction unit is calculated on the basis of the digital correction result of the digital correction unit in the first period, and the digital correction result of the digital correction unit in the second period.

11 Claims, 40 Drawing Sheets

FIG. 6
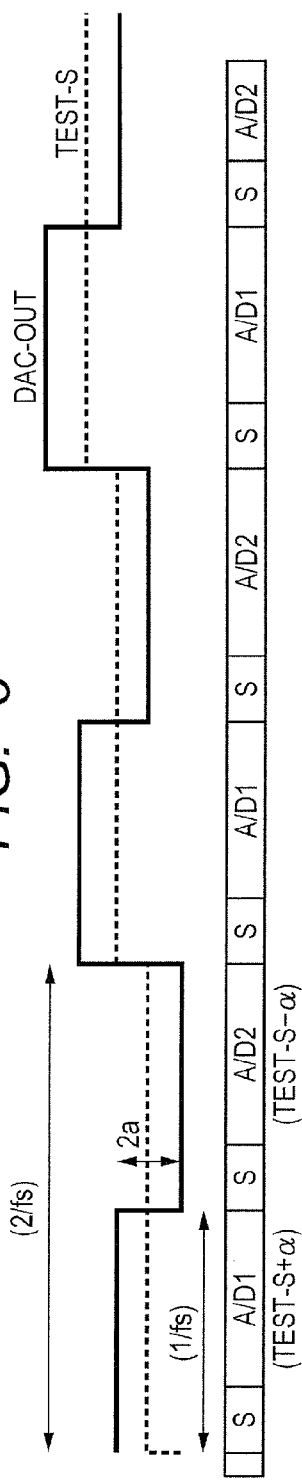
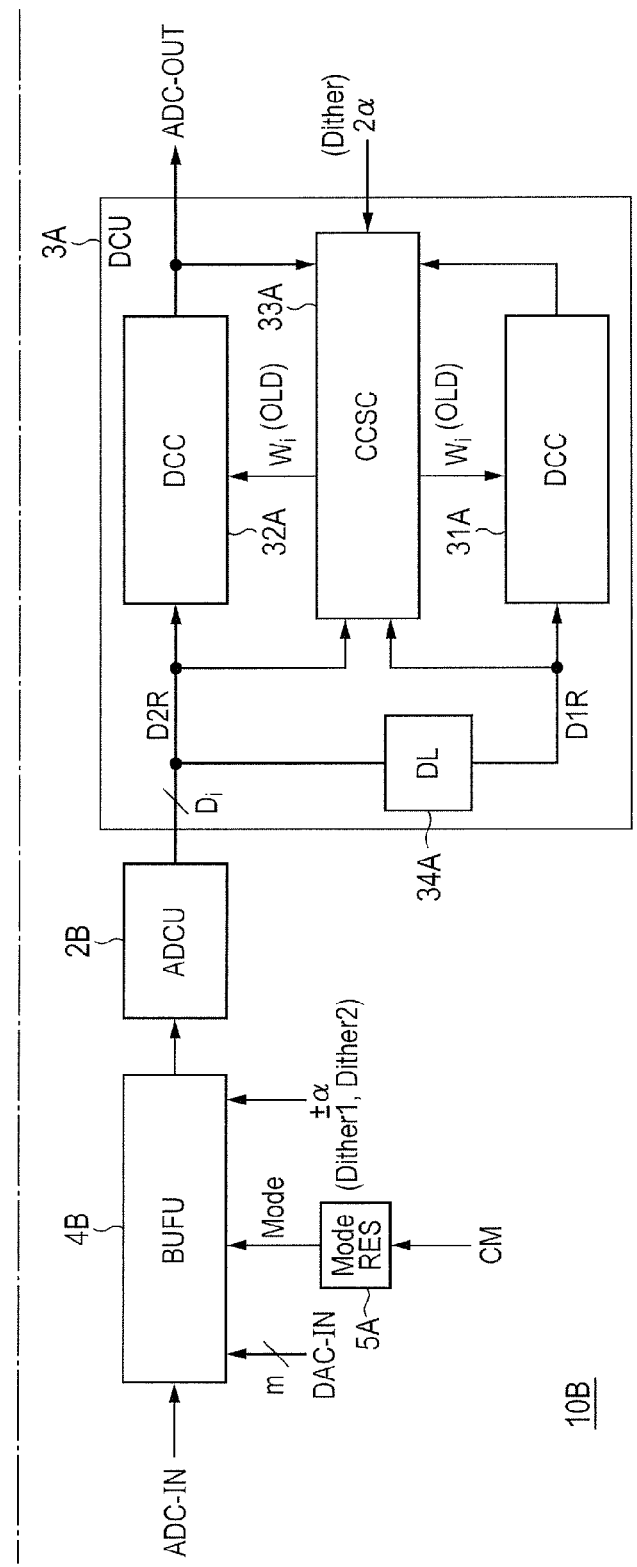

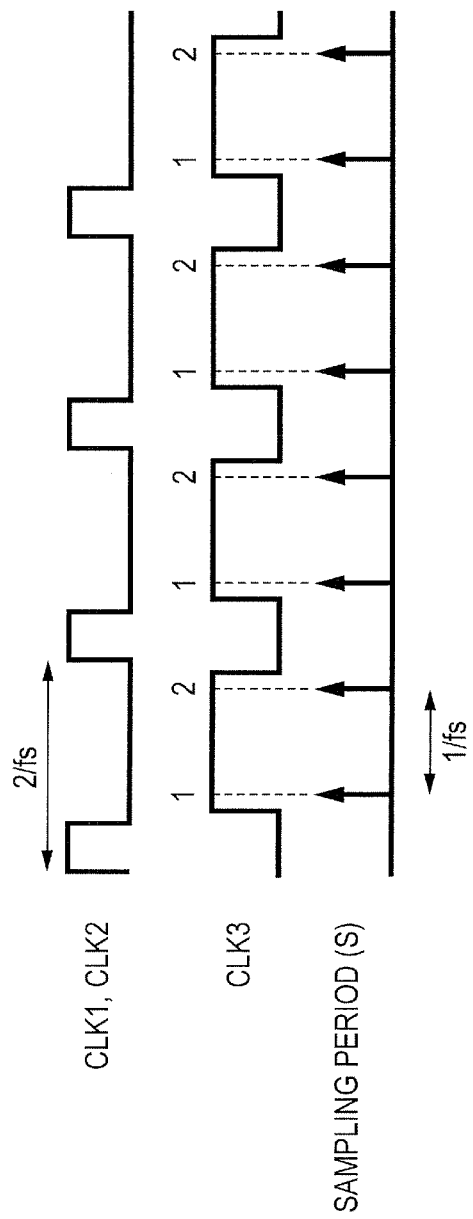

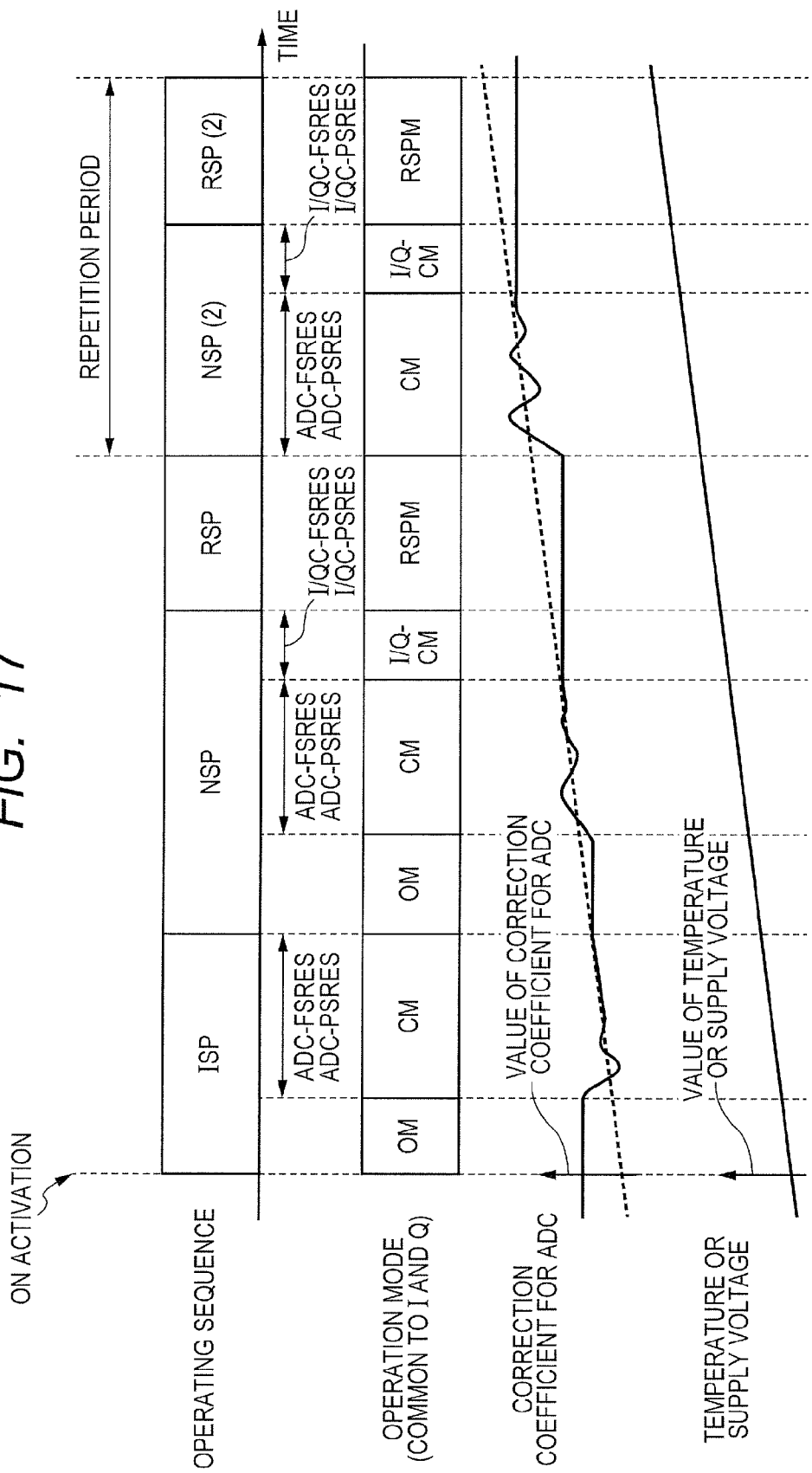

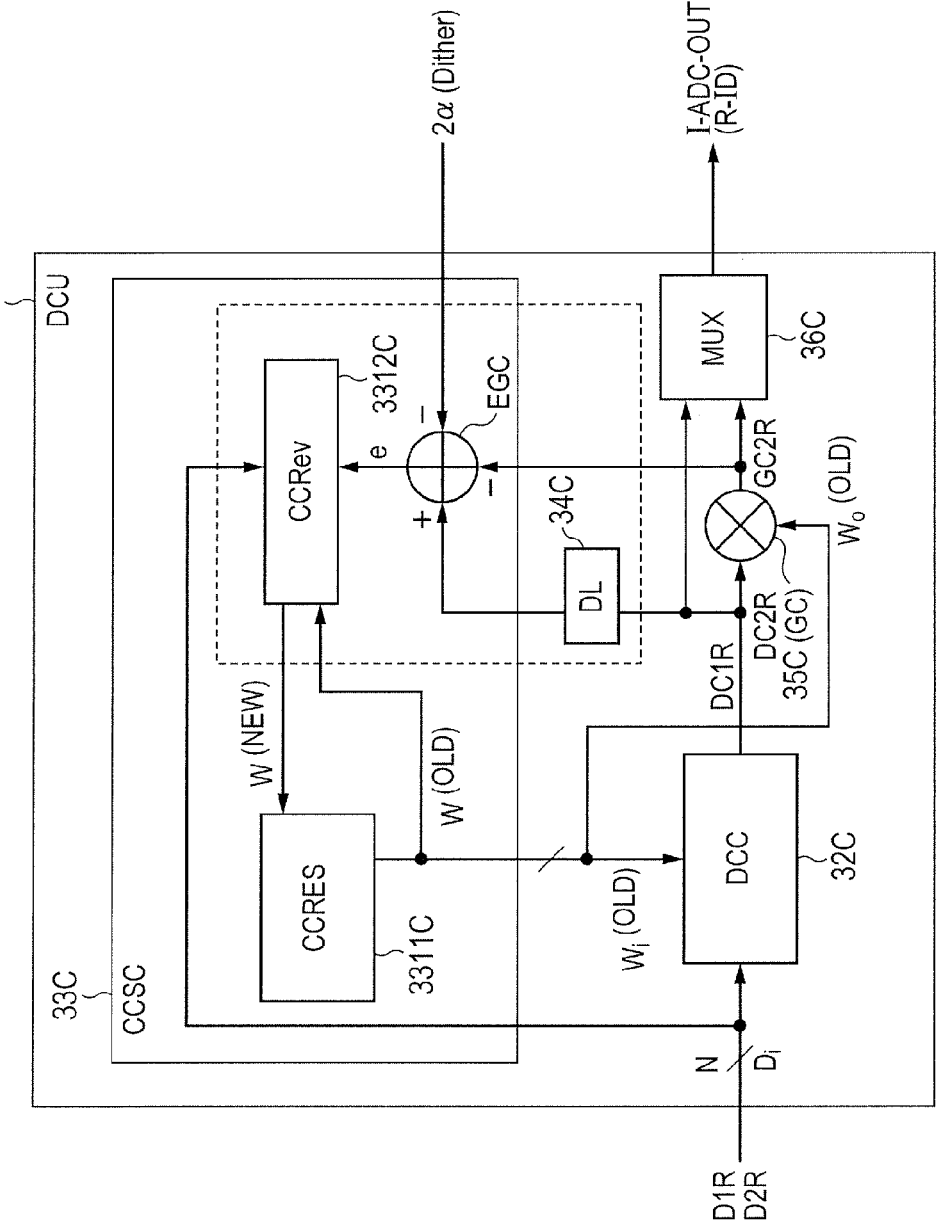

SEMICONDUCTOR INTEGRATED CIRCUIT DEVICE

CROSS-REFERENCE TO RELATED APPLICATIONS

The disclosure of Japanese Patent Application No. 2013-047712 Filed on Mar. 11, 2013 including the specification, drawings, and abstract is incorporated herein by reference in its entirety.

BACKGROUND

The present invention relates to a semiconductor integrated circuit device, and is applicable to a semiconductor integrated circuit device provided with an A/D converter, for example.

Some A/D converter is configured with an A/D conversion unit which converts an analog signal into a digital signal, and a digital correction unit which performs digital correction to the output of the A/D conversion unit and outputs the corrected output as an A/D conversion result of the A/D converter. The A/D converter which performs the digital correction using the A/D conversion unit and the digital correction unit in this way functions as an A/D converter with high speed, high accuracy, and low power consumption. Hereinafter, analog to digital conversion is called A/D conversion and an analog to digital converter is called an A/D converter.

An A/D converter which performs digital correction is disclosed by Non Patent Literature 1. The A/D converter disclosed by Non Patent Literature 1 is configured with one A/D conversion unit and two digital correction units, to perform the digital correction. The A/D conversion unit is of a charge redistribution type and performs successive approximation. The A/D conversion unit performs A/D conversion twice to the same sample voltage. After correcting the two A/D conversion results by each digital correction unit, a correction coefficient is searched for on the basis of the difference of these outputs.

(Non Patent Literature 1) W. Liu et al; "A 12b 22.5/45 MS/s 3.0 mW 0.059 mm$^2$ CMOS SARADC achieving over 90 dB SFDR," IEEE 2010 International Solid-State Circuits Conference, pp. 380-381, February 2010.

SUMMARY

In the A/D converter which performs digital correction, an exclusive-use analog circuit is necessary separately, in order to calculate an A/D conversion correction coefficient to be employed in the digital correction unit; accordingly, there arise issues of increase of the area and increase of the power consumption due to the exclusive-use analog circuit. The A/D converter described by Non Patent Literature 1 requires a comparatively small additional circuit; accordingly it is possible to suppress the increase of the area and the increase of the power consumption to some extent.

In a flash type A/D conversion unit or a pipeline type A/D conversion unit, there are great issues of increase of the area and increase of the power consumption on the part of analog circuits. In an A/D conversion unit which is of a charge redistribution type and performing successive approximation, it is necessary to access a reference voltage for every conversion cycle by the number of conversion bits. Therefore, a regulator for generating the reference voltage is required to operate at a high speed, leading to a complicated design as well as increased power consumption. On the other hand, in an A/D conversion unit which is of a charge sharing type and performing successive approximation, it is necessary to access a reference voltage only once for every conversion cycle. Accordingly, it is sufficient that a regulator for generating the reference voltage may operate at a low speed, leading to a simple design as well as small power consumption.

However, the A/D conversion unit which is of a charge sharing type and performing successive approximation does not store a sampling charge after each A/D conversion; therefore, it is difficult to be employed as the A/D conversion unit described in Non Patent Literature 1.

The other issues and new features of the present invention will become clear from the description of the present specification and the accompanying drawings.

A semiconductor integrated circuit device according to one embodiment is configured with an A/D conversion unit which is of a charge sharing type and performs successive approximation, a digital correction unit which performs digital correction to a digital output received from the A/D conversion unit, and a holding unit which holds a test signal during continuous sampling periods in the A/D conversion unit.

According to the embodiment, it is possible to realize a digital-correction-type A/D converter with an A/D conversion unit which is of a charge sharing type and performs successive approximation, while reducing the size of the exclusive-use analog circuit to be added in order to calculate an A/D conversion correction coefficient.

BRIEF DESCRIPTION OF THE DRAWINGS

FIG. 6 is a drawing illustrating a configuration of a semiconductor integrated circuit device according to Implementation Example 2, and a timing flow in an A/D conversion test operation of an A/D converter;

FIG. 13B is a drawing illustrating timing of a control clock of the buffer unit according to Implementation Example 4;

FIG. 17 is a drawing illustrating an operation of a communication system including the semiconductor integrated circuit device according to Implementation Example 6;

FIG. 19B is a block diagram illustrating a correction coefficient search unit according to Modified Example 3 of Implementation Example 6;

DETAILED DESCRIPTION

Figure 22:
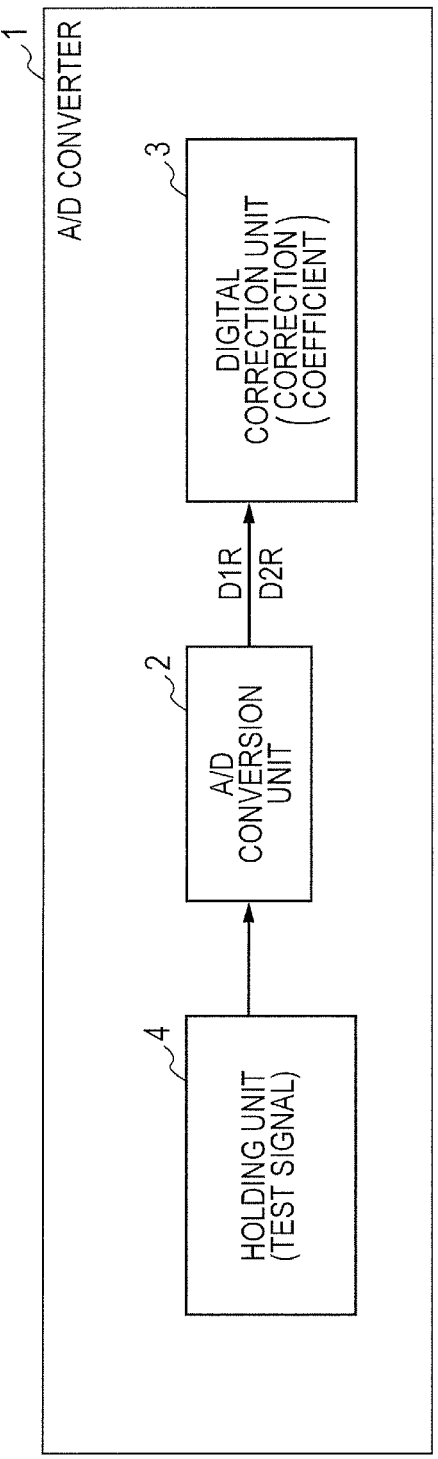
FIG. 22 is a block diagram of an A/D converter according to one embodiment.
Figure 23:
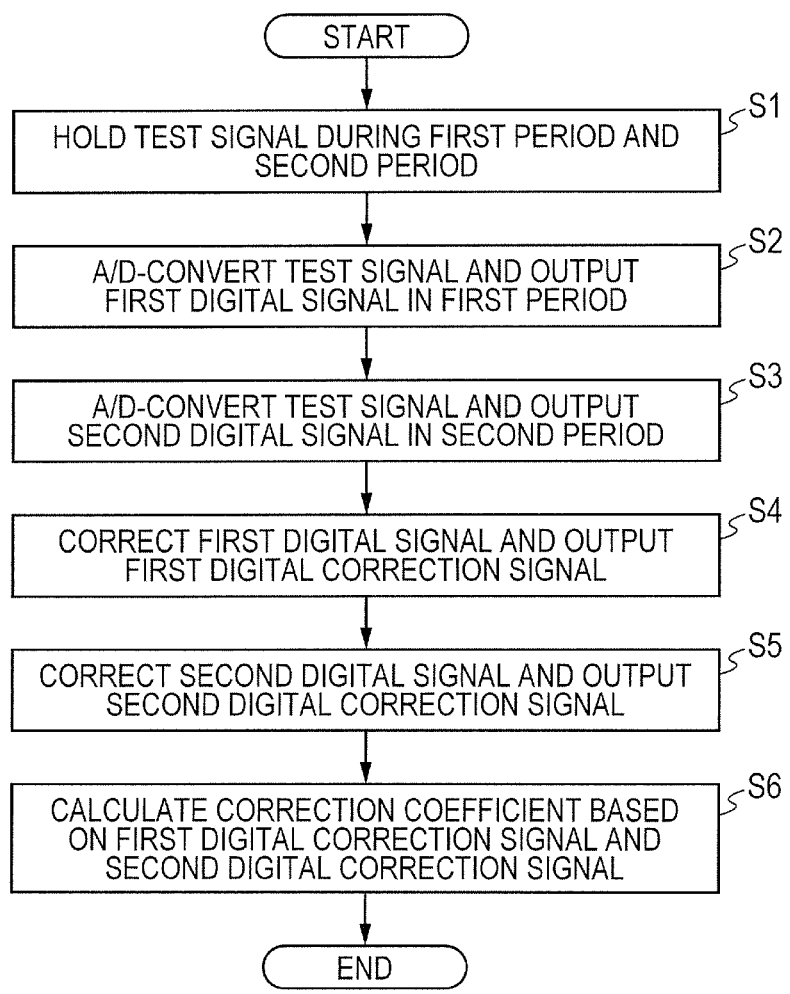
FIG. 23 is an operation flowchart of the A/D converter according to one embodiment.

FIG. 22 is a block diagram of an A/D converter according to one embodiment. FIG. 23 is an operation flow chart of the A/D converter according to one embodiment. A semiconductor integrated circuit device (IC) 10 provided with an A/D converter (ADC) 1 is configured with an A/D conversion unit (ADCU) 2, a digital correction unit (DCU) 3, and a holding unit (BUFU) 4. The A/D conversion unit 2 is of a charge sharing type and performs successive approximation. The holding unit 4 holds a test signal. The digital correction unit 3 corrects a digital output signal from the A/D conversion unit 2. It is also preferable that the holding unit 4 is provided in the exterior of the A/D converter 1.

The holding unit 4 holds a test signal for the first period and the second period (Step S1). Here, the second period is a period which follows the first period. In the first period, the A/D conversion unit 2 performs A/D conversion of the test signal, to output a first digital signal (D1R) (Step S2). In the second period, the A/D conversion unit 2 performs A/D conversion of the test signal, to output a second digital signal (D2R) (Step S3). The first digital signal is corrected and a first digital correction signal is outputted (Step S4). The second digital signal is corrected and a second digital correction signal is outputted (Step S5). A correction coefficient is calculated on the basis of the first digital correction signal and the second digital correction signal.

A semiconductor integrated circuit device according to one embodiment is provided with an A/D converter which is configured with an A/D conversion unit of a charge sharing type for performing successive approximation, a digital correction unit for performing digital correction to a digital output received from the A/D conversion unit, and a holding unit for holding a test signal. The test signal of a common value from the holding unit is inputted into an A/D conversion unit in the first period and the second period. The A/D conversion correction coefficient is calculated, on the basis of the digital correction result in the digital correction unit in the first period and the digital correction result in the digital correction unit in the second period. With this configuration, it is possible to realize a digital-correction-type A/D converter with an A/D conversion unit which is of a charge sharing type and performing successive approximation, while reducing the size of the exclusive-use analog circuit to be added in order to calculate the A/D conversion correction coefficient.

IMPLEMENTATION EXAMPLES

Hereinafter, implementation examples are explained in detail, with reference to the drawings.

In the following implementation examples when there is the necessity for convenience, the explanation will be divided into plural sections or plural implementation examples. However, unless otherwise specified, they are not irrelevant with each other but they have a relationship that one is a modified example, an application, detailed explanation, and supplementary explanation of a part or all of the other. In the following implementation examples, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following implementation examples, the component (including operation, a timing chart, an element step, an operation step, etc.) is not necessarily essential, except for the case where it is explicitly specified in particular or it is considered in principle that it is clearly essential. Similarly, in the following implementation examples, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

In the entire drawings for explaining the implementation examples, the same or a related symbol is attached to the region and the member which have the same function, and the repeated explanation thereof is omitted. In the following implementation examples, except when necessary in particular, the repeated explanation of the same or a similar part is omitted in principle.

The examples of the A/D converter 1 and the semiconductor integrated circuit device 10 according to the embodiment are explained in the following as an implementation example and a modified example.

Implementation Example 1

1. Configuration

Figure 1A:
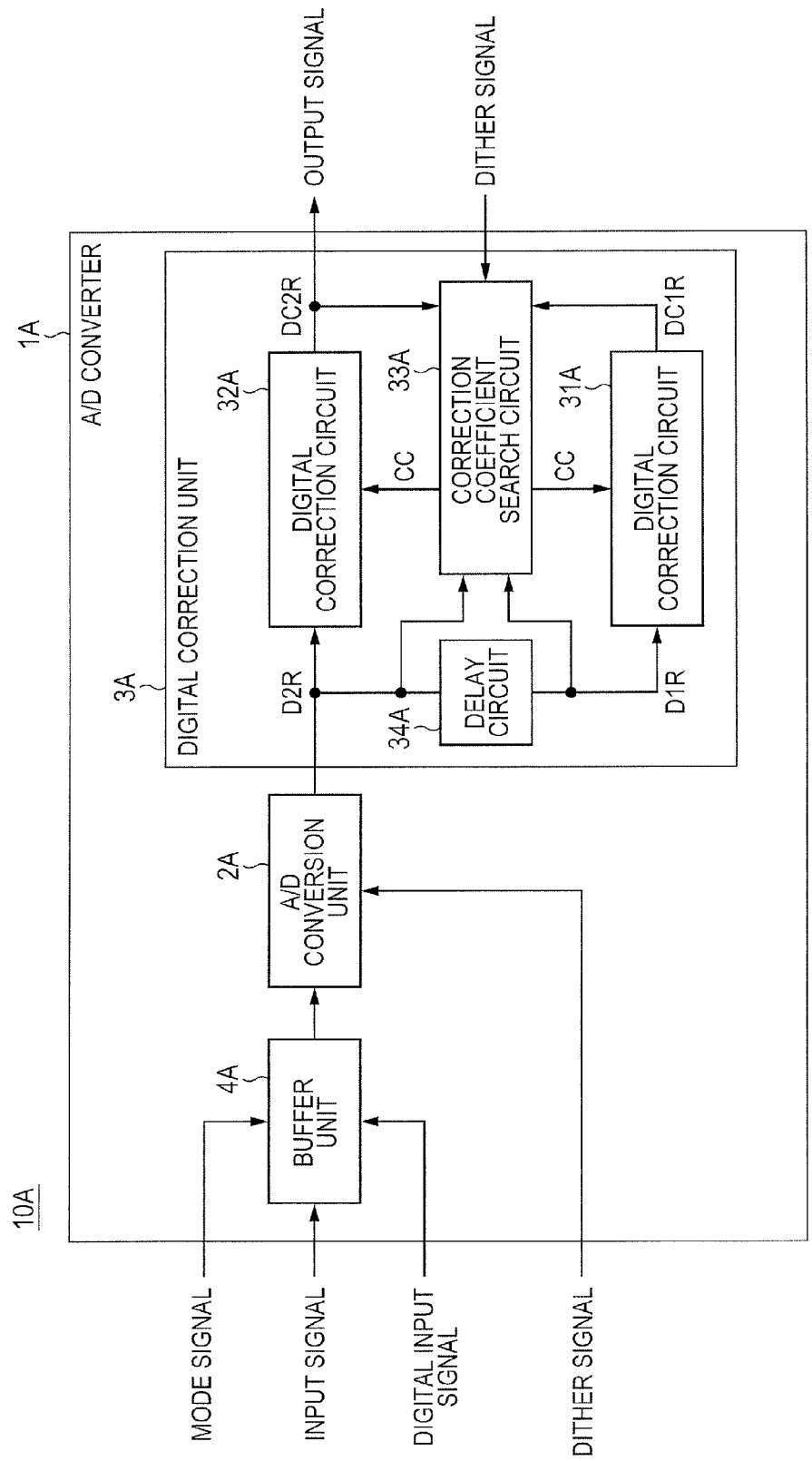
FIG. 1A is a drawing illustrating an A/D converter according to Implementation Example 1.
Figure 1B:
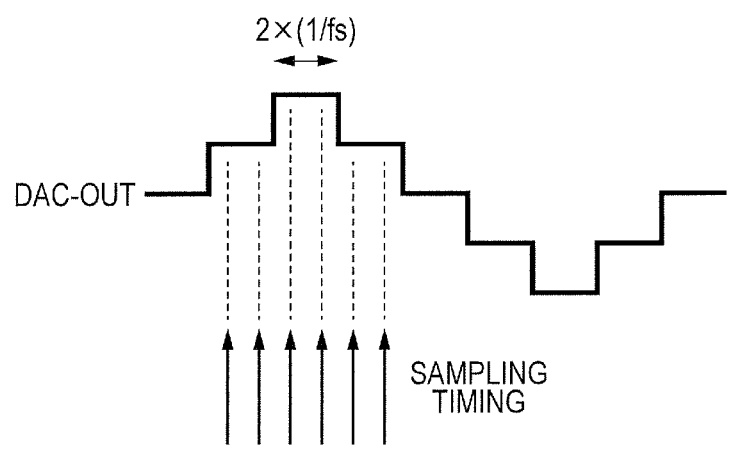
FIG. 1B is a waveform chart illustrating an output signal of a buffer unit according to Implementation Example 1.
Figure 1C:
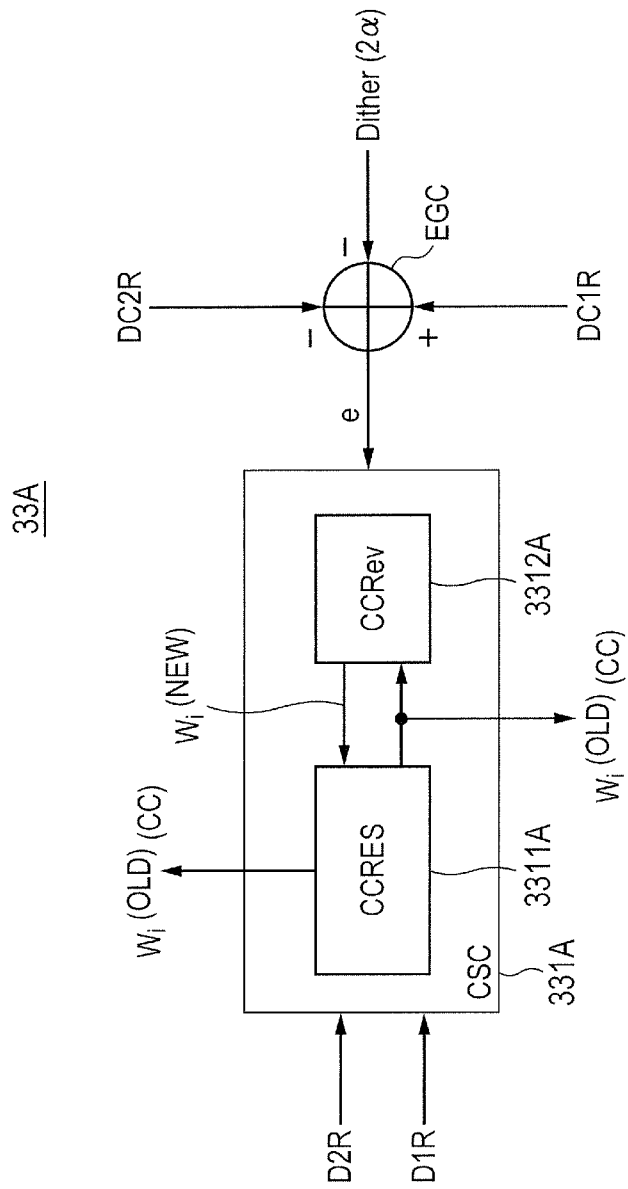
FIG. 1C is a block diagram illustrating a correction coefficient search circuit according to Implementation Example 1.

FIG. 1A is a block diagram of an A/D converter according to Implementation Example 1. FIG. 1B is a waveform chart illustrating an output signal of a buffer unit according to Implementation Example 1. FIG. 1C is a block diagram illustrating a correction coefficient search circuit according to Implementation Example 1. As illustrated in FIG. 1A, the A/D converter (ADC) 1A is configured with a buffer unit (BUFU) 4A, an A/D conversion unit (ADCU) 2A, and a digital correction unit (DCU) 3A. The A/D converter 1A is formed overlying one semiconductor substrate as a part of a semiconductor integrated circuit device 10A.

The digital correction unit 3A is configured with digital correction circuits 31A and 32A, a correction coefficient search circuit (CCSC) 33A, and a delay circuit (DL) 34A. Here, the digital correction circuit 31A and the digital correction circuit 32A have the same circuit configuration.

The buffer unit 4A receives a digital input signal (DAC-IN), and generates an output signal (DAC-OUT) as a test signal for A/D conversion. The A/D conversion unit 2A performs A/D converting to the output signal (DAC-OUT) received, to output the converted signal to the digital correction unit 3A. Here, the output signal (DAC-OUT) changes its value every two conversion cycles (2/fs) of the A/D conversion unit 2A, as illustrated in FIG. 1B. In other words, the same value is held for two conversion cycles (2/fs). The A/D conversion unit 2A performs the A/D converting twice to the output signal (DAC-OUT) having the same value. The first A/D converting is performed in the first period as the first conversion cycle (1/fs) of the two conversion cycles (2/fs) during which the output signal (DAC-OUT) of the same value is held. As the result, a first A/D conversion result (D1R) is outputted to the digital correction unit 3A. The second A/D converting is performed in the second period as the latter conversion cycle (1/fs) of the two conversion cycles (2/fs) during which the output signal (DAC-OUT) of the same value is held. As the result, a second A/D conversion result (D2R) is outputted to the digital correction unit 3A. A dither signal component (Dither) (the value is α) is included in at least either of the first A/D conversion result (D1R) and the second A/D conversion result (D2R). The digital correction unit 3A performs digital correcting to the first A/D conversion result (D1R) and the second A/D conversion result (D2R). On the basis of a correction result (DC1R) of the first A/D conversion result (D1R) and a correction result (DC2R) of the second A/D conversion result (D2R), the digital correction unit 3A calculates a correction coefficient (CC) for the digital correcting. The delay circuit 34A delays the correction result (DC1R) of the first A/D conversion result (D1R) or the first A/D conversion result (D1R) by one conversion cycle (1/fs), in order that the digital correction unit 3A may process in parallel the correction result (DC1R) of the first A/D conversion result (D1R) and the correction result (DC2R) of the second A/D conversion result (D2R).

2. Test Operation

Figure 2:
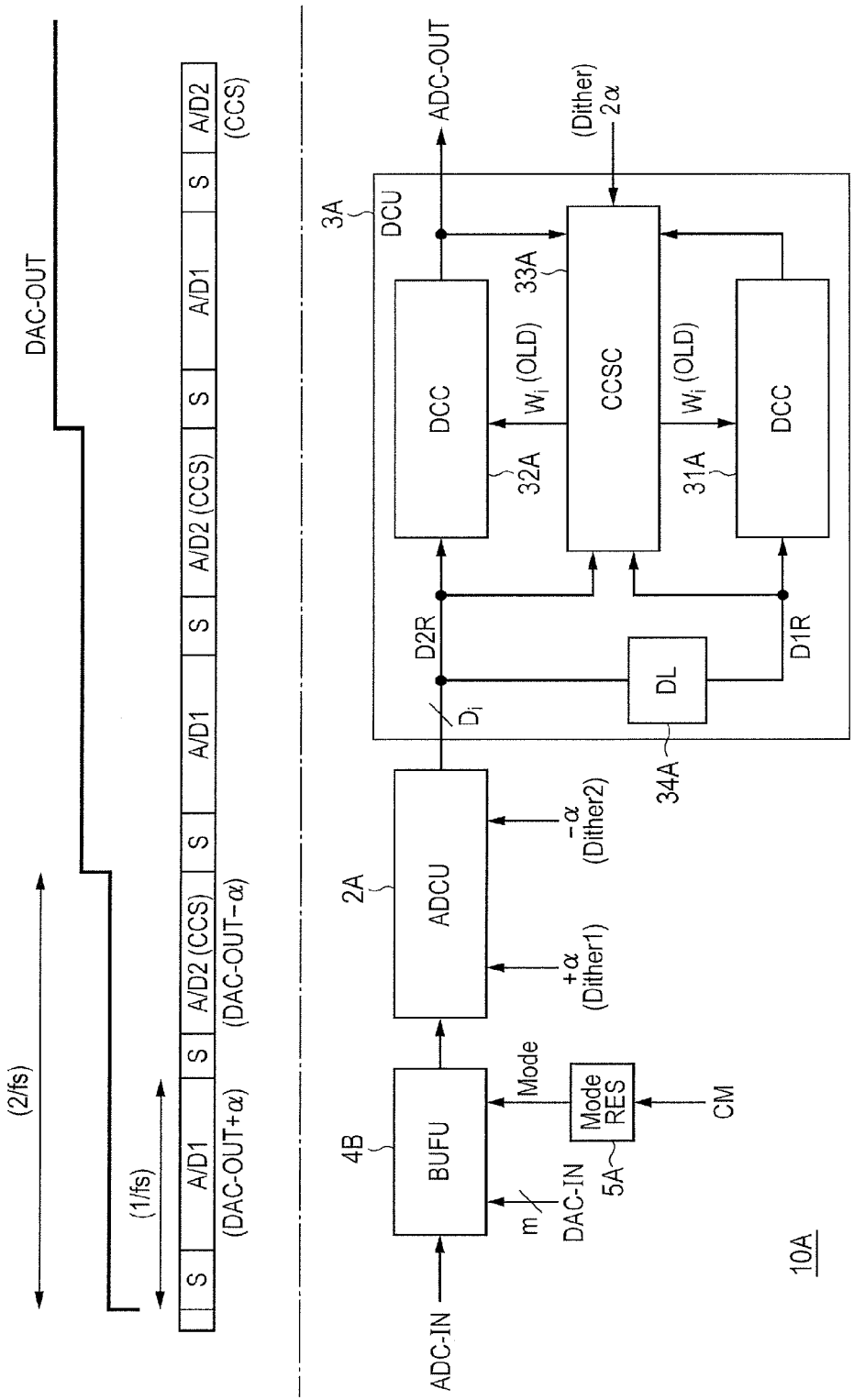
FIG. 2 is a drawing illustrating a configuration of a semiconductor integrated circuit device according to Implementation Example 1, and a timing flow in an A/D conversion test operation of the A/D converter.

FIG. 2 illustrates a configuration of the semiconductor integrated circuit device according to Implementation Example 1, and a timing flow in an A/D conversion test operation of the A/D converter. The configuration of the semiconductor integrated circuit device according to Implementation Example 1 and the operation at the time of the A/D conversion test operation of the A/D converter are explained with reference to FIG. 2 and FIG. 1C.

The semiconductor integrated circuit device 10A is provided with a mode register (ModeRES) 5A for setting up an operation mode. At the time of the A/D conversion test operation, an A/D conversion correction mode (CM) is set to the mode register 5A. FIG. 2 illustrates the operation at the time of the A/D conversion test operation.

The buffer unit 4A has the function as an input buffer circuit for receiving the input signal (ADC-IN) inputted into the A/D converter 1A, and the function as a D/A converter for generating the output signal (DAC-OUT) to be supplied to the A/D conversion unit 2A. According to a mode signal (Mode) from the mode register 5A, it is selected whether the buffer unit 4A functions as the input buffer circuit or it functions as the D/A converter. Hereinafter, the digital to analog conversion is called D/A conversion and the digital to analog converter is called a D/A converter.

The A/D conversion unit 2A performs A/D converting to the output from the buffer unit 4A, to output a digital output signal (D1) to the latter stage. A first dither signal (Dither1) and a second dither signal (Dither2) can be inputted into the A/D conversion unit 2A. The second dither signal (Dither2) is equal in absolute value but different in sign with the first dither signal (Dither1). The dither signal is a DC offset voltage applied for calculating effectively the correction coefficient (CC) for use in the digital correcting. It is more preferable that there exist two dither signals such as the first dither signal (Dither1) and the second dither signal (Dither2) as in the present case; however, it suffices that there exists either of them. If it is permissible to take time in the correction coefficient search, any dither signal may not be applied.

At the time of an A/D conversion normal operation to be explained later, the digital correction unit 3A performs digital correction to the output from the A/D conversion unit 2A, to generate an output signal (ADC-OUT). At the time of the A/D conversion test operation, the correction coefficient search circuit 33A calculates a correction coefficient (CC) on the basis of the output from the A/D conversion unit 2A.

The second digital correction circuit 32A performs digital correcting to the digital output from the A/D conversion unit 2A, to output the corrected signal to the latter stage. The first digital correction circuit 31A also performs digital correcting to the digital output from the A/D conversion unit 2A, to output the corrected signal to the latter stage. However, compared with the digital output supplied to the second digital correction circuit 32A, the digital output supplied to the first digital correction circuit 31A is delayed by one conversion cycle (1/fs) by the delay circuit 34A.

As illustrated in FIG. 1C, the correction coefficient search circuit 33A is configured with a conversion error generating circuit EGC and a coefficient search circuit (CSC) 331A. The conversion error generating circuit EGC calculates the difference of the output from the first digital correction circuit 31A and the output from the second digital correction circuit 32A, and subtracts 2α from the difference, thereby obtaining a conversion error (e) to output. Here, 2α is the value obtained when the second dither signal (Dither2) is subtracted from the first dither signal (Dither1), where a expresses a value of the dither signal (Dither).

The coefficient search circuit 331A is configured with a correction coefficient register (CCRES) 3311A and a correction coefficient calculation circuit (CCRev) 3312A. The correction coefficient calculation circuit 3312A makes searching in order to determine a correction coefficient (CC), on the basis of the conversion error (e). The correction coefficient (CC) is stored in a correction coefficient register 3321A in the coefficient search circuit 331A.

At the time of the A/D conversion test operation, a digital input signal (DAC-IN) is inputted into the buffer unit 4A, D/A converting of the digital input signal (DAC-IN) is performed, and the output signal (DAC-OUT) as an analog signal is outputted to the A/D conversion unit 2A. Here, the digital input signal (DAC-IN) is a digital signal of m bits (m is a natural number). In the whole present specification, the operation to generate the correction coefficient to be used in the digital correcting for A/D conversion is defined as the A/D conversion test operation.

As illustrated in the timing flow of the upper-row drawing of FIG. 2, the A/D conversion unit 2A samples an output signal (DAC-OUT) in a sampling period (S). Subsequently, the A/D conversion unit 2A performs the A/D converting to the sampled output signal (DAC-OUT) and the first dither signal (Dither1) added to the A/D conversion unit 2A in the first A/D conversion period (A/D1), and outputs the first A/D conversion result (D1R) as a digital signal. Furthermore, the A/D conversion unit 2A samples the output signal (DAC-OUT) in the sampling period (S). Subsequently, the A/D conversion unit 2A performs A/D converting to the sampled output signal (DAC-OUT) and the second dither signal (Dither2) added to the A/D conversion unit 2A in the second A/D conversion period (A/D2), and outputs the second A/D conversion result (D2R) as a digital signal. The delay circuit 34A delays the first A/D conversion result (D1R) by one conversion cycle (1/fs), and outputs it to the first digital correction circuit 31A. Here, one conversion cycle (1/fs) is the period of the sampling period (S) plus the first A/D conversion period (A/D1). The first A/D conversion period (A/D1) and the second A/D conversion period (A/D2) are equal. As the result, the timing at which the first A/D conversion result (D1R) is inputted into the first digital correction circuit 31A and the timing at which the second A/D conversion result (D2R) is inputted into the second digital correction circuit 32A become the same period. Here, the output signal (DAC-OUT) employed to calculate the first A/D conversion result (D1R) and the output signal (DAC-OUT) employed to calculate the second A/D conversion result (D2R) have the same value, as illustrated in FIG. 2. This is because the buffer unit 4A holds the output signal (DAC-OUT) for two conversion cycles (2/fs).

The first digital correction circuit 31A and the second digital correction circuit 32A output to the conversion error generating circuit EGC the result of the digital correction performed to the first A/D conversion result (D1R) and the second A/D conversion result (D2R), respectively, with the use of the correction coefficient (CC) (labeled as Wi(OLD) in FIG. 2). The correction coefficient (CC) is a coefficient for performing digital correction to the first digital correction circuit 31A and the second digital correction circuit 32A.

Here it is assumed that the first A/D conversion result (D1R) and the second A/D conversion result (D2R) are Di, and that the correction coefficient (CC) is Wi. Then, a value given by the following expression (1) is outputted from the first digital correction circuit 31A and the second digital correction circuit 32A. Here, i takes a value of from 0 to N−1 and indicates the i-th bit of the digital output signal of the A/D conversion unit 2A. N is a natural number of 2 or greater, and indicates the number of bits.

[Mathematical 1]

$$\sum_{i=0}^{N-1} W_i \cdot D_i \tag{1}$$

The conversion error generating circuit EGC generates a conversion error (e) by subtracting the result (DC2R) of the digital correction performed to the second A/D conversion result (D2R) from the result (DC1R) of the digital correction performed to the first A/D conversion result (D1R), and further subtracting 2α from the remains. The timing at which the result (DC1R) of the digital correction performed to the first A/D conversion result (D1R) is inputted, and the timing at which the result (DC2R) of the digital correction performed to the second A/D conversion result (D2R) is inputted become the same period due to the delaying operation by the delay circuit 34A. On the basis of this conversion error (e), the correction coefficient calculation circuit 3312A makes searching, in order to determine a correction coefficient (CC) by an LMS algorithm. The LMS algorithm is the abbreviated name for the Least Mean Squares algorithm, and is a class of the adaptive control systems. In the LMS algorithm, assuming that input data is Di, an output is A, and a coefficient is Wi, then Wi is estimated from a large number of samples of Di and A, for which it is known that the relation A=ΣWi·Di is true.

The correction coefficient calculation circuit 3312A calculates a correction coefficient (CC) with a predetermined algorithm, such as the LMS algorithm, according to the conversion error (e), the first A/D conversion result (D1R), the second A/D conversion result (D2R), and the correction coefficient (CC). Here, the correction coefficient (CC) is the one that is stored in the correction coefficient register 3311A in advance (labeled as Wi(OLD) in FIG. 2). The newly calculated correction coefficient (CC) (labeled as Wi(NEW) in FIG. 1C) is newly stored in the correction coefficient register 3311A.

The following output signal (DAC-OUT) is further inputted into the A/D conversion unit 2A. Since this output signal (DAC-OUT) is supplied after 2 conversion cycles (2/fs), the value differs from the last output signal. Accordingly, the value of the correction coefficient register 3311A is updated. Such an updating operation is repeated at the time of the A/D conversion test operation.

In this way, the correction coefficient (CC) is searched for on the basis of the result (DC1R) of the digital correction performed to the first A/D conversion result (D1R) which has been delayed by the delay circuit 34A, and the result (DC2R) of the digital correction performed to the second A/D conversion result (D2R). Therefore, the correction coefficient search period (CCS), during which the correction coefficient (CC) is searched for by the correction coefficient calculation circuit 3312A, takes place whenever the second A/D conversion period (A/D2) takes place.

3. Normal Operation

Figure 3:
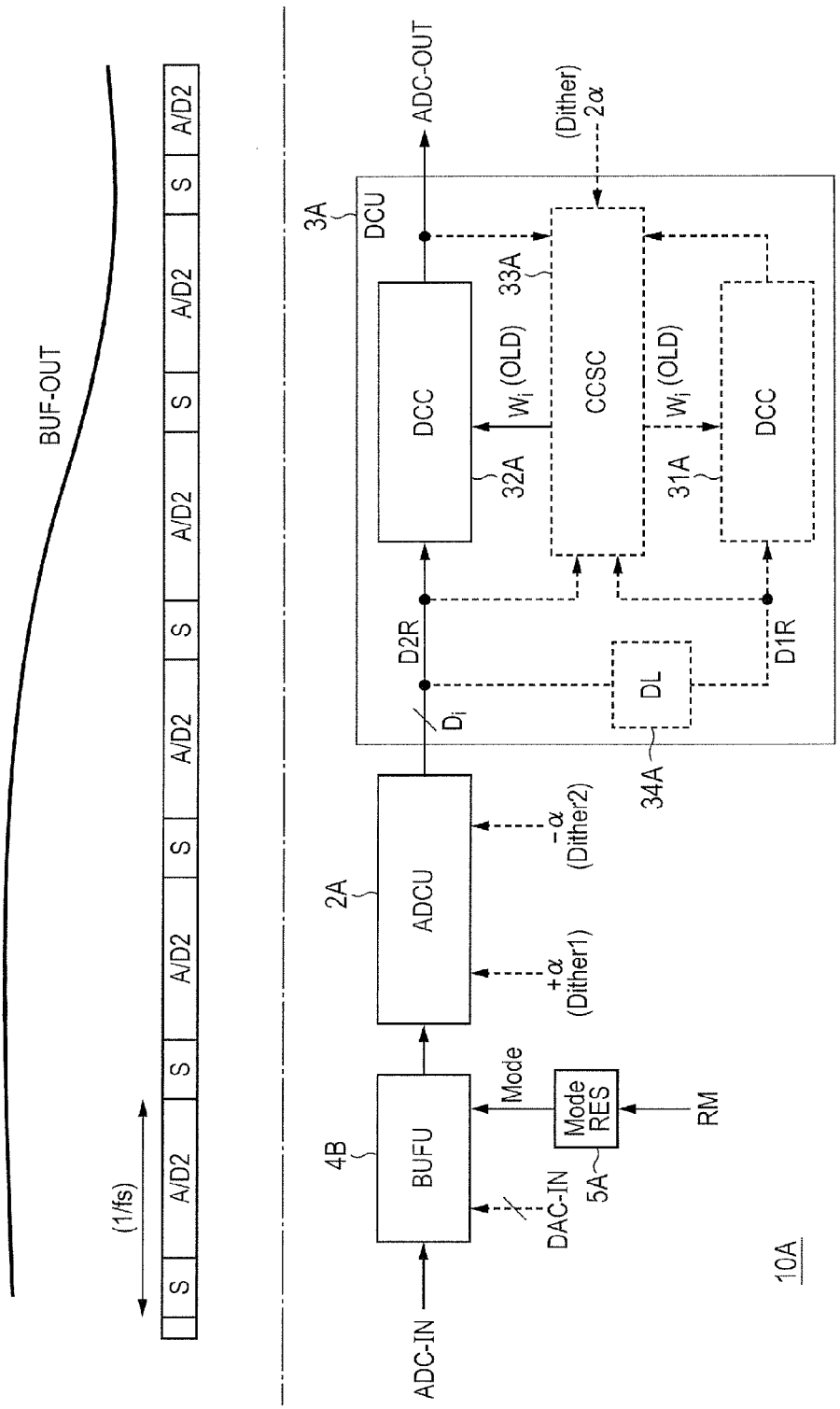
FIG. 3 is a drawing illustrating a configuration of a semiconductor integrated circuit device according to Implementation Example 1, and a timing flow in an A/D conversion normal operation of the A/D converter.

FIG. 3 illustrates a configuration of the semiconductor integrated circuit device according to Implementation Example 1, and a timing flow in an A/D conversion normal operation of the A/D converter.

The circuit configuration of the semiconductor integrated circuit device 10A illustrated in FIG. 3 is the same as that illustrated in FIG. 2. An A/D conversion normal operation mode (RM) is set to the mode register 5A.

At the time of the A/D conversion normal operation, the buffer unit 4A is supplied with an input signal (ADC-IN) and outputs an output signal (BUF-OUT). As illustrated in the timing flow of the upper part of FIG. 3, the output signal (BUF-OUT) is sampled in a sampling period (S). Subsequently, the A/D conversion unit 2A performs A/D converting to the sampled output signal (BUF-OUT) in the second A/D conversion period (A/D2), and outputs the second A/D conversion result (D2R) as a digital signal. Next, the digital correction circuit 32A performs digital correction to the second A/D conversion result (D2R) with the use of the correction coefficient (CC) calculated in the A/D conversion test operation. The result after the digital correction becomes an output signal (ADC-OUT), and is outputted as an A/D conversion result of the A/D converter 1. The operation as described above is repeated for every conversion cycle (1/fs). The first digital correction circuit 31A, the delay circuit 34A, and the correction coefficient search circuit 33A, which are shown by dotted blocks, do not operate basically in the A/D conversion normal operation. However, the correction coefficient (CC) is held in the correction coefficient search circuit 33A, and outputted to the second digital correction circuit 32A. The D/A conversion circuit of the buffer unit 4A does not operate also. A dither signal is not supplied to the A/D conversion unit 2A. In the present specification, the A/D conversion normal operation means that after A/D converting is performed to the inputted analog signal, digital correcting is performed to the A/D conversion result with the use of the correction coefficient (CC) calculated in the A/D conversion test operation, thereby executing A/D converting of the A/D converter.

4. A/D Conversion Unit

Figure 4A:
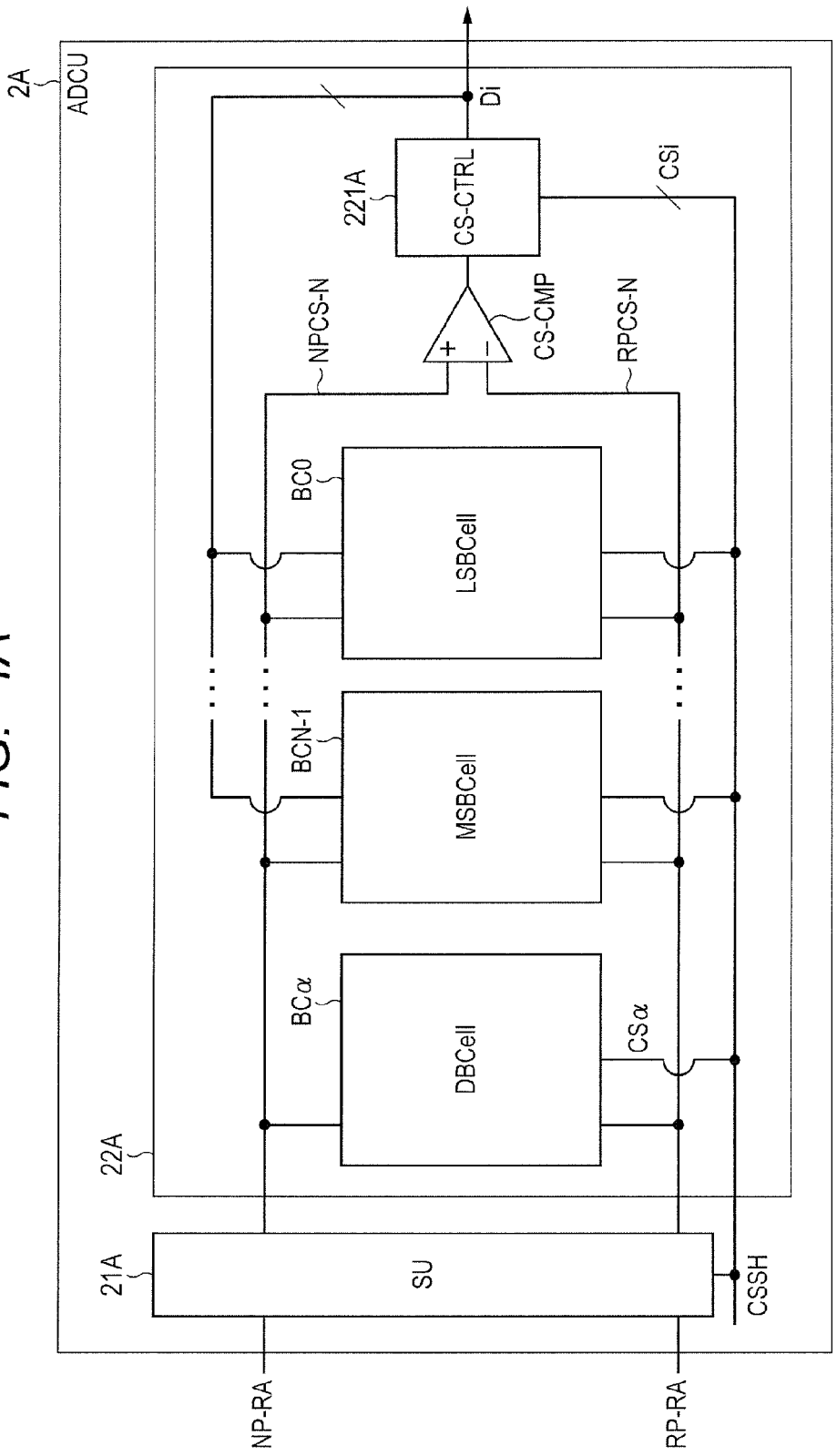
FIG. 4A is a drawing illustrating a configuration of an A/D conversion unit according to Implementation Example 1.
Figure 4B:
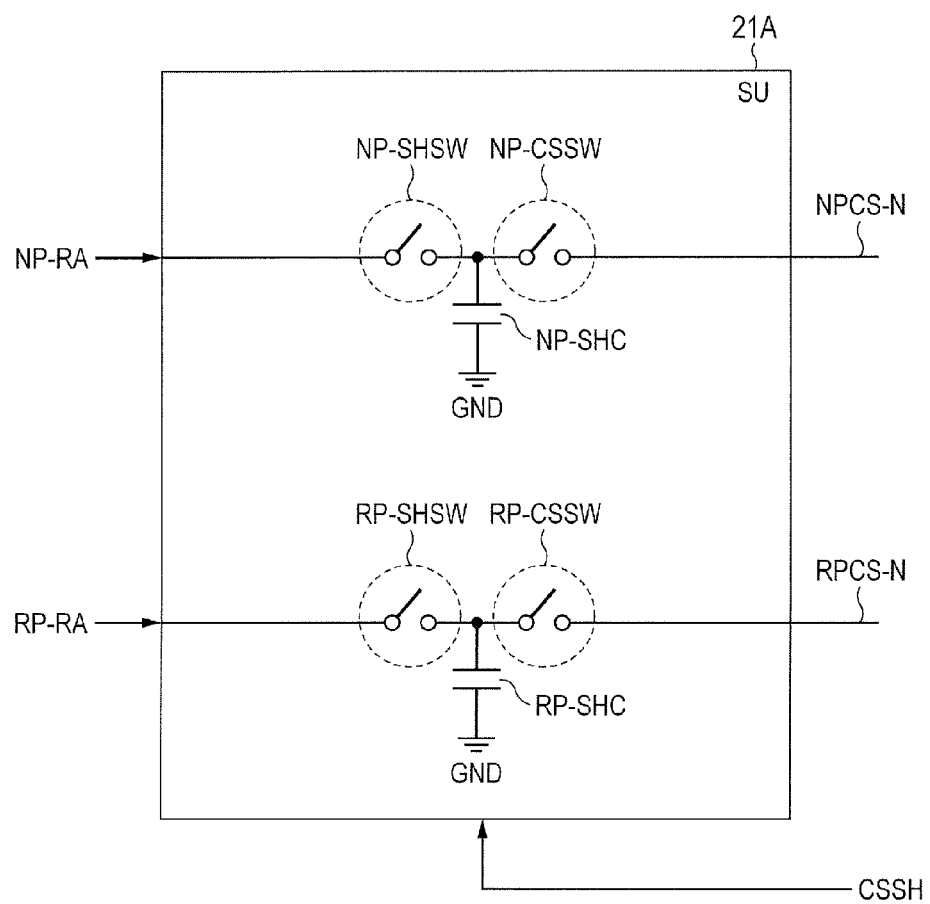
FIG. 4B is a drawing illustrating a sample hold circuit and a switching circuit for charge sharing according to Implementation Example 1.
Figure 4C:
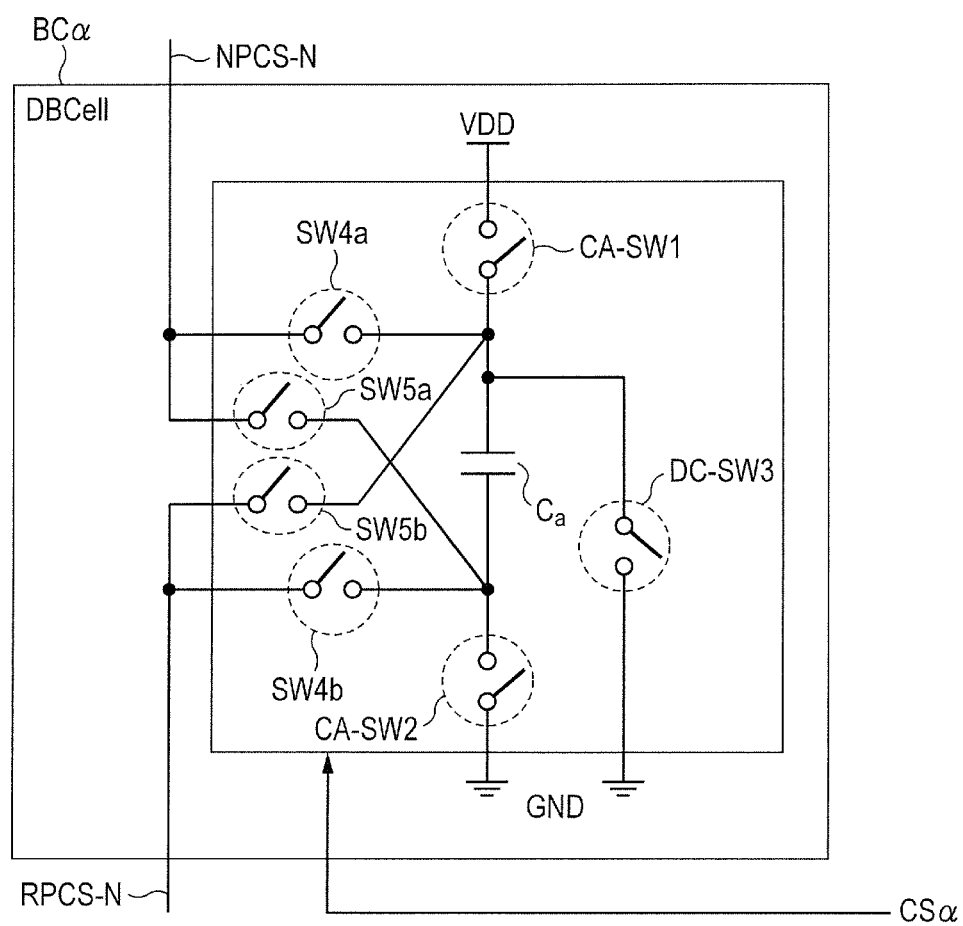
FIG. 4C is a circuit diagram illustrating a dither signal bit cell according to Implementation Example 1.
Figure 4D:
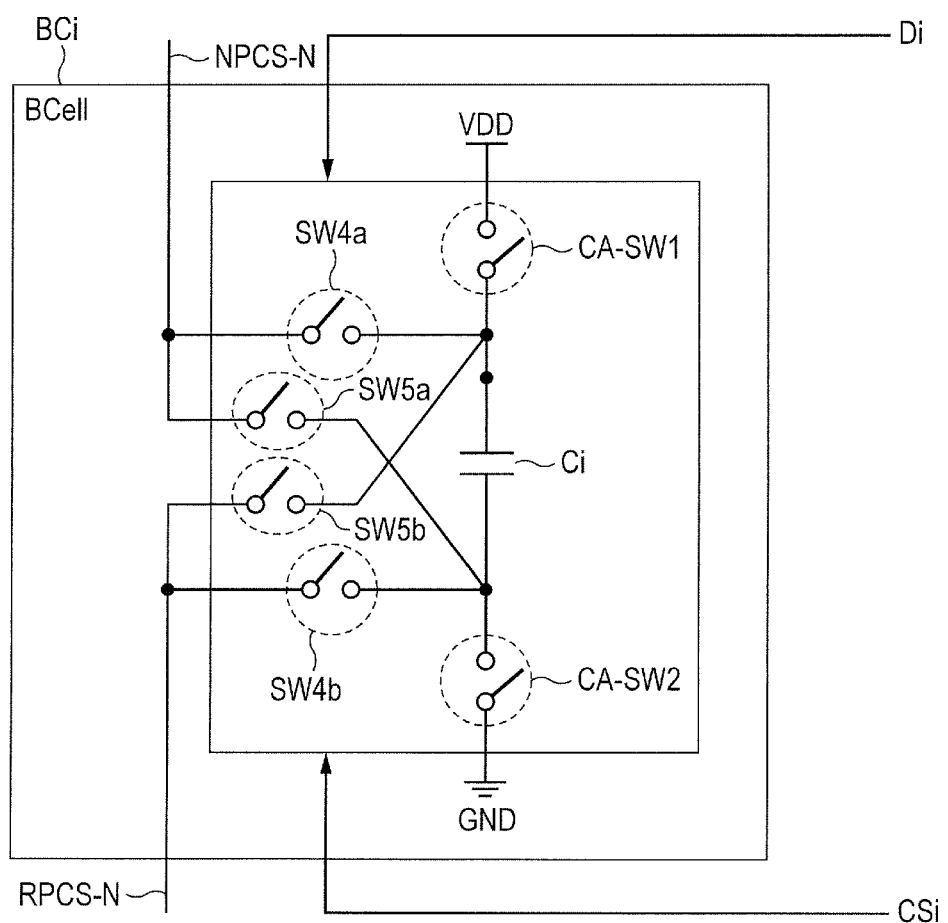
FIG. 4D is a circuit diagram illustrating a bit cell according to Implementation Example 1.

FIG. 4A illustrates a configuration of the A/D conversion unit. FIG. 4B illustrates a sample hold circuit and a switching circuit for charge sharing. FIG. 4C is a circuit diagram illustrating a dither signal bit cell. FIG. 4D is a circuit diagram illustrating a bit cell.

In Implementation Example 1, the A/D conversion unit 2A is designed to treat a single phase signal; however, it is also preferable to treat a differential signal. The A/D conversion unit 2A illustrated in FIG. 4A is configured so as to treat a differential signal as the input signal and a single phase signal as the output signal.

(1) Configuration

As illustrated in FIG. 4A, the A/D conversion unit (ADCU) 2A is configured with a sampling circuit (SU) 21A and a conversion circuit (CU) 22A. The conversion circuit 22A is configured with a comparator CS-CMP, a control circuit (CS-CTRL) 221A, plural bit cells (BCell) $BC_0$ to $BC_{N-1}$, and $BC_\alpha$. Here, BCell is a generic name for plural bit cells from a bit cell for the least significant bit (LSBCell) to a bit cell for the most significant bit (MSBCell), and a dither signal bit cell (DBCell). The A/D conversion unit 2A receives a reception analog differential signal composed of an analog signal (NP-RA) and an analog signal (RP-RA) which is in the inversion relation with the analog signal (NP-RA). The analog signal (NP-RA) is a noninverted signal of the output signal (DAC-OUT) in the A/D conversion test operation, and a noninverted signal of the output signal (BUF-OUT) in the A/D conversion normal operation. The analog signal (RP-RA) is an inverted signal of the output signal (DAC-OUT) in the A/D conversion test operation, and an inverted signal of the output signal (BUF-OUT) in the A/D conversion normal operation.

As illustrated in FIG. 4B, a switch NP-SHSW receives the analog signal (NP-RA). A switch RP-SHSW receives the analog signal (RP-RA). A capacitor NP-SHC samples and holds the analog signal (NP-RA). A capacitor RP-SHC samples and holds the analog signal (RP-RA). A switch NP-CSSW is coupled to the capacitor NP-SHC for sharing a charge between the capacitor NP-SHC and the bit cell (BCell). A switch RP-CSSW is coupled to the capacitor RP-SHC for sharing a charge between the capacitor RP-SHC and the bit cell (BCell).

A node NPCS-N is provided between the noninverting input terminal of the comparator CS-CMP and the capacitor NP-SHC. A node RPCS-N is provided between the inverting input terminal of the comparator CS-CMP and the capacitor RP-SHC. The comparator CS-CMP compares the voltage between the node NPCS-N and the node RPCS-N.

In response to the comparison result of the comparator CS-CMP, the control circuit 221A generates a digital output signal (D1) of the A/D conversion unit 2A, outputs it to the digital correction unit 3A, and controls the bit cell (BCell).

The bit cell (BCell) is configured with bit cells of the number of bits of the digital output signal (D1) plus one. That is, the bit cell (BCell) is configured with a dither signal bit cell (DBCell) $BC_\alpha$, and bit cells $BC_0$ to $BC_{N-1}$ for the number of bits of the digital output (Di) (the other bit cells (LSBCell, MSBCell, etc.)). As illustrated in FIG. 4C, the dither signal bit cell $BC_\alpha$ is configured with a dither signal capacitor $C_\alpha$, switch CA-SW1, a switch CA-SW2, and a switch DC-SW3. The dither signal bit cell $BC_\alpha$ is further configured with two switches SW4a and SW4b, and two switches SW5a and SW5b. The coupling relation is as shown in the figure. The dither signal capacitor $C_\alpha$ has the capacitance value according to the voltage value to be given by the dither signal.

Other bit cells $BC_0$ to $BC_{N-1}$ are N cells, and the configuration thereof is basically the same as that of the dither signal bit cell $BC_\alpha$, except that, as illustrated in FIG. 4D, the switch DC-SW3 is not provided and the data output signal (D1) and the control signal (CSi) are inputted. A bit cell capacitor $C_i$ is provided in lieu of the dither signal capacitor $C_\alpha$. The bit cell capacitor $C_i$ satisfies the following relations.

(a) $0 \leq i \leq N-1$, i is 0 or a natural number, N is 2 or a greater natural number, and (b) the capacitance value of a bit cell capacitor $C_{i+1}$ of the (i+1)th bit cell is about twice the capacitance value of a bit cell capacitor $C_i$ of the i-th bit cell.

The (N−1)th bit cell (BCell) corresponding to the maximum bit of the digital output signal (D1) is the bit cell for the most significant bit (MSBCell) $BC_{N-1}$, and the 0th bit cell (BCell) corresponding to the minimum bit is the bit cell for the least significant bit (LSBCell) $BC_0$. The ground voltage (GND) and the power supply voltage (VDD) are supplied to the bit cell (BCell).

(2) Operation (A) A/D Conversion Test Operation

The operation at the time of executing the A/D conversion test operation is explained in the following.

(a) First Timing

At the first timing, the analog signal (NP-RA) and the analog signal (RP-RA) are sampled to the capacitor NP-SHC and the capacitor RP-SHC, respectively, in response to the control signal (CSSH). Then, in order to charge the charge corresponding to a voltage of the power supply voltage (VDD) minus the ground voltage (GND), to the bit cell capacitors $C_i$ and $C_\alpha$ of all the bit cells (BCell), the switch CA-SW1 and the switch CA-SW2 are set to ON, in response to the control signal (CSi, CSα).

(b) Second Timing

At the second timing after the first timing, the switch NP-SHSW and the switch RP-SHSW are set to OFF, in response to the control signal (CSSH), and the switch CA-SW1 and the switch CA-SW2 of the dither signal bit cell $BC_\alpha$ are set to OFF, in response to the control signal (CSα). Then, the switch NP-CSSW and the switch RP-CSSW are set to ON, in response to the control signal (CSSH), and the switch SW4a and the switch SW4b of the dither signal bit cell $BC_\alpha$ are set to ON, in response to the control signal (CSα). By the present on/off control, the one end of the dither signal capacitor $C_\alpha$ and the one end of the capacitor NP-SHC are coupled to the node NPCS-N. The other end of the dither signal capacitor $C_\alpha$ and the one end of the capacitor RP-SHC are coupled to the node RPCS-N. According to the established coupling, the charge in the dither signal capacitor $C_\alpha$ and the charge in the capacitor NP-SHC are shared and distributed to the node NPCS-N. The charge in the dither signal capacitor $C_\alpha$ and the charge in the capacitor RP-SHC are shared and distributed to the node RPCS-N. The voltage of the node NPCS-N to which the charge is distributed and the voltage of the node RPCS-N to which the charge is distributed are compared by the comparator CS-CMP. The comparator CS-CMP outputs 1 when the comparison result is positive and outputs 0 when the comparison result is negative, for example. On the basis of the present comparison result, the control circuit 221A determines the (N−1)th digital output signal $(D_{N-1})$ as the maximum bit.

(c) Third Timing

At the third timing after the second timing, the switch of the bit cell for the most significant bit $BC_{N-1}$ is controlled, in response to the control signal $(CS_{N-1})$ and the digital output signal $(D_{N-1})$. When $D_{N-1}$ is 1, the switches SW5a and SW5b are set to ON. Accordingly, the charge amount in the bit cell capacitor $C_{N-1}$ of the bit cell for the most significant bit $BC_{N-1}$ is subtracted from the charge amount of the node NPCS-N. Furthermore, the charge amount in the bit cell capacitor $C_{N-1}$ of the bit cell for the most significant bit $BC_{N-1}$ is subtracted from the charge amount of the node RPCS-N. When $D_{N-1}$ is 0, the switches SW4a and SW4b are set to ON; accordingly, the charge amount in the bit cell capacitor $C_{N-1}$ of the bit cell for the most significant bit $BC_{N-1}$ is added to the node NPCS-N. Furthermore, the charge amount in the bit cell capacitor $C_{N-1}$ of the bit cell for the most significant bit $BC_{N-1}$ is added to the node RPCS-N. Accordingly, charge distribution takes place in the node NPCS-N, and charge distribution takes place in the node RPCS-N. The voltage of the node NPCS-N to which the charge is distributed and the voltage of the node RPCS-N to which the charge is distributed are compared by the comparator CS-CMP. The comparator CS-CMP outputs 1 when the comparison result is positive and outputs 0 when the comparison result is negative, for example. On the basis of the present comparison result, the control circuit 22 determines the (N−2)th digital output signal $(D_{N-2})$.

The operation as described above is repeated in the following and the control circuit 22 determines up to the digital output signal $(D_0)$.

When the dither voltage needs to be inverted (when the second dither signal (Dither2) is applied), what is necessary is just to set to ON the switch SW5a and the switch SW5b of the dither signal bit cell $BC_\alpha$ at the second timing, in lieu of the switch SW4a and the switch SW4b.

(B) A/D Conversion Normal Operation

The operation at the time of the A/D conversion normal operation is basically the same as that at the time of the A/D conversion test operation. However, since the dither signal bit cell $BC_\alpha$ is not employed, the switch CA-SW2 and the switch DC-SW3 of the dither signal bit cell $BC_\alpha$ are kept "ON."

According to the operation described above, the A/D conversion operation is performed by superimposing the dither signal component at the time of the A/D conversion test operation, and performed without the dither signal component at the time of the A/D conversion normal operation.

(3) Summary

Since the A/D conversion unit is of a successive approximation type, the operation at less than 50 MS/s and with low power consumption of several milliwatts or less is possible. The access frequency to the reference voltage is so low that the access is required only once for outputting once the first A/D conversion result (D1R) or the second A/D conversion result (D2R); therefore, it is possible to simplify the generation of the reference voltage, as an advantage. Furthermore, it is possible to reduce the power consumption of a regulator which generates the reference voltage, and it is also possible to accomplish the design of the regulator with relative ease. The reference voltage described here is the voltage for charging a charge corresponding to a voltage of the power supply voltage (VDD) minus the ground voltage (GND), to the bit cell capacitor $C_i$ of all the bit cells BCell. The charge sharing type A/D conversion unit is an A/D conversion unit which performs an A/D conversion operation, by sharing (distributing) the charge stored in the capacitor NP-SHC or the capacitor RP-SHC as a capacitor to which an analog signal is sampled, among the dither signal capacitor $C_\alpha$ or the bit cell capacitor $C_i$ and the capacitor NP-SHC or the capacitor RP-SHC as a capacitor to which an analog signal is sampled.

5. Buffer Unit

Figure 5:
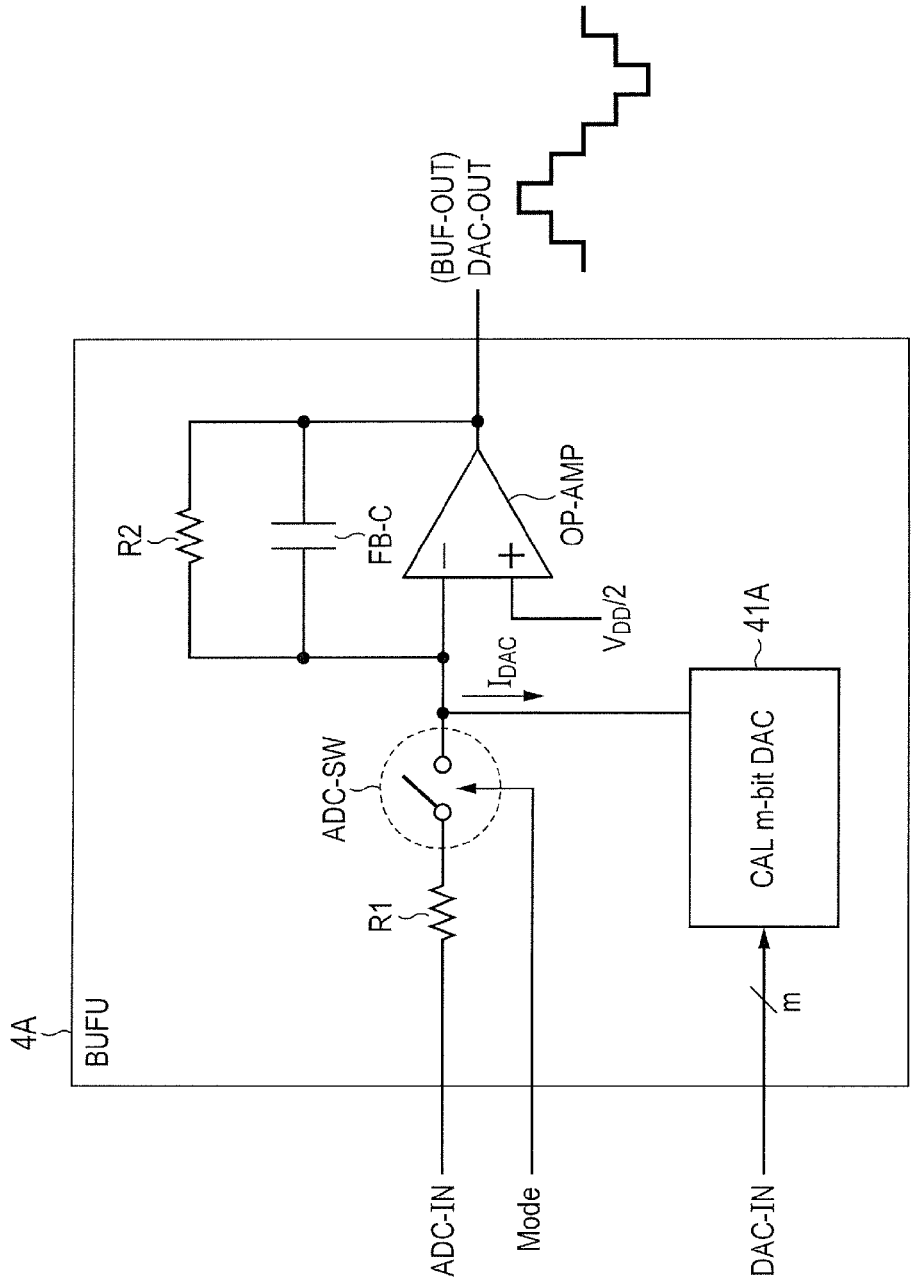
FIG. 5 is a drawing illustrating a configuration of a buffer unit according to Implementation Example 1.

FIG. 5 illustrates a configuration of the buffer unit. The buffer unit 4A is configured with a resistor R1, a switch ADC-SW, a resistor R2, a capacitor FB-C, an operational amplifier OP-AMP, and a D/A conversion circuit (CAL m-bit DAC) 41A. Here, the buffer unit may be called a holding unit or a holding circuit.

An input signal (ADC-IN) is inputted into one end of the resistor R1, and the other end of the resistor R1 is coupled to one end of the switch ADC-SW. The other end of the switch ADC-SW is coupled to an inverting input terminal (−) of the operational amplifier OP-AMP. One end of the resistor R2 is coupled to the inverting input terminal (−) of the operational amplifier OP-AMP, and the other end of the resistor R2 is coupled to an output terminal of the operational amplifier OP-AMP. The capacitor FB-C is coupled to the resistor R2 in parallel. A voltage (VDD/2) which is one half of the power supply voltage (VDD) is inputted into a noninverting input terminal (+) of the operational amplifier OP-AMP. By a digital input signal (DAC-IN) of m bits (m is a natural number) inputted into the D/A conversion circuit 41A, a current $(I_{DAC})$ flows from the output terminal of the operational amplifier 51, passing through the resistor R2 and the inverting input terminal (−) of the operational amplifier OP-AMP and reaching the D/A conversion circuit 41A. A D/A converter is configured with the D/A conversion circuit 41A, the operational amplifier OP-AMP, the resistor R2, and the capacitor FB-C. The input buffer circuit is configured with the resistor R1, the resistor R2, the capacitor FB-C, and the operational amplifier OP-AMP.

At the time of the A/D conversion test operation, the switch ADC-SW is set to OFF by the mode signal (Mode) outputted from the mode register 5A in response to setting of the A/D conversion correction mode (CM). By the digital input signal (DAC-IN) of m bits (m is a natural number) inputted into the D/A conversion circuit 41A, the current ($I_{DAC}$) corresponding to the setting value of the m bits flows. The current ($I_{DAC}$) concerned generates an output signal (DAC-OUT) at the other end of the resistor R2. The output signal (DAC-OUT) is generated by the digital input signal (DAC-IN) of m bits (m is a natural number); therefore, the output signal (DAC-OUT) has values various enough to determine the correction coefficient (CC), although the accuracy thereof is low. The current ($I_{DAC}$) is determined by the amount of current which flows into plural current sources corresponding to the m bits. This is because the D/A conversion circuit 41A is configured such that whether current flows into each current source is determined by the value of the m bits through a switch control, and accordingly, the current ($I_{DAC}$) proportional to the value of the m bits flows. Accordingly, the current ($I_{DAC}$) becomes constant during two conversion cycles (2/fs) and the output signal (DAC-OUT) also becomes constant during two conversion cycles (2/fs). Accordingly, the buffer unit 4A holds the output signal (DAC-OUT) with a high degree of accuracy during two conversion cycles (2/fs). In this way, the buffer unit 4A holds the output signal (DAC-OUT) during two conversion cycles (2/fs) and hence the output signal (DAC-OUT) sampled in the first A/D conversion period (A/D1) and the output signal (DAC-OUT) sampled in the second A/D conversion period (A/D2) have the same voltage. Therefore, it is possible to employ the charge sharing type A/D conversion unit 2A as the A/D conversion unit. This is because the charge sharing type A/D conversion unit destroys the input voltage sampled at the time of A/D converting and it is necessary to hold the output signal (DAC-OUT). In order to generate the output signal (DAC-OUT) with a full variety of values, the digital input signal (DAC-IN) of m bits is changed every two conversion cycles (2/fs), and the current ($I_{DAC}$) corresponding to the changed setting value of the m bits flows to generate the output signal (DAC-OUT).

At the time of the A/D conversion normal operation, the switch ADC-SW is set to ON by the mode signal (Mode) outputted from the mode register 5A in response to setting of the A/D conversion normal operation mode (RM). The output signal (BUF-OUT) is outputted in response to the input signal (ADC-IN) inputted. The gain of the output signal (BUF-OUT) to the input signal (ADC-IN) is given by a negative ratio of the value of resistance of the resistor R2 to the value of resistance of the resistor R1. The capacitor FB-C serves as noise resistance. At the time of the A/D conversion normal operation, the digital input signal (DAC-IN) of m bits is set up so that the current ($I_{DAC}$) may be set to 0.

In this way, the buffer unit 4A generates the output signal (DAC-OUT) for calculating the correction coefficient (CC) by performing the D/A converting at the time of the A/D conversion test operation, and generates the output signal (BUF-OUT) by converting the input signal (ADC-IN) with the gain described above at the time of the A/D conversion normal operation. Therefore, the buffer unit 4A has both a generation function of the output signal (DAC-OUT) as the test signal for calculating the correction coefficient (CC), and a generation function of the output signal (BUF-OUT) corresponding to the input signal (ADC-IN). The input buffer circuit and the D/A converter share the operational amplifier OP-AMP, the resistor R2, and the capacitor FB-C; accordingly, the area overhead decreases.

In summary, the semiconductor integrated circuit device 10A according to Implementation Example 1 is configured with the A/D conversion unit 2A, the digital correction unit 3A, and the buffer unit 4A. At the first A/D conversion period (A/D1) in the A/D conversion test operation, the A/D conversion unit 2A outputs the first A/D conversion result (D1R) as a digital signal, by A/D converting the dither signal (Dither1) and the output signal (DAC-OUT). At the subsequent second A/D conversion period (A/D2), the A/D conversion unit 2A outputs the second A/D conversion result (D2R) as a digital signal, by A/D converting the output signal (DAC-OUT). The correction coefficient (CC) for the A/D conversion is determined on the basis of the digital output (DC1R) obtained by digital correction performed to the first A/D conversion result (D1R) and the digital output (DC2R) obtained by digital correction performed to the second A/D conversion result (D2R). The output signal (DAC-OUT) is held by the buffer unit 4A during the first A/D conversion period (A/D1) and the second A/D conversion period (A/D1) in the A/D conversion test operation.

In this way, the buffer unit holds the output signal (DAC-OUT) during the first A/D conversion period (A/D1) and the second A/D conversion period (A/D2) in the A/D conversion test operation. Therefore, the charge sharing type A/D conversion unit can be employed as the A/D conversion unit. The access frequency to the reference voltage is small; therefore, it is possible to simplify the generation of the reference voltage as an advantage. Furthermore, it is possible to reduce the power consumption of the regulator which generates the reference voltage, and it is also possible to accomplish the design of the regulator with relative ease. Only one A/D conversion unit 2A as an analog circuit is required; accordingly, it is possible to suppress the increase of the area.

Moreover, the buffer unit 4A has both a generation function of the output signal (DAC-OUT) as the test signal for calculating the correction coefficient (CC), and a generation function of the output signal (BUF-OUT) corresponding to the input signal (ADC-IN). Therefore, it is not necessary to provide separately a circuit for generating the output signal (DAC-OUT) as the test signal for calculating the correction coefficient (CC), and a circuit for generating the output signal (BUF-OUT) in response to the input signal (ADC-IN); therefore, it is possible to reduce the area.

Owing to the dither signal (Dither), in the A/D conversion correction mode (CM), the correction coefficient (CC) for the digital correction of the first A/D conversion result (D1R) and the correction coefficient (CC) for the digital correction of the second A/D conversion result (D2R) are different in their higher-order bits. Therefore, it is possible to search the correction coefficient (CC), speedily and surely.

Modified Example 1

Figure 24:
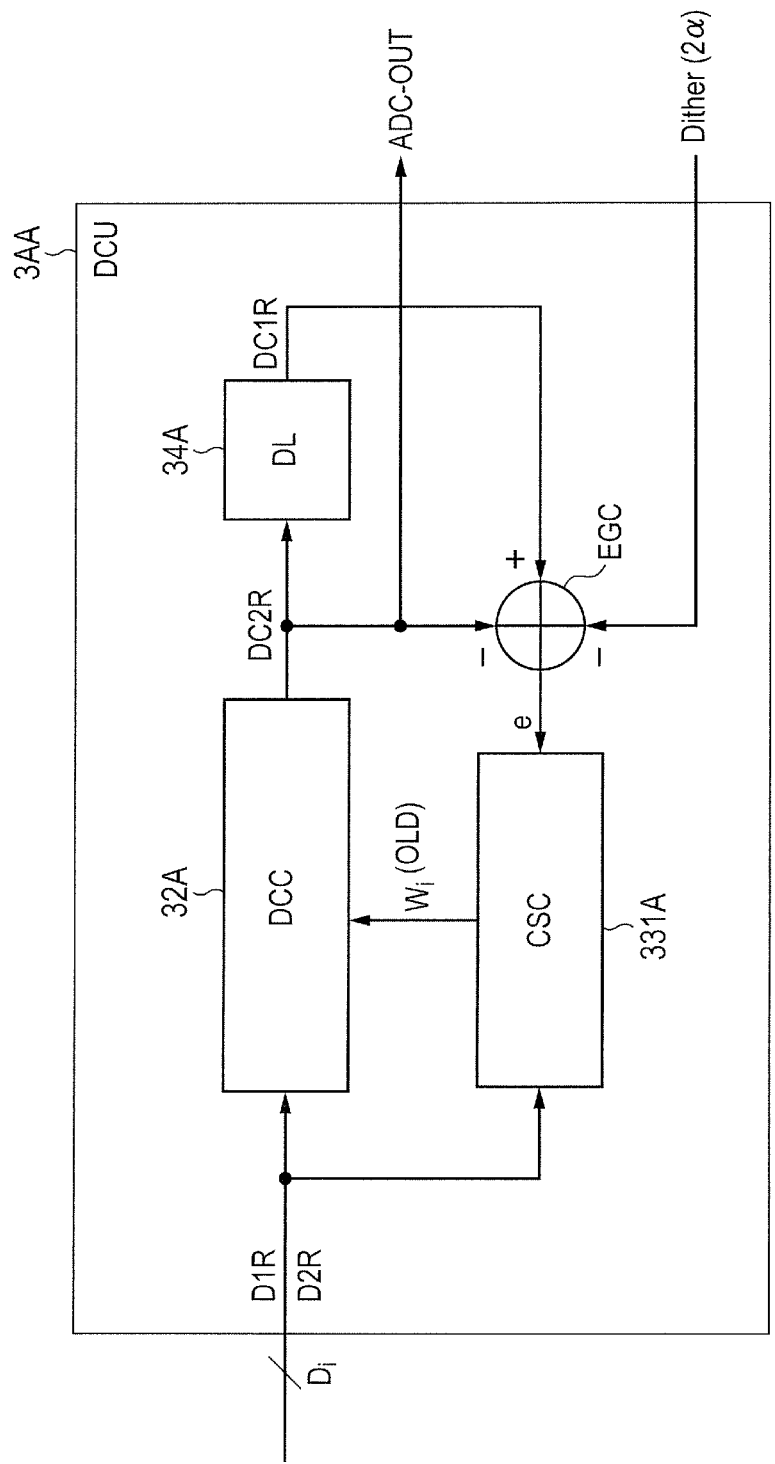
FIG. 24 is a block diagram illustrating a digital correction unit according to Modified Example 1 of Implementation Example 1.

FIG. 24 is a block diagram illustrating a digital correction unit according to Modified Example 1 of Implementation Example 1. In Implementation Example 1, the digital correction unit 3A is provided with two digital correction circuits; however, in Modified Example 1, the digital correction unit 3AA is provided with one digital correction circuit. As illustrated in FIG. 24, in the digital correction unit 3AA, the first digital correction circuit 31A is deleted and the delay circuit 34A is moved to the latter stage of the second digital correction circuit 32A. Furthermore, in the A/D conversion test operation, the conversion error generating circuit EGC generates a conversion error (e), by inputting the digital correction result (DC1R) of the first A/D conversion result (D1R) through the delay circuit 34A, inputting directly the digital correction result (DC2R) of the subsequent A/D conversion result (D2R) after one conversion cycle (1/fs), and subtracting a value 2α corresponding to the dither signal component. In the A/D conversion normal operation, the result (DC2R) of having performed digital correcting to the second A/D conversion result (D2R) is treated as the output signal (ADC-OUT). In the present case, the digital correction circuit is used in common; accordingly the area is reduced when compared with Implementation Example 1. This configuration can be applied also to the digital correction unit of Implementation Example 2 and Implementation Example 3 to be described later.

Implementation Example 2

Figure 25A:
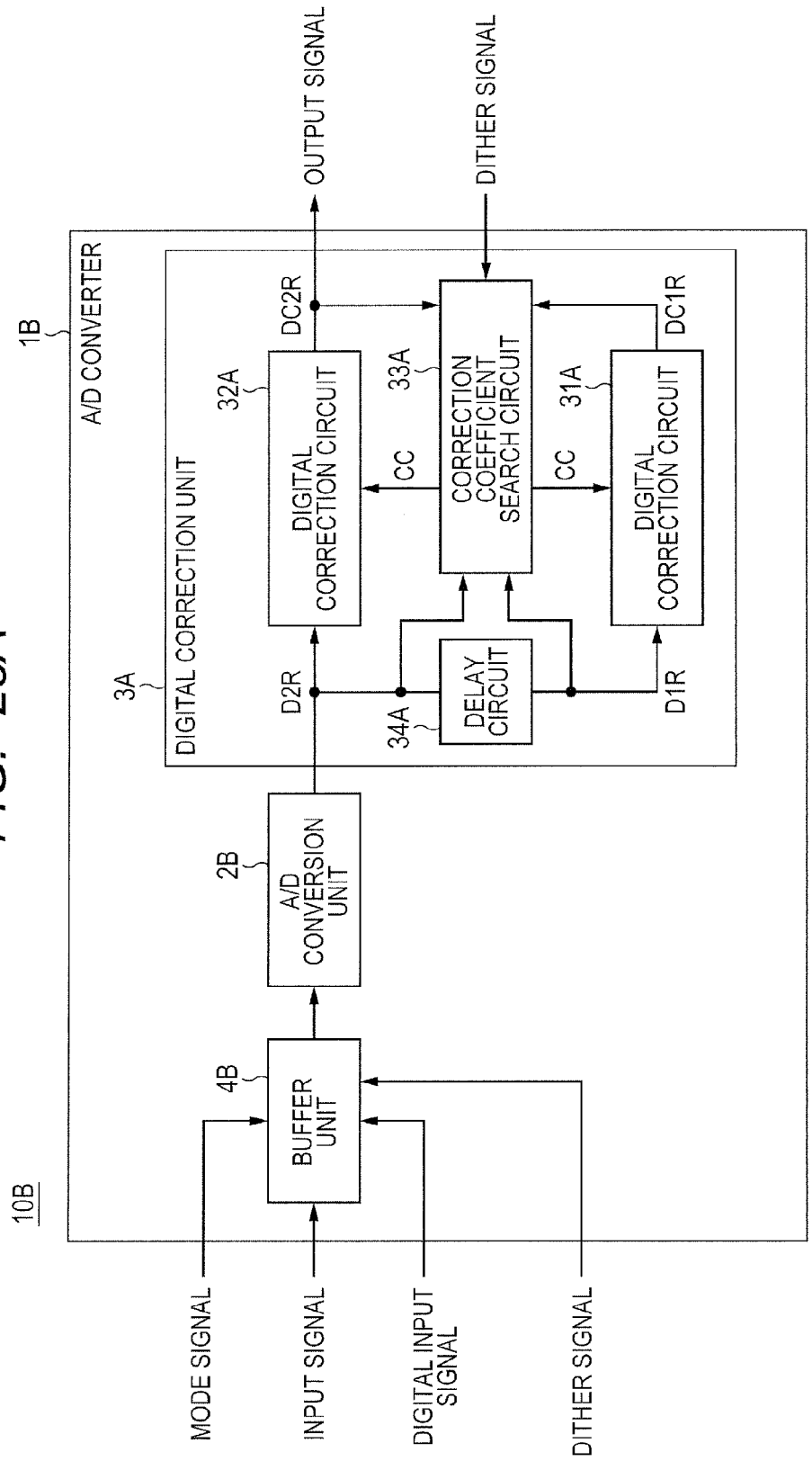
FIG. 25A is a block diagram illustrating an A/D converter according to Implementation Example 2.
Figure 25B:
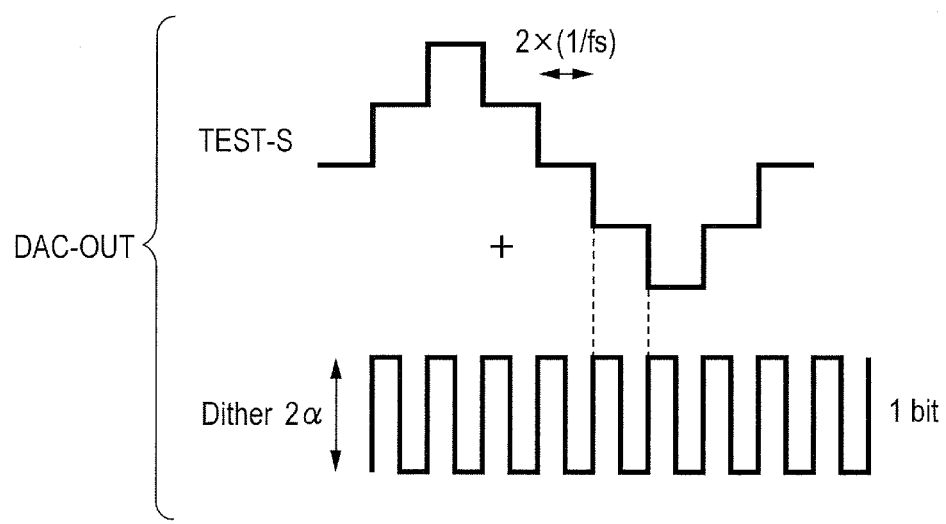
FIG. 25B is a waveform chart illustrating an output signal of a buffer unit according to Implementation Example 2.

FIG. 25A is a block diagram of an A/D converter according to Implementation Example 2. FIG. 25B is a waveform chart of the output signal of a buffer unit. FIG. 6 illustrates a configuration of the semiconductor integrated circuit device according to Implementation Example 2, and a timing flow in an A/D conversion test operation of the A/D converter.

As illustrated in FIG. 25A, the A/D converter 1B according to Implementation Example 2 is different from the A/D converter 1A according to Implementation Example 1 in that the buffer unit 4A is replaced with a buffer unit 4B and the A/D conversion unit 2A is replaced with an A/D conversion unit 2B.

Following on the present modification, the signal outputted from the buffer unit 4B at the time of the A/D conversion test operation becomes, as illustrated in FIG. 25B, an output signal (DAC-OUT) which is a staircase waveform of a value changing every two conversion cycles (2/fs) (hereinafter called a test signal (TEST-S)) with a superimposed waveform of a value changing every one conversion cycle (1/fs) with the amplitude of 2α. The test signal (TEST-S) has the same waveform as the output signal (DAC-OUT) of Implementation Example 1. The test signal (TEST-S) has a waveform of which the value is held by the buffer unit 4B during two conversion cycles (2/fs). In the upper-row drawing of FIG. 6, the test signal (TEST-S) is expressed by a dotted line, and the output signal (DAC-OUT) is expressed by a solid line. The first dither signal (Dither1) and the second dither signal (Dither2) are inputted into the buffer unit 4B, but the first dither signal (Dither1) and the second dither signal (Dither2) are not inputted into the A/D conversion unit 2B.

The A/D converter 1A of Implementation Example 1 and the A/D converter 1B of Implementation Example 2 do not have a difference in particular except for what is described above. Therefore, the duplicated explanation thereof is omitted.

Figure 7:
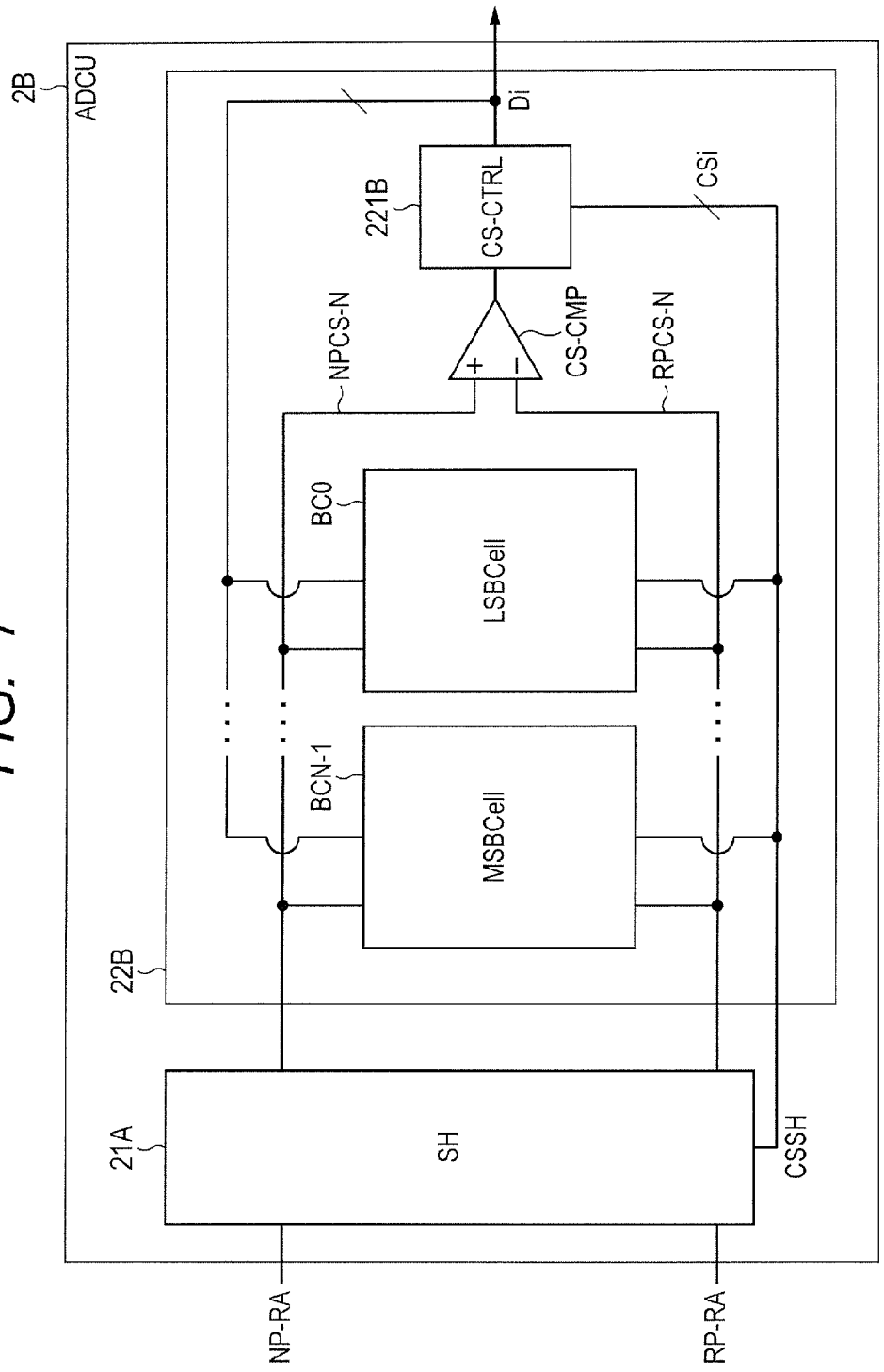
FIG. 7 is a drawing illustrating a configuration of an A/D conversion unit according to Implementation Example 2.

FIG. 7 illustrates a configuration of the A/D conversion unit according to Implementation Example 2. The A/D conversion unit 2B according to Implementation Example 2 is different from the A/D conversion unit 2A of Implementation Example 1 in that there is no dither signal bit cell (DBCell) in the conversion circuit and there is no signal to be inputted to and to be outputted from the dither signal bit cell (DBCell). Following on the modification, the control signals differ and the control circuit 221A is replaced with the control circuit 221B. There is no difference between the A/D conversion unit 2A according to Implementation Example 1 and the A/D conversion unit 2B except for what is described above. Therefore, the duplicated explanation thereof is omitted.

Figure 8:
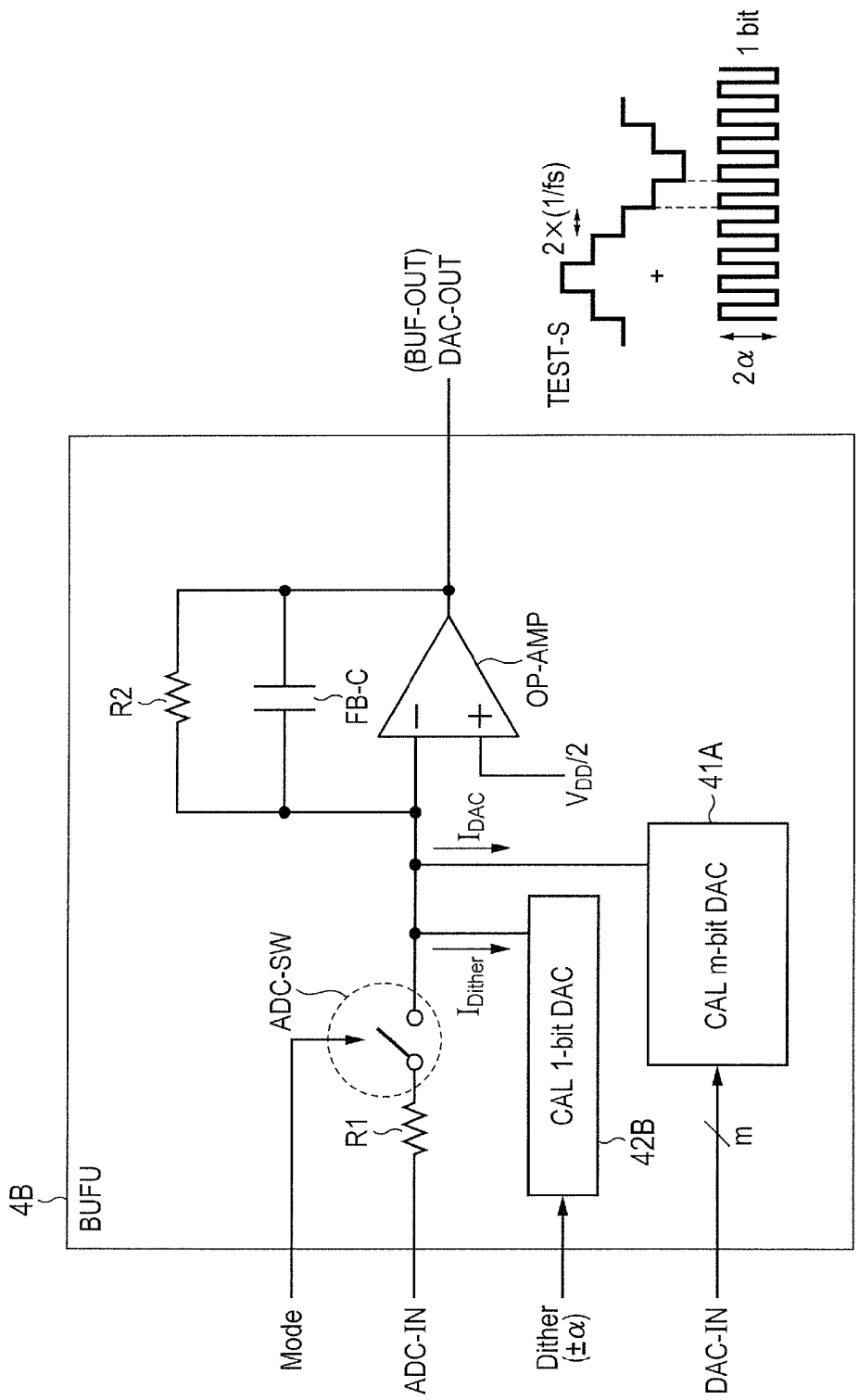
FIG. 8 is a drawing illustrating a configuration of a buffer unit according to Implementation Example 2.

FIG. 8 illustrates a configuration of the buffer unit according to Implementation Example 2.

The buffer unit 4B according to Implementation Example 2 is different from the buffer unit 4A according to Implementation Example 1 in that a D/A conversion circuit (CAL 1-bit DAC) 42B is newly provided. A 1-bit input signal (±α) corresponding to the dither signal (Dither) is inputted to the D/A conversion circuit 42B, to flow a current ($I_{Dither}$). This current ($I_{Dither}$) is superimposed on the current ($I_{DAC}$), and the output signal (DAC-OUT) is generated at the other end of the resistor R2. This output signal (DAC-OUT) is generated by the m-bit input signal (DAC-IN) (m is a natural number) and the 1-bit input signal (±α). Therefore, the output signal (DAC-OUT) has values various enough to determine the correction coefficient (CC), although the accuracy thereof is low. The current ($I_{DAC}$) is determined by the amount of current which flows into plural current sources corresponding to the m bits. Therefore, the current ($I_{DAC}$) is kept constant during two conversion cycles (2/fs). The current ($I_{Dither}$) is determined by the amount of current which flows into plural current sources corresponding to the 1 bit, and is changed every one conversion cycle (1/fs). Therefore, the buffer unit 4B outputs the output signal (DAC-OUT) which is the output voltage (test signal (TEST-S)) held during two conversion cycles (2/fs) corresponding to the current ($I_{DAC}$) with high accuracy, with the superimposed output voltage (dither signal (Dither)) changing every one conversion cycle (1/fs) corresponding to the current ($I_{Dither}$).

In this way, the dither signal does not necessarily have to be inputted directly to the A/D conversion unit, but may be superimposed on the output signal (DAC-OUT) of the buffer unit in the preceding stage. As is the case with Implementation Example 1, it is more preferable that there exist two dither signals such as the first dither signal (Dither1) and the second dither signal (Dither2) as in the present case; however, it suffices that there exists either of them. If it is permissible to take time in correction coefficient search, any dither signal may not be applied.

In summary, the semiconductor integrated circuit device 10B according to Implementation Example 2 is configured with the A/D conversion unit 2B, the digital correction unit 3A, and the buffer unit 4B. At the first A/D conversion period (A/D1) in the A/D conversion test operation, the A/D conversion unit 2B outputs the first A/D conversion result (D1R) as a digital signal, by A/D converting the output signal (DAC-OUT). At the subsequent second A/D conversion period (A/D2), the A/D conversion unit 2B outputs the second A/D conversion result (D2R) as a digital signal, by A/D converting the output signal (DAC-OUT). The correction coefficient (CC) for the A/D conversion is determined on the basis of the digital output (DC1R) obtained by digital correction performed to the first A/D conversion result (D1R) and the digital output (DC2R) obtained by digital correction performed to the second A/D conversion result (D2R). The test signal (TEST-S) among the output signal (DAC-OUT) is held by the buffer unit 4B during the first A/D conversion period (A/D1) and the second A/D conversion period (A/D1) in the A/D conversion test operation. In the buffer unit 4B, the first dither signal (Dither1) is superimposed on the output of the D/A conversion circuit 42B, and the output signal (DAC-OUT) is outputted.

Accordingly, at the time of the A/D conversion test operation, the buffer unit 4B holds the test signal (TEST-S) among the output signal (DAC-OUT), during the first A/D conversion period (A/D1) and the second A/D conversion period (A/D2). Therefore, the charge sharing type A/D conversion unit can be employed for the A/D conversion unit. Since there is little access frequency to a reference voltage, it is possible to simplify the generation of the reference voltage as an advantage. Furthermore, it is possible to reduce the power consumption of the regulator which generates the reference voltage, and it is also possible to accomplish the design of the regulator with relative ease. Only one A/D conversion unit 2B as an analog circuit is required; accordingly, it is possible to suppress the increase of the area.

The buffer unit 4B has both a generation function of an output signal (DAC-OUT) in which the dither signal (Dither) is superimposed on the test signal (TEST-S) for calculating the correction coefficient (CC), and a generation function of the output signal (BUF-OUT) in response to the input signal (ADC-IN). Therefore, it is not necessary to provide separately a circuit for generating the output signal (DAC-OUT) as the test signal for calculating the correction coefficient (CC), and a circuit for generating the output signal (BUF-OUT) in response to the input signal (ADC-IN); therefore, it is possible to reduce the area.

Owing to the dither signal (Dither), in the A/D conversion correction mode (CM), the correction coefficient (CC) for the digital correction of the first A/D conversion result (D1R) and the correction coefficient (CC) for the digital correction of the second A/D conversion result (D2R) are different in their higher-order bits. Therefore, it is possible to search the correction coefficient (CC), speedily and surely.

Implementation Example 3

Figure 9:
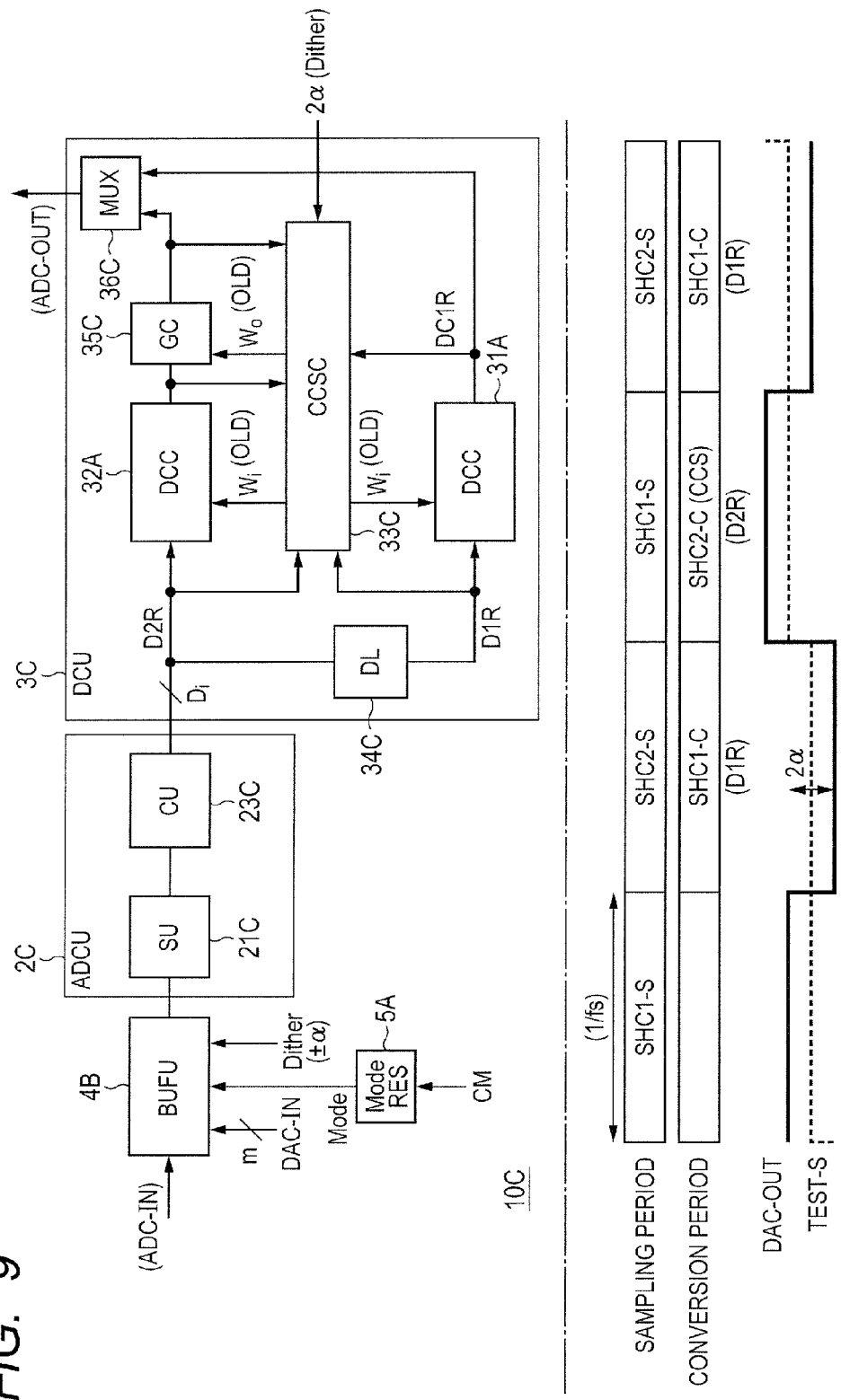
FIG. 9 is a drawing illustrating a configuration of a semiconductor integrated circuit device according to Implementation Example 3, and a timing flow in an A/D conversion test operation of an A/D converter.
Figure 26A:
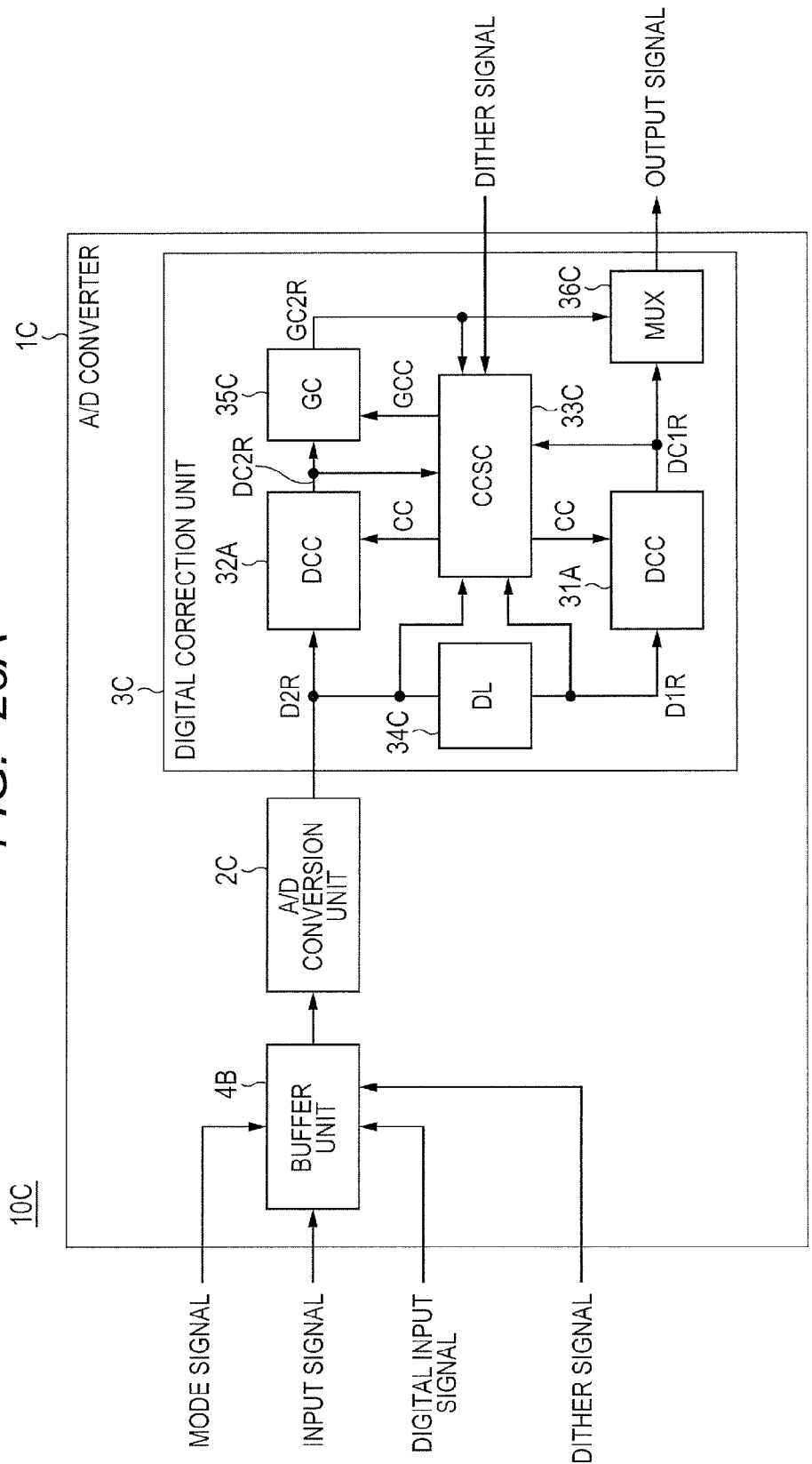
FIG. 26A is a block diagram illustrating an A/D converter according to Implementation Example 3.
Figure 26B:
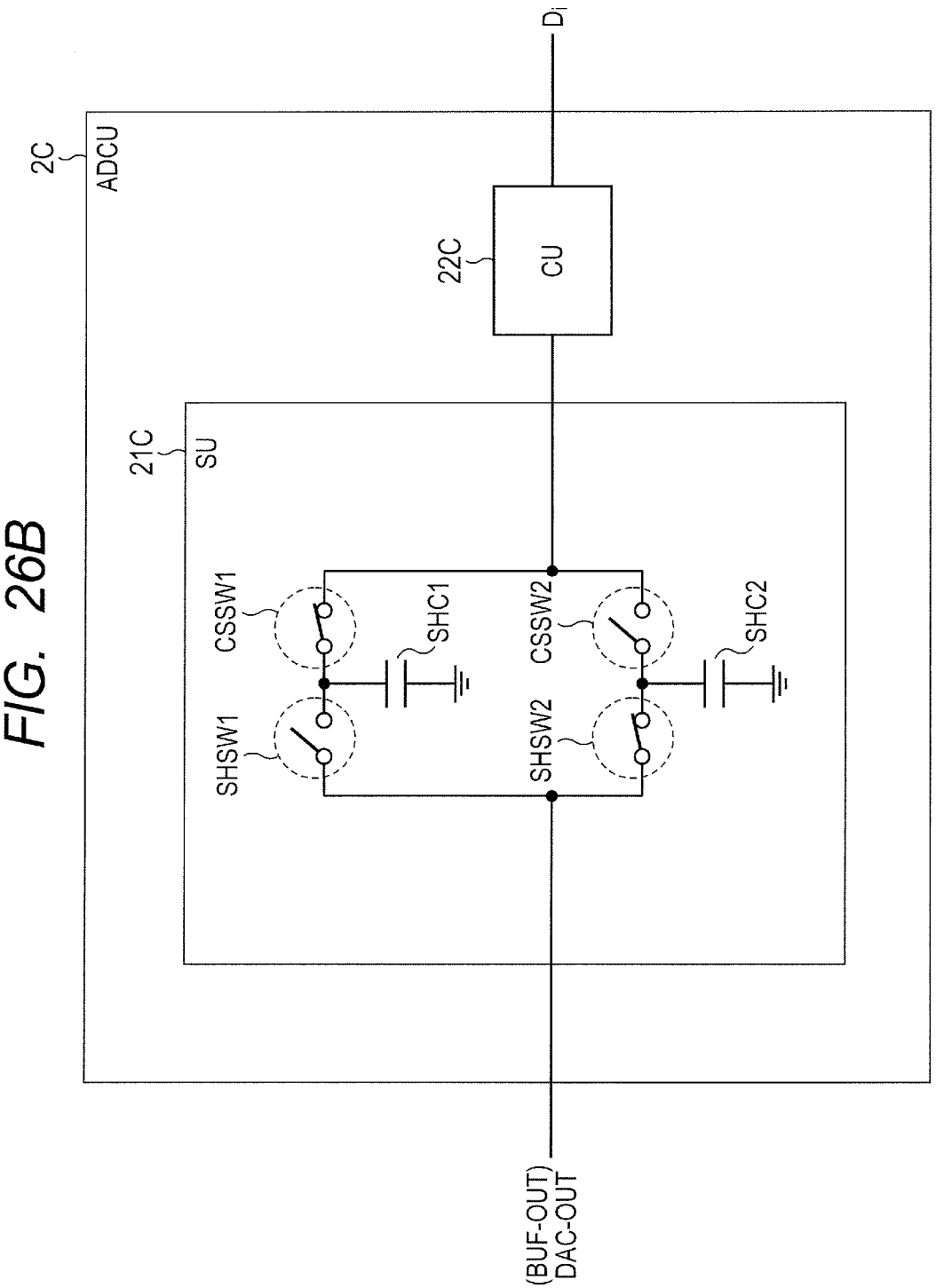
FIG. 26B is a drawing illustrating an A/D conversion unit according to Implementation Example 3.
Figure 26C:
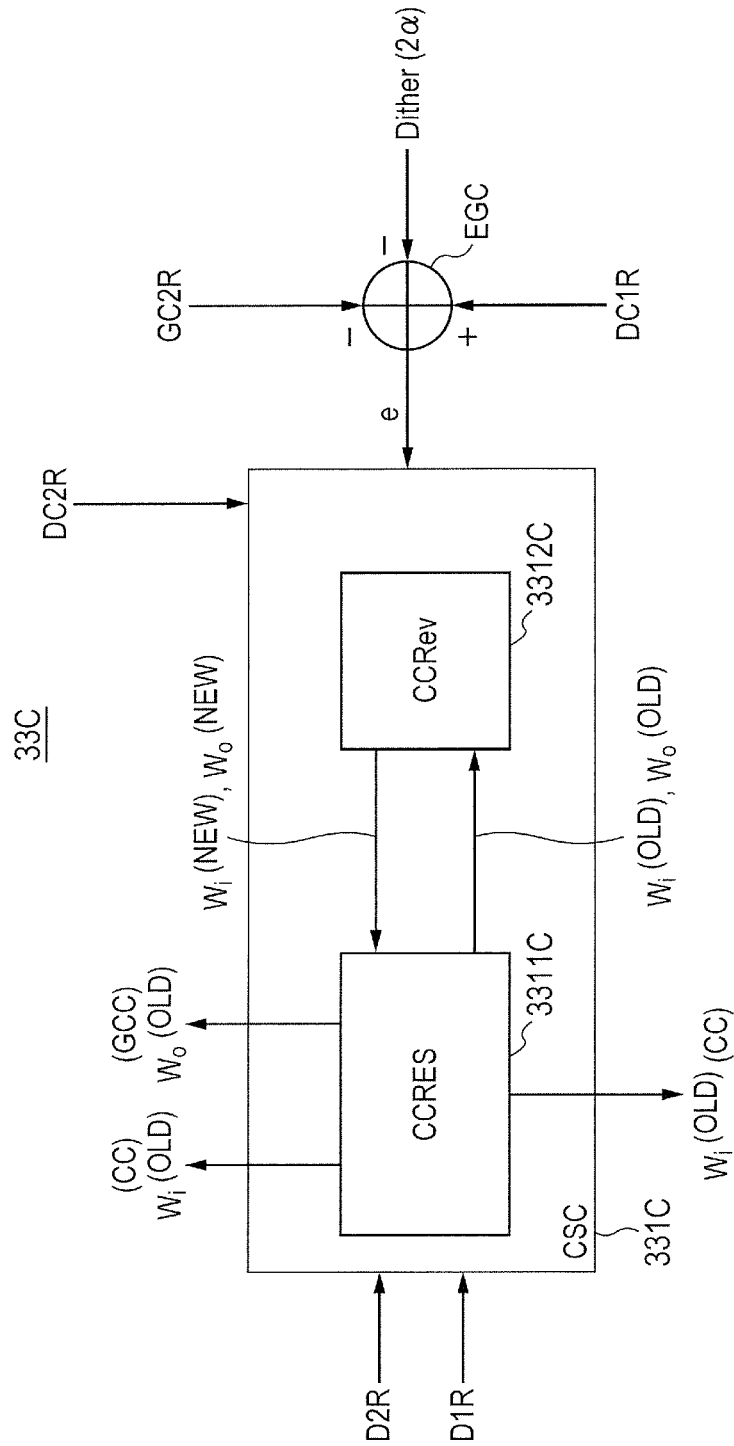
FIG. 26C is a block diagram illustrating a correction coefficient search circuit according to Implementation Example 3.

FIG. 26A is a block diagram illustrating an A/D converter according to Implementation Example 3. FIG. 26B illustrates an A/D conversion unit according to Implementation Example 3. FIG. 26C is a block diagram illustrating a correction coefficient search circuit according to Implementation Example 3. FIG. 9 illustrates a configuration of a semiconductor integrated circuit device according to Implementation Example 3, and a timing flow in an A/D conversion test operation of the A/D converter.

The A/D converter 1C illustrated in FIG. 26A is different from the A/D converter 1A according to Implementation Example 1 in the following point. The buffer unit 4B employed is the same as employed in Implementation Example 2. The A/D conversion unit 2C is different from the A/D conversion unit 2A according to Implementation Example 1. The delay circuit 34C is different from the delay circuit 34A according to Implementation Example 1. The correction coefficient search circuit (CCSC) 33C is different from the correction coefficient search circuit (CCSC) 33A according to Implementation Example 1. The output (DC2R) of the second digital correction circuit (DCC) 32A is inputted into the gain correction circuit 35C, and the output (GC2R) of the gain correction circuit 35C is inputted into the correction coefficient search circuit 33A. The multiplexer (MUX) 36C selects one of the output (DC1R) of the first digital correction circuit (DCC) 31A and the output (GC2R) of the gain correction circuit 35C, and outputs the selected one as the output signal (ADC-OUT). Therefore, the digital correction unit 3C is provided newly with the multiplexer 36C and the gain correction circuit 35C, when compared with the digital correction unit 3A.

As illustrated in FIG. 26B, the A/D conversion unit 2C is provided with a sampling circuit (SU) 21C and a conversion circuit (CU) 22C, in order to enable an interleaving operation in the A/D converting. The sampling circuit 21C is provided with a switch SHSW1, a capacitor SHC1, and a switch CSSW1. The sampling circuit 21C is further provided with a switch SHSW2, a capacitor SHC2, and a switch CSSW2.

The switch SHSW1 and the switch SHSW2 receive the output signal (DAC-OUT/BUF-OUT) from the buffer unit 4B. The capacitor SHC1 and the capacitor SHC2 sample and hold the output signal (DAC-OUT/BUF-OUT) from the buffer unit 4B. The switch CSSW1 for sharing a charge between the capacitor SHC1 and a bit cell (BCell) of the conversion circuit 22C (to be explained later) is coupled to the capacitor SHC1. The switch CSSW2 for sharing a charge between the capacitor SHC2 and a bit cell (BCell) of the conversion circuit 22C (to be explained later) is coupled to the capacitor SHC2.

The delay circuit (DL) 34C delays the output signal (D1) from the A/D conversion unit 2C by one conversion cycle (1/fs) at the time of the A/D conversion test operation, and does not delay substantially the output signal (D1) from the A/D conversion unit 2C at the time of the A/D conversion normal operation, and outputs them to the multiplexer (MUX) 36C.

The gain correction circuit (GC) 35C corrects the deviation between the output signal (DC1R) from the first digital correction circuit (DCC) 31A and the output signal (DC2R) from the second digital correction circuit (DCC) 32A in the interleaving operation, caused by the difference of the capacitance value between the capacitor SHC1 and the capacitor SHC2 due to the manufacturing variation, and by the difference due to temperature or arrangement. This correction is performed by digital correction with the use of the correction coefficient (GCC) (expressed as W0 in FIG. 9, etc.) stored in the correction coefficient register (CCRES) 3321C.

At the time of the A/D conversion test operation, a digital input signal (DAC-IN) and a 1-bit dither input signal (Dither) are inputted to the buffer unit 4B and undergo D/A converting, and the output signal (DAC-OUT) as an analog signal is outputted to the A/D conversion unit 2C. Here, the digital input signal (DAC-IN) is a digital signal of m bits (m is a natural number). The value of the dither input signal (Dither) is ±α. The signal outputted from the buffer unit 4B at the time of the A/D conversion test operation is the output signal (DAC-OUT) which is a staircase waveform of a value changing every two conversion cycles (2/fs) with a superimposed waveform of a value changing every one conversion cycle (1/fs) with the amplitude of 2α. The staircase waveform component (the test signal (TEST-S)) has a waveform of which the value is held by the buffer unit 4B during two conversion cycles (2/fs). In the lower-row drawing of FIG. 9, the test signal (TEST-S) is expressed by a dotted line, and the output signal (DAC-OUT) is expressed by a solid line.

The following processing as illustrated in the timing flow of FIG. 9 is executed.

(1) Sampling Period (SHC1-S)

The A/D conversion unit 2C samples the output signal (DAC-OUT) for calculating a correction coefficient (CC) and a correction coefficient (GCC) in a sampling period (SHC1-S) with the length of one conversion period (1/fs). The waveform of the output signal (DAC-OUT) has a shape of the output signal (DAC-OUT) explained in Implementation Example 2. The sampling is performed in the sampling circuit 21C by setting to ON the switch SHSW1 and setting to OFF the switch CSSW1, the switch SHSW2, and the switch CSSW2, and by storing the output signal (DAC-OUT) in the capacitor SHC1.

(2) Sampling Period (SHC2-S) and Conversion Period (SHC1-C)

After one conversion period (1/fs) of the processing described in (1), the A/D conversion unit 2C samples the output signal (DAC-OUT) in a sampling period (SHC2-S), and at the same time, the A/D conversion unit 2C performs A/D converting to the output signal stored in the capacitor SHC1, and outputs the result to the delay circuit 34C as the first A/D conversion result (D1R). The sampling is performed in the sampling circuit 21C by setting to OFF the switch SHSW1, setting to ON the switch CSSW1 and the switch SHSW2, and setting to OFF the switch CSSW2, and by storing the output signal (DAC-OUT) in the capacitor SHC2. In parallel with the present sampling, the conversion circuit 23C performs A/D converting to the output signal (DAC-OUT) stored in the capacitor SHC1 and outputs the result as the first A/D conversion result (D1R). Therefore, the sampling period (SHC2-S) is overlapped with the A/D conversion period (SHC1-C). The dither signal component α is superimposed on the output signal (DAC-OUT) of this period.

(3) Sampling Period (SHC1-S) and Conversion Period (SHC2-C)

After one conversion period (1/fs) of the processing described in (2), the A/D conversion unit 2C samples the output signal (DAC-OUT) in a sampling period (SHC1-S), and at the same time, the A/D conversion unit 2C performs A/D converting to the output signal stored in the capacitor SHC2, and outputs the result to the digital correction unit 3C as the second A/D conversion result (D2R). The sampling is performed in the sampling circuit 21C by setting to ON the switch SHSW1, setting to OFF the switch CSSW1 and the switch SHSW2, and setting to ON the switch CSSW2, and by storing the output signal (DAC-OUT) in the capacitor SHC1. In parallel with the present sampling, the conversion circuit 23C performs A/D converting to the output signal (DAC-OUT) stored in the capacitor SHC2 and outputs the result as the second A/D conversion result (D2R). Therefore, the sampling period (SHC1-S) is overlapped with the A/D conversion period (SHC2-C). The dither signal component −α is superimposed on the output signal (DAC-OUT) of this period.

Since the second digital correction result (D2R) is not delayed in the delay circuit 34C, the timing at which the first A/D conversion result (D1R) is inputted into the first digital correction circuit (DCC) 31A, and the timing at which the second digital correction result (D2R) is inputted into the second digital correction circuit (DCC) 32A become the same period.

Next, the digital correction is explained. The first digital correction circuit 31A performs digital correction of the first A/D conversion result (D1R) with the use of the correction coefficient (CC) (labeled as Wi(OLD) in FIG. 9) and outputs the digital correction result (DC1R) to the correction coefficient search circuit 33C. The second digital correction circuit (DCC) 32A performs digital correction of the second A/D conversion result (D2R) with the use of the correction coefficient (CC) (labeled as Wi(OLD) in FIG. 9) and outputs the digital correction result (DC2R) to the gain correction circuit (GC) 35C.

Here it is assumed that the first A/D conversion result (D1R) and the second A/D conversion result (D2R) are Di, and that the correction coefficient (CC) is Wi. Then, a value given by the expression (1) described in Implementation Example 1 is outputted from the first digital correction circuit 31A and the second digital correction circuit 32A. Here, i takes a value of from 0 to N−1 and indicates the i-th bit of the digital output signal of the charge-sharing-type AD converter 2C. N is a natural number of 2 or greater, and indicates the number of bits.

The gain correction circuit 35C performs digital correction of the output (D2R) from the second digital correction circuit 32A with the use of the correction coefficient (GCC) (labeled as W0(OLD) in FIG. 9) and outputs the digital correction result (GC2R) to the conversion error generating circuit EGC of the correction coefficient search circuit 33C.

The output of the gain correction circuit 35C is expressed by the following expression (2).

[Mathematical 2]

$$\sum_{i=0}^{N-1} W_0 \cdot W_i \cdot D_i \qquad (2)$$

As shown in FIG. 26C, the conversion error generating circuit EGC generates the conversion error (e) by subtracting the output (GC2R) supplied by the gain correction circuit 35C from the result (DC1R) of the digital correction performed to the first A/D conversion result (D1R), and further subtracting 2α from the remains. On the basis of this conversion error (e), the correction coefficient calculation circuit 3312C searches for the correction coefficient (CC) and the correction coefficient (GCC) by the LMS algorithm.

The correction coefficient calculation circuit 3312C calculates a correction coefficient (CC) with a predetermined algorithm, such as the LMS algorithm, according to the conversion error (e), the first A/D conversion result (D1R), the second A/D conversion result (D2R), and the correction coefficient (CC). Here, the correction coefficient (CC) is the one that is stored in the correction coefficient register 3311C in advance (labeled as Wi(OLD) in FIG. 26C). The newly calculated correction coefficient (CC) (labeled as Wi(NEW) in FIG. 26C) is newly stored in the correction coefficient register 3311C.

Furthermore, the correction coefficient calculation circuit 3312C calculates a correction coefficient (GCC) with a predetermined algorithm, such as the LMS algorithm, according to the conversion error (e), the second A/D conversion result (D2R), and the correction coefficient (GCC). Here, the correction coefficient (GCC) is the one that is stored in the correction coefficient register (CCRES) 3311C in advance (labeled as W0(OLD) in FIG. 26C). The newly calculated correction coefficient (GCC) (labeled as W0(NEW) in FIG. 26C) is newly stored in the correction coefficient register 3311C. The correction coefficient register 3311C and the correction coefficient calculation circuit 3312C are included in the coefficient search circuit 331C.

(4) Sampling Period (SHC2-S) and Conversion Period (SHC1-C) and Subsequent Periods The operation is repeated such that after one conversion period (1/fs) of the processing described in (3), the processing described in (2) is performed, and after one conversion period (1/fs) of the processing described in (2), the processing described in (3) is performed, and so on. Accordingly, the value of the correction coefficient register 3311A is updated. Therefore, the correction coefficient search period (CCS) occurs whenever the A/D conversion period (SHC2-C) occurs.

Figure 10:
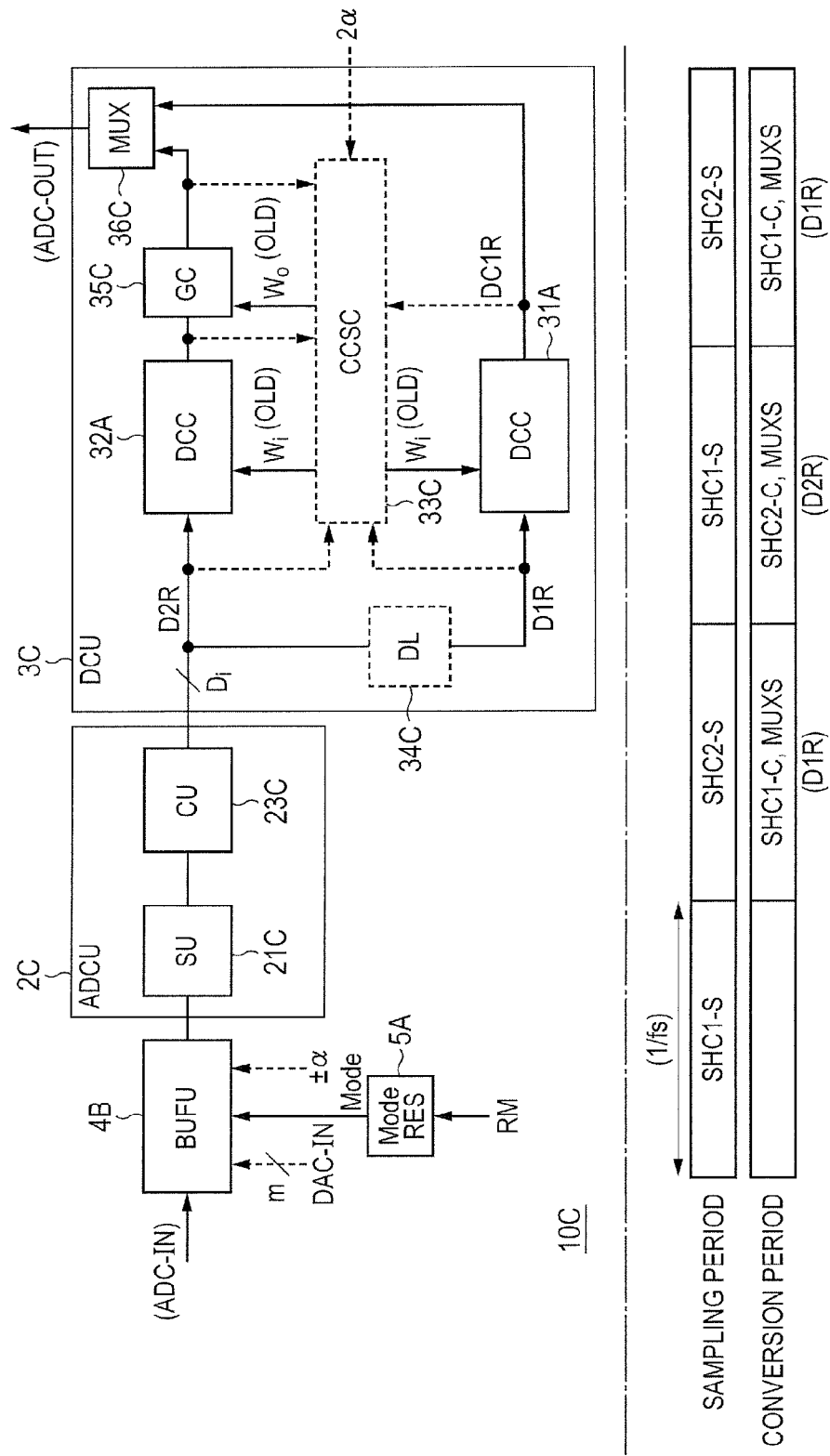
FIG. 10 is a drawing illustrating a configuration of the semiconductor integrated circuit device according to Implementation Example 3, and a timing flow in an A/D conversion normal operation of the A/D converter.

FIG. 10 illustrates a configuration of the semiconductor integrated circuit device according to Implementation Example 3, and a timing flow in an A/D conversion normal operation of the A/D converter.

The circuit configuration of the A/D converter 2C is the same as that illustrated in FIG. 9. An A/D conversion normal operation mode (RM) is set to the mode register 5A.

At the time of the A/D conversion normal operation, the buffer unit 4B is supplied with an input signal (ADC-IN) and outputs an output signal (BUF-OUT).

The following processing as illustrated in the timing flow of FIG. 10 is executed.

(1) Sampling Period (SHC1-S)

In the sampling period (SHC1-S) with the length of one conversion period (1/fs), the A/D conversion unit 2C samples the output signal (BUF-OUT) bases on the input signal (ADC-IN). The sampling is performed in the sampling circuit 21C by setting to ON the switch SHSW1 and setting to OFF the switch CSSW1, the switch SHSW2, and the switch CSSW2, and by storing the output signal (BUF-OUT) in the capacitor SHC1.

(2) Sampling Period (SHC2-S) and Conversion Period (SHC1-C)

After one conversion period (1/fs) of the processing described in (1), the A/D conversion unit 2C samples the output signal (BUF-OUT) in a sampling period (SHC2-S), and at the same time, the A/D conversion unit 2C performs A/D converting to the output signal stored in the capacitor SHC1, and outputs the result to the delay circuit 34C as the first A/D conversion result (D1R). In this case, the delay circuit 34C disables the delay function; accordingly, the first A/D conversion result (D1R) is outputted to the first digital correction circuit 31A without substantial delay. The first digital correction circuit 31A performs digital correction to the first A/D conversion result (D1R) with the use of the correction coefficient (CC) calculated at the time of the A/D conversion test operation and outputs the result as the correction result (DC1R). This correction result (DC1R) is outputted to the multiplexer 36C. The sampling is performed in the sampling circuit 21C by setting to OFF the switch SHSW1, setting to ON the switch CSSW1 and the switch SHSW2, and setting to OFF the switch CSSW2, and by storing the output signal (BUF-OUT) in the capacitor SHC2. In parallel with the present sampling, the conversion circuit 23C performs A/D converting to the output signal (BUF-OUT) stored in the capacitor SHC1 and outputs the result as the first A/D conversion result (D1R). Therefore, the sampling period (SHC2-S) is overlapped with the A/D conversion period (SHC1-C). The first digital correction circuit 31A performs digital correction to the first A/D conversion result (D1R) with the use of the correction coefficient (CC) calculated at the time of the A/D conversion test operation and outputs the correction result to the multiplexer 36C. The multiplexer 36C selects the correction result from the first digital correction circuit 31A, and outputs it as the output signal (ADC-OUT).

(3) Sampling Period (SHC1-S) and Conversion Period (SHC2-C)

After one conversion period (1/fs) of the processing described in (2), the A/D conversion unit 2C samples the output signal (BUF-OUT) in a sampling period (SHC1-S), and at the same time, the A/D conversion unit 2C performs A/D converting to the output signal (BUF-OUT) stored in the capacitor SHC2, and outputs the result to the second digital correction circuit 32A as the second A/D conversion result (D2R). The sampling is performed in the sampling circuit 21C by setting to ON the switch SHSW1, setting to OFF the switch CSSW1 and the switch SHSW2, and setting to ON the switch CSSW2, and by storing the output signal (BUF-OUT) in the capacitor SHC1. In parallel with the present sampling, the conversion circuit 23C performs A/D converting to the output signal (BUF-OUT) stored in the capacitor SHC2 and outputs the result as the second A/D conversion result (D2R). Therefore, the sampling period (SHC1-S) is overlapped with the A/D conversion period (SHC2-C). The second digital correction circuit 32A performs digital correction to the second A/D conversion result (D2R) with the use of the correction coefficient (CC) calculated at the time of the A/D conversion test operation and outputs the correction result (DC2R) to the gain correction circuit 35C. The gain correction circuit 35C performs digital correction to the output from the second digital correction circuit 32A with the use of the correction coefficient (GCC) calculated at the time of the A/D conversion test operation and outputs the correction result to the multiplexer 36C. The multiplexer 36C selects the correction result (GC2R) from the gain correction circuit 35C, and outputs it as the output signal (ADC-OUT). As illustrated in FIG. 10, the delay circuit 34C and the correction coefficient search circuit 33C which are illustrated by a dotted line do not operate at the time of the A/D conversion normal operation. However, the correction coefficient search circuit 33C holds the correction coefficient (CC) and the correction coefficient (GCC), and outputs them to the digital correction circuits 31A and 32A and the gain correction circuit 35C.

(4) Sampling Period (SHC2-S) and Conversion Period (SHC1-C) and Subsequent Periods Hereafter, the operation is repeated such that after one conversion period (1/fs) of the processing described in (3), the processing described in (2) is performed, and after one conversion period (1/fs) of the processing described in (2), the processing described in (3) is performed, and so on.

In this way, the A/D converter 1C performs the interleaving operation. The interleaving operation described here means that two pairs of capacitors are provided, and when an input signal is sampled and stored in one capacitor, the input signal stored in the other capacitor is processed. By the interleaving operation, the A/D converter 1C can realize fast signal processing and low power consumption even if it operates at a low speed, compared with the A/D converter 1A according to Implementation Example 1 or the A/D converter 1B according to Implementation Example 2. This is because in the A/D converter 1A or the A/D converter 1B, it is necessary to perform A/D converting after sampling of an input signal within one conversion cycle (1/fs); accordingly, a high-speed operation is required. The A/D converter 1C performs sampling and A/D converting in parallel within one conversion cycle (1/fs); accordingly, a low speed operation is allowed.

In performing the interleaving operation, the conversion gain for the first A/D conversion result (D1R) and the second A/D conversion result (D2R) changes due to the capacitance value variations between the capacitor SHC1 and the capacitor SHC2; thereby distortion is generated. The distortion correction is performed in the gain correction circuit 35C and the distortion accompanying the interleaving operation can be reduced by employing the correction coefficient (GCC).

Figure 11A:
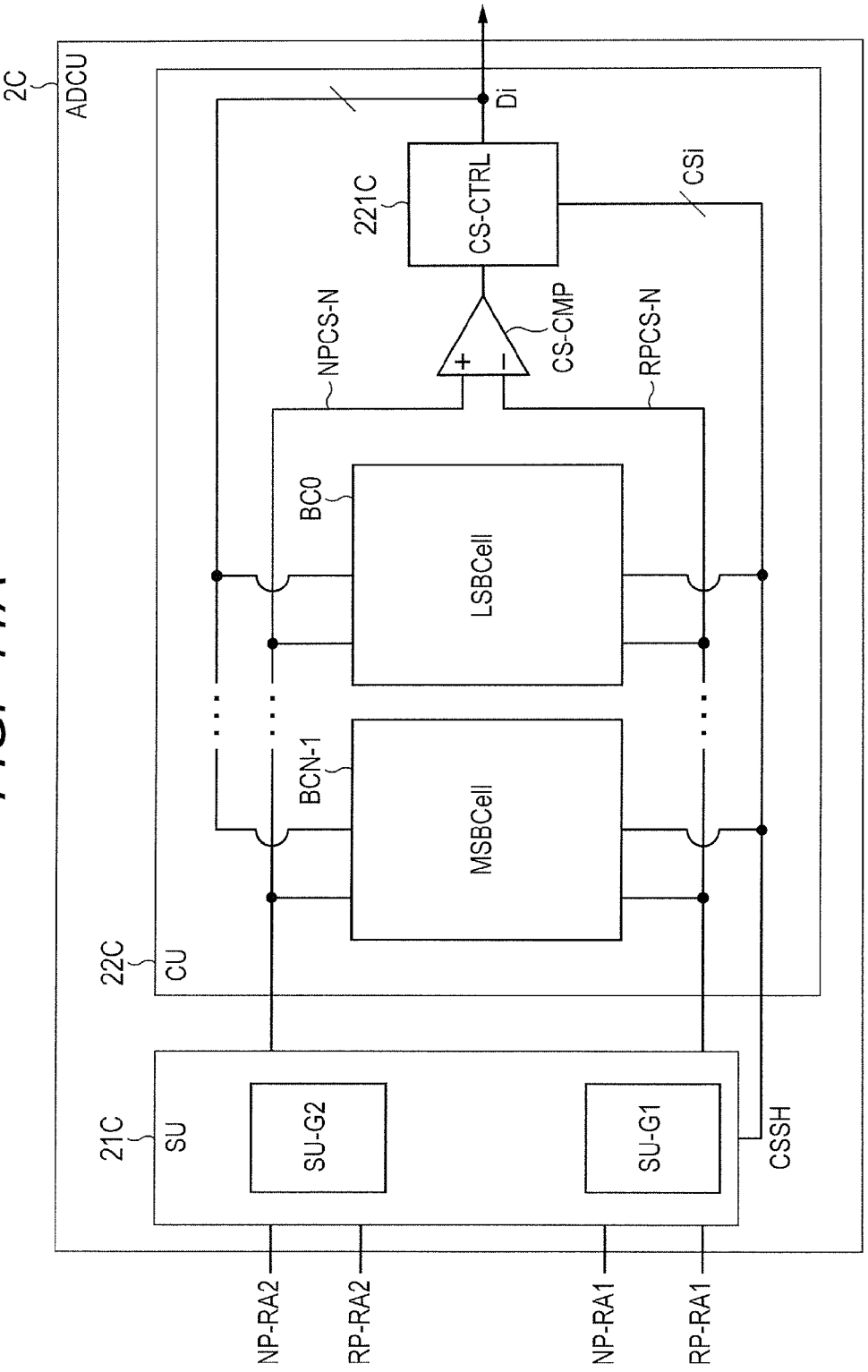
FIG. 11A is a detail drawing illustrating an A/D conversion unit according to Implementation Example 3.
Figure 11B:
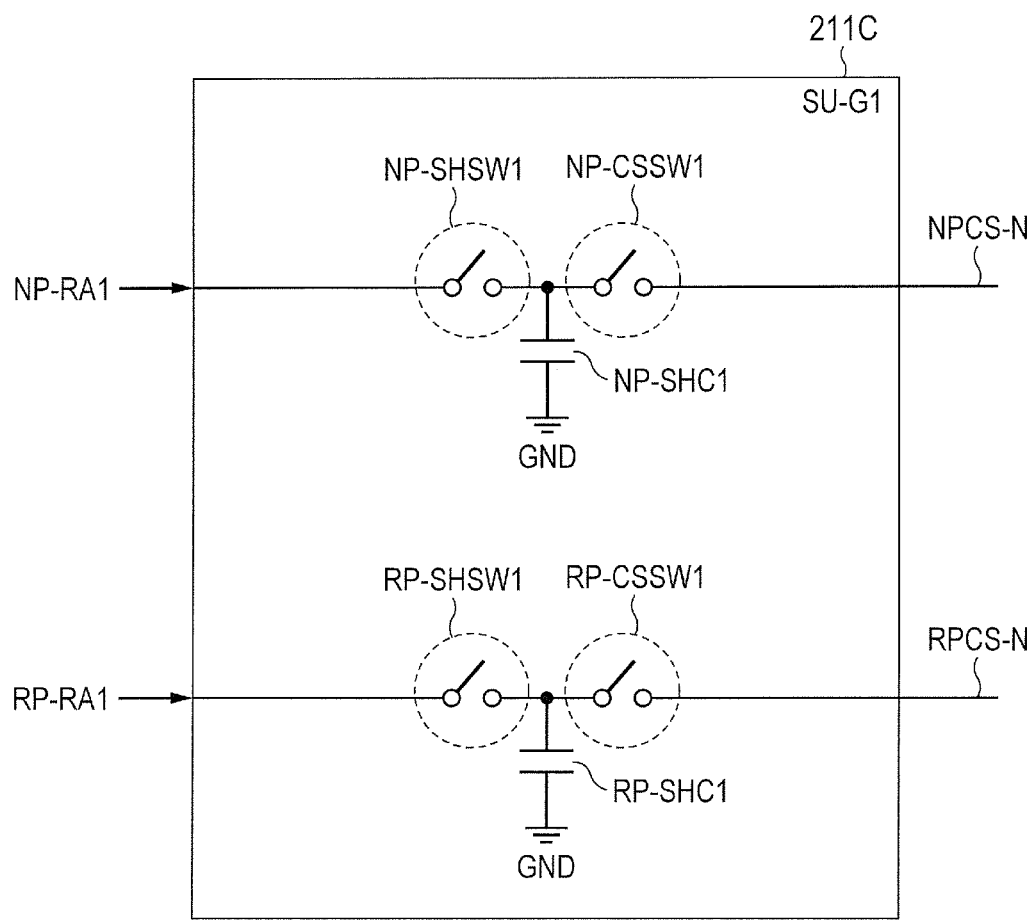
FIG. 11B is a drawing illustrating a sample hold circuit and a switching circuit for charge sharing according to Implementation Example 3.
Figure 11C:
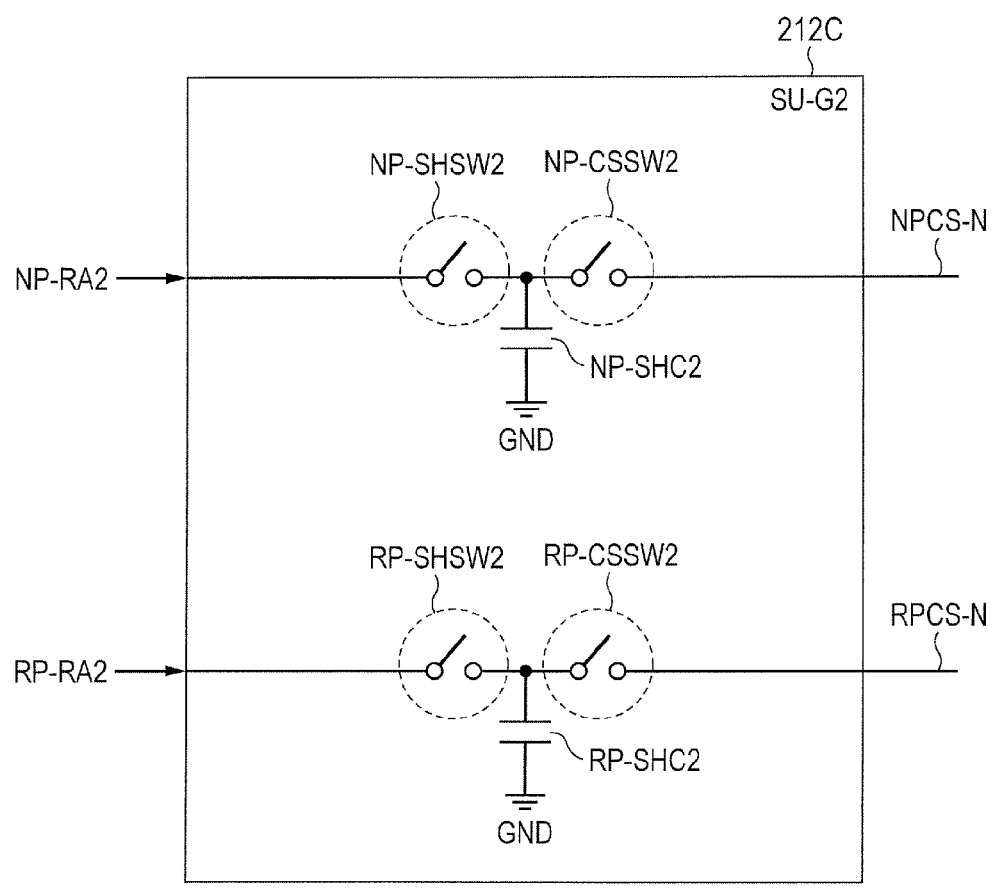
FIG. 11C is a drawing illustrating a sample hold circuit and a switching circuit for charge sharing according to Implementation Example 3.

FIG. 11A is a detail drawing of an A/D conversion unit according to Implementation Example 3. FIG. 11B and FIG. 11C are circuit diagrams of a sampling circuit.

In Implementation Example 3, the A/D conversion unit 2C is designed to treat a single phase signal; however, it is also preferable to treat a differential signal. The A/D conversion unit 2C illustrated in FIG. 11A is configured so as to treat a differential signal as the input signal and a single phase signal as the output signal.

Each component in the conversion circuit 22C except for a control circuit corresponds to each component with the same symbol in the conversion circuit 22B illustrated in FIG. 7.

Each component of the sampling circuit (SU-G1) 211C illustrated in FIG. 11B corresponds to each component of the sampling circuit 21A illustrated in FIG. 7 (the sampling circuit 21A illustrated in FIG. 4B) as follows. A switch NP-SHSW1 corresponds to the switch NP-SHSW. A capacitor NP-SHC1 corresponds to the capacitor NP-SHC. A switch NP-CSSW1 corresponds to the switch NP-CSSW. A switch RP-SHSW1 corresponds to the switch RP-SHSW. A capacitor RP-SHC1 corresponds to the capacitor RP-SHC. A switch RP-CSSW1 corresponds to the switch RP-CSSW. An analog signal NP-RA1 corresponds to the analog signal NP-RA. An analog signal RP-RA1 corresponds to the analog signal RP-RA.

Each component of the sampling circuit (SU-G2) 212C illustrated in FIG. 11C corresponds to each component of the sampling circuit 21A illustrated in FIG. 7 (the sampling circuit 21A illustrated in FIG. 4B) as follows. A switch NP-SHSW2 corresponds to the switch NP-SHSW. A capacitor NP-SHC2 corresponds to the capacitor NP-SHC. A switch NP-CSSW2 corresponds to the switch NP-CSSW. A switch RP-SHSW2 corresponds to the switch RP-SHSW. A capacitor RP-SHC2 corresponds to the capacitor RP-SHC. A switch RP-CSSW2 corresponds to the switch RP-CSSW. An analog signal NP-RA2 corresponds to the analog signal NP-RA. An analog signal RP-RA2 corresponds to the analog signal RP-RA.

The operation of the A/D conversion unit 2C is explained in the following.

(1) Sampling Period (SHC1-S)

In the sampling period (SHC1-S), each component of the sampling circuit 211C performs the same operation as each corresponding component of the A/D conversion unit 2B illustrated in FIG. 7, as follows.

The operation at the first timing of (A) A/D conversion test operation of (2) Operation in the explanation part concerning FIG. 4B is performed.

(2) Conversion Period (SHC1-C)

In an A/D conversion period (SHC1-C), each component of the sampling circuit 211C and each component of the conversion circuit 22C perform the same operation as each corresponding component of the A/D conversion unit 2B illustrated in FIG. 7, as follows.

The operation at the first timing and the third timing of (A) A/D conversion test operation of (2) Operation in the explanation part concerning FIG. 4B is performed. Naturally there is no operation concerning the dither signal bit cell (DBCell).

(3) Sampling Period (SHC2-S)

In a sampling period (SHC2-S), each component of the sampling circuit 212C performs the same operation as each corresponding component of the A/D conversion unit 2B illustrated in FIG. 7, as follows.

The operation at the first timing of (A) A/D conversion test operation of (2) Operation in the explanation part concerning FIG. 4B is performed.

(4) Conversion Period (SHC2-C)

In an A/D conversion period (SHC2-C), each component of the sampling circuit 212C and each component of the conversion circuit 22C perform the same operation as each corresponding component of the A/D conversion unit 2B illustrated in FIG. 7, as follows.

The operation at the second timing and at the third timing of (A) A/D conversion test operation of (2) Operation in the explanation part concerning FIG. 4B is performed. Naturally there is no operation concerning the dither signal bit cell (DBCell).

In Implementation Example 3, it is also preferable to configure such that the buffer unit 4B is replaced with the buffer unit 4A, and a dither signal bit cell (DBCell) is provided in the A/D conversion unit 2C (the conversion circuit 22A is employed in lieu of the conversion circuit 22C).

In summary, the semiconductor integrated circuit device 10C according to Implementation Example 3 is configured with the A/D conversion unit 2C, the digital correction unit 3C, and the buffer unit 4B. At the first A/D conversion period (A/D1) in the A/D conversion test operation, the A/D conversion unit 2C outputs the first A/D conversion result (D1R) as a digital signal, by A/D converting the output signal (DAC-OUT). At the subsequent second A/D conversion period (A/D2), the A/D conversion unit 2C outputs the second A/D conversion result (D2R) as a digital signal, by A/D converting the output signal (DAC-OUT). The correction coefficient (CC) for the A/D conversion is determined on the basis of the digital output (DC1R) obtained by digital correction performed to the first A/D conversion result (D1R) and the digital output (DC2R) obtained by digital correction performed to the second A/D conversion result (D2R). The test signal (TEST-S) among the output signal (DAC-OUT) is held by the buffer unit 4B during the first A/D conversion period (A/D1) and the second A/D conversion period (A/D1) in the A/D conversion test operation. In the buffer unit 4B, the first dither signal (Dither1) is superimposed on the output of the D/A conversion circuit 42B, and the output signal (DAC-OUT) is outputted.

Accordingly, at the time of the A/D conversion test operation, the buffer unit 4B holds the test signal (TEST-S) among the output signal (DAC-OUT), during the first A/D conversion period (A/D1) and the second A/D conversion period (A/D2). Therefore, the charge sharing type A/D conversion unit can be employed for the A/D conversion unit, and since there is little access frequency to a reference voltage, it is possible to simplify the generation of the reference voltage as an advantage. Furthermore, it is possible to reduce the power consumption of the regulator which generates the reference voltage, and it is also possible to accomplish the design of the regulator with relative ease. Only one A/D conversion unit 2B as an analog circuit is required; accordingly, it is possible to suppress the increase of the area.

The buffer unit 4B has both a generation function of the output signal (DAC-OUT) for calculating the correction coefficient (CC), and a generation function of the output signal (BUF-OUT) corresponding to the input signal (ADC-IN). Therefore, it is not necessary to provide separately a circuit for generating the output signal (DAC-OUT) as the test signal for calculating the correction coefficient (CC), and a circuit for generating the output signal (BUF-OUT) in response to the input signal (ADC-IN); therefore, it is possible to reduce the area.

Owing to the dither signal (Dither), in the A/D conversion correction mode (CM), the correction coefficient (CC) for the digital correction of the first A/D conversion result (D1R) and the correction coefficient (CC) for the digital correction of the second A/D conversion result (D2R) are different in their higher-order bits. Therefore, it is possible to search the correction coefficient (CC), speedily and surely.

By the interleaving operation, the A/D conversion unit 2C can realize fast signal processing and low power consumption even if it operates at a low speed, compared with the A/D conversion unit 2A according to Implementation Example 1 or the A/D conversion unit 2B according to Implementation Example 2. The A/D conversion unit 2C performs sampling and A/D converting in parallel within one conversion cycle (1/fs); accordingly, a low speed operation is allowed.

In performing the interleaving operation, the conversion gain for the first A/D conversion result (D1R) and the second A/D conversion result (D2R) changes due to the capacitance value variations between the capacitor SHC1 and the capacitor SHC2; thereby distortion is generated. The distortion correction is performed in the gain correction circuit 35C and the distortion accompanying the interleaving operation can be reduced by employing the correction coefficient (GCC).

Implementation Example 4

Figure 12:
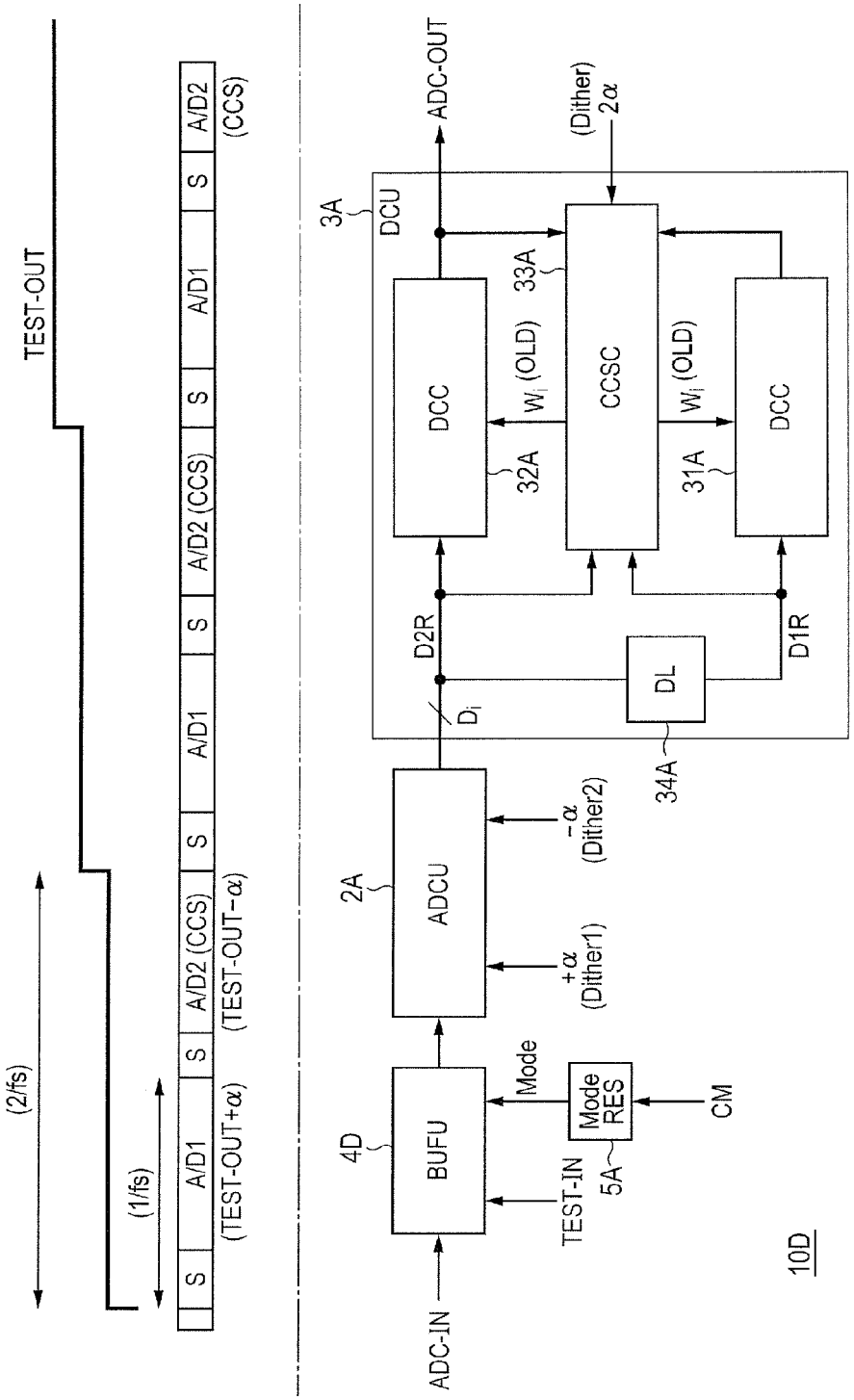
FIG. 12 is a drawing illustrating a configuration and an operation of a semiconductor integrated circuit device according to Implementation Example 4.
Figure 27:
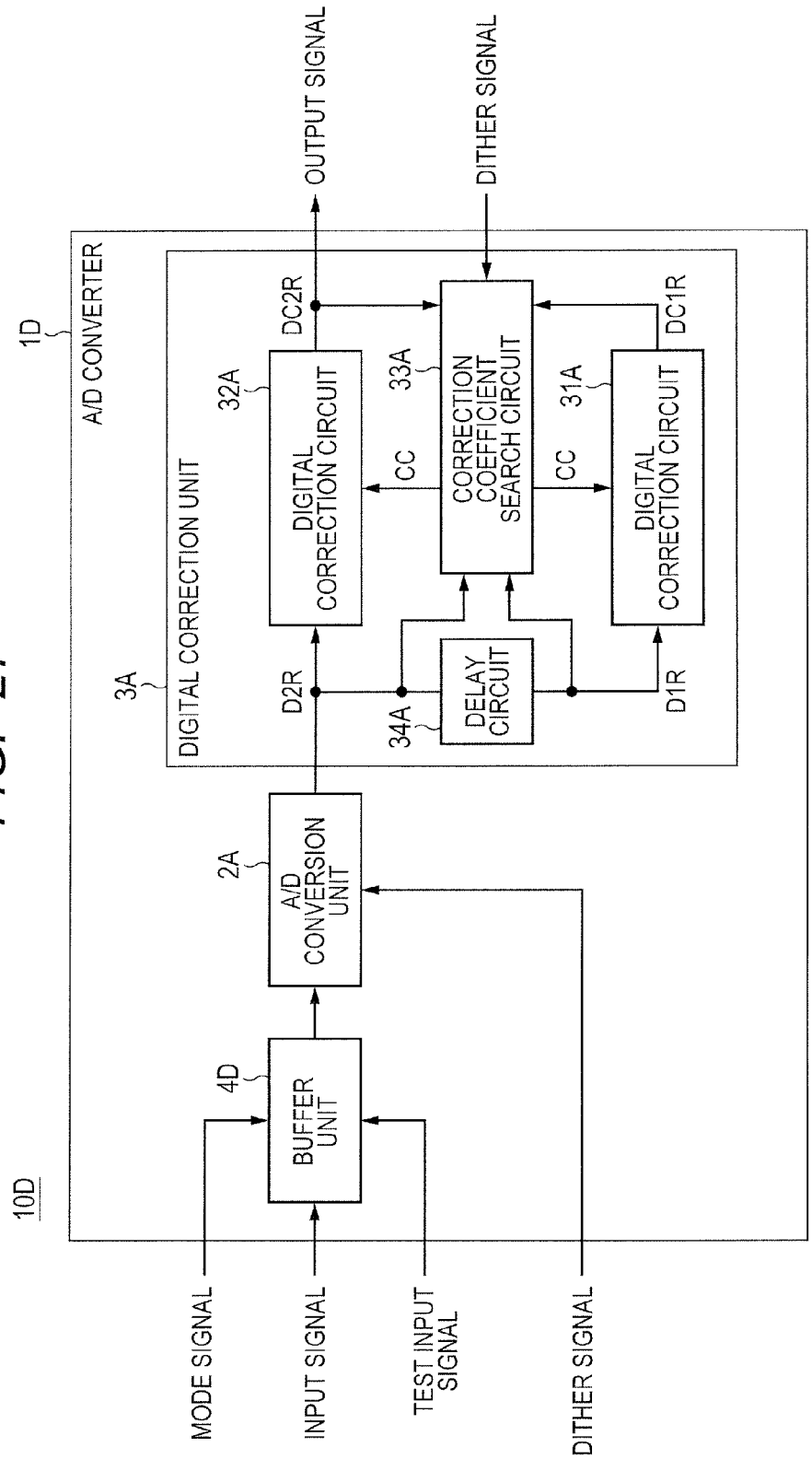
FIG. 27 is a block diagram illustrating an A/D converter according to Implementation Example 4.

FIG. 27 is a block diagram illustrating an A/D converter according to Implementation Example 4. FIG. 12 illustrates a configuration and an operation of a semiconductor integrated circuit device according to Implementation Example 4.

The A/D converter 1D illustrated in FIG. 27 is different from the A/D converter 1A according to Implementation Example 1 in the following point. A buffer unit 4D is provided in lieu of the buffer unit 4A. At the time of the A/D conversion test operation, a test input signal (TEST-IN) is inputted to the buffer unit 4D in lieu of the digital input signal (DAC-IN), and, an output signal (TEST-OUT) is outputted from the buffer unit 4D in lieu of the output signal (DAC-OUT). The waveform of the output signal (DAC-OUT) and the waveform of the output signal (TEST-OUT) are the same. Except for the point described above, the A/D converter 1D is the same as the A/D converter 1A according to Implementation Example 1.

Figure 13A:
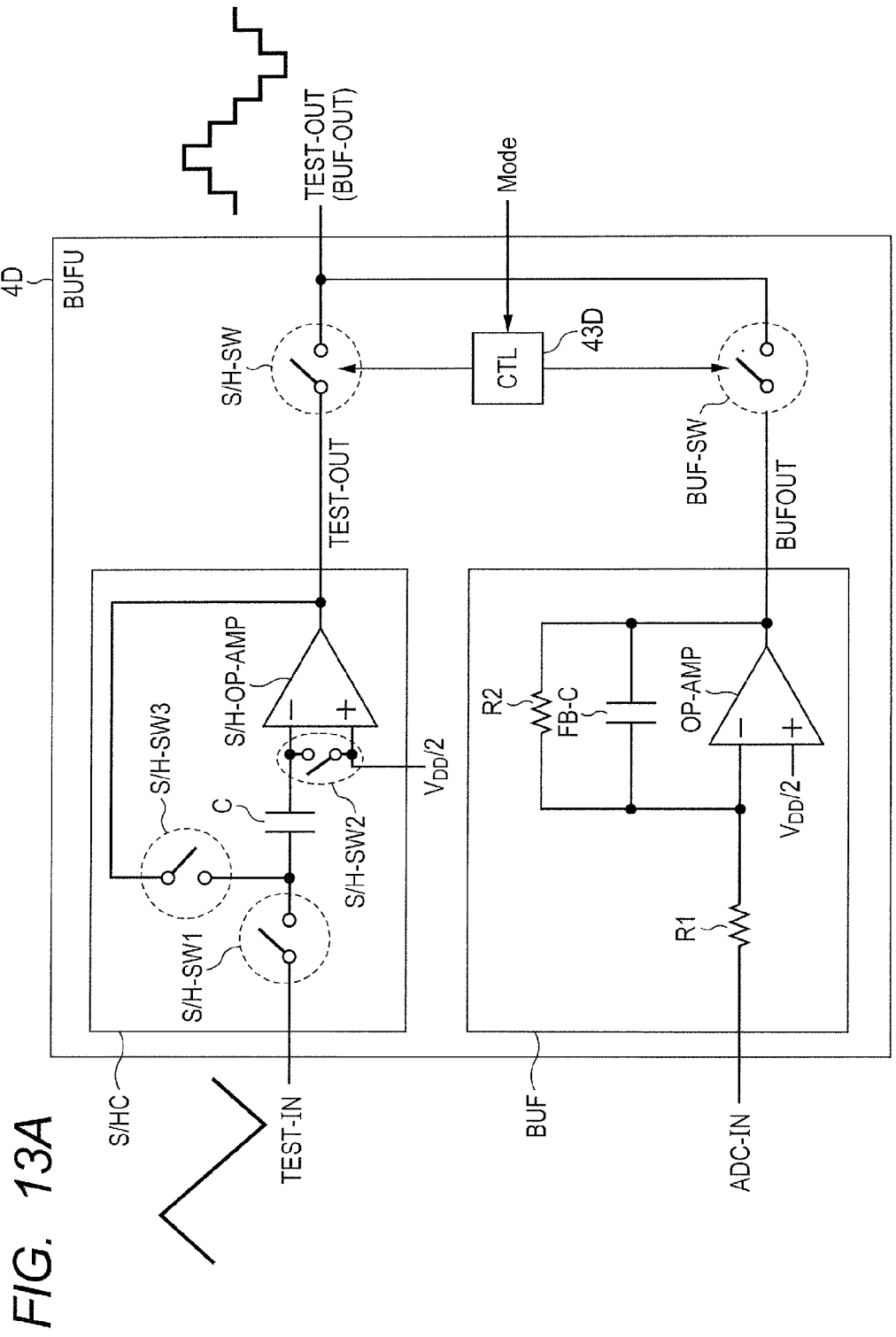
FIG. 13A is a drawing illustrating a configuration and an operation of a buffer unit according to Implementation Example 4.

FIG. 13A illustrates a configuration and an operation of the buffer unit according to Implementation Example 4. FIG. 13B illustrates timing of a control clock of the buffer unit according to Implementation Example 4.

The buffer unit (BUFU) 4D is configured with a sample hold circuit S/HC, an input buffer circuit BUF, a switch S/H-SW, a switch BUF-SW, and a control circuit (CTL) 43D. The sample hold circuit S/HC is configured with a switch S/H-SW1, a switch S/H-SW2, a switch S/H-SW3, a capacitor C, and an operational amplifier S/H-OP-AMP. The input buffer circuit BUF is basically the same as the buffer unit 4A illustrated in FIG. 5, but is not provided with the D/A conversion circuit 41A of the component.

The test input signal (TEST-IN) of a triangular wave is inputted to one end of the switch S/H-SW1, and the other end of the switch S/H-SW1 is coupled to one end of the capacitor C. One end of the switch S/H-SW2 is coupled to an inverting input terminal (−) of the operational amplifier S/H-OP-AMP, and the other end of the switch S/H-SW2 is coupled to a noninverting input terminal (+) of the operational amplifier S/H-OP-AMP. One end of the operational amplifier capacitor C is coupled to one end of the switch S/H-SW3, and the other end of the capacitor C is coupled to the inverting input terminal (−) of the operational amplifier S/H-OP-AMP. The other end of the switch S/H-SW3 is coupled to an output terminal of the operational amplifier S/H-OP-AMP. A voltage (VDD/2) which is the half of the power supply voltage (VDD) is inputted into the noninverting input terminal (+) of the operational amplifier S/H-OP-AMP. The input signal (TEST-IN) is not restricted to the triangular wave. Alternatively, it may be a sine wave.

The switch S/H-SW is coupled to the output terminal of the operational amplifier S/H-OP-AMP. When the switch S/H-SW is set to ON, the output signal of the sample hold circuit S/HC is outputted as the output signal of the buffer unit 4D. The switch BUF-SW is coupled to an output terminal of the operational amplifier OP-AMP. When the switch BUF-SW is set to ON, an output signal of the input buffer circuit BUF is outputted as the output signal of the buffer unit 4D.

At the time of the A/D conversion test operation, an A/D conversion correction mode (CM) is set to the mode register 5A. A mode signal (Mode) is inputted to the control circuit 43D, to set the switch BUF-SW to OFF and to set the switch S/H-SW to ON. As illustrated in FIG. 13B, the control clock of the switch S/H-SW1 is the first clock (CLK1), the control clock of the switch S/H-SW2 is the second clock (CLK2), and the control clock of the switch S/H-SW3 is the third clock (CLK3). When the first clock (CLK1) is a high level, the switch S/H-SW1 is set to ON, and when the first clock (CLK1) is a low level, the switch S/H-SW1 is set to OFF. When the second clock (CLK2) is a high level, the switch S/H-SW2 is set to ON, and when the second clock (CLK2) is a low level, the switch S/H-SW2 is set to OFF. When the third clock (CLK3) is a high level, the switch S/H-SW3 is set to ON, and when the third clock (CLK3) is a low level, the switch S/H-SW3 is set to OFF. The first clock (CLK1) and the second clock (CLK2) have a cycle of two conversion cycles (2/fs) and a small duty; accordingly the ON period of the switch S/H-SW1 and the switch S/H-SW2 is short. The third clock (CLK3) has a cycle of two conversion cycles (2/fs) and a large duty; accordingly the ON period of the switch S/H-SW3 is long. Basically the first clock (CLK1) (the second clock (CLK2)) and the third clock (CLK3) are in a complementary relation, however, a dead time is provided in order to set to OFF the switch S/H-SW1 (the switch S/H-SW2) and the switch S/H-SW3 concurrently.

When the first clock (CLK1) (the second clock (CLK2)) is a high level and the third clock (CLK3) is a low level, a test input signal (TEST-IN) is sampled into the capacitor C. When the first clock (CLK1) (the second clock (CLK2)) is a low level and the third clock (CLK3) is a high level, the test input signal (TEST-IN) held in the capacitor C is outputted as the output signal (TEST-OUT). The sampling period (S) indicated in the timing chart of FIG. 13B by means of an arrow is set when the second clock (CLK2) is a high level. This is because the output signal (TEST-OUT) is held in the other period except for the sampling period. Therefore, the explanation in FIG. 12 has described that the output signal (TEST-OUT) is the same as the output signal (DAC-OUT). However, strictly speaking, they are different, and the value of the output signal (DAC-OUT) is not constant in the second A/D conversion period (A/D2).

At the time of the A/D conversion normal operation, an A/D conversion correction mode (CM) is set to the mode register 5A. A mode signal (Mode) is inputted to the control circuit 43D, to set the switch BUF-SW to ON and to set the switch S/H-SW to OFF. The input signal (ADC-IN) is inputted to the input buffer circuit BUF and the output signal (BUF-OUT) is outputted.

In summary, the semiconductor integrated circuit device 10D according to Implementation Example 4 is configured with the A/D conversion unit 2A, the digital correction unit 3A, and the buffer unit 4D. At the first A/D conversion period (A/D1) in the A/D conversion test operation, the A/D conversion unit 2A outputs the first A/D conversion result (D1R) as a digital signal, by A/D converting the dither signal (Dither1) and the output signal (TEST-OUT). At the subsequent second A/D conversion period (A/D2), the A/D conversion unit 2A outputs the second A/D conversion result (D2R) as a digital signal, by A/D converting the output signal (TEST-OUT). The correction coefficient (CC) for the A/D conversion is determined on the basis of the digital output (DC1R) obtained by digital correction performed to the first A/D conversion result (D1R) and the digital output (DC2R) obtained by digital correction performed to the second A/D conversion result (D2R). The output signal (TEST-OUT) is held by the buffer unit 4D during the first A/D conversion period (A/D1) and the second A/D conversion period (A/D1) in the A/D conversion test operation.

In this way, the buffer unit holds the output signal (TEST-OUT) during the first A/D conversion period (A/D1) and the second A/D conversion period (A/D2) in the A/D conversion test operation. Therefore, the charge sharing type A/D conversion unit can be employed for the A/D conversion unit, and since there is little access frequency to a reference voltage, it is possible to simplify the generation of the reference voltage as an advantage. Furthermore, it is possible to reduce the power consumption of the regulator which generates the reference voltage, and it is also possible to accomplish the design of the regulator with relative ease. Only one A/D conversion unit 2A as an analog circuit is required; accordingly, it is possible to suppress the increase of the area.

The buffer unit 4D has both a generation function of the output signal (TEST-OUT) as the test signal for calculating the correction coefficient (CC), and a generation function of the output signal (BUF-OUT) corresponding to the input signal (ADC-IN). Therefore, it is not necessary to provide separately a circuit for generating the output signal (TEST-OUT) as the test signal for calculating the correction coefficient (CC), and a circuit for generating the output signal (BUF-OUT) in response to the input signal (ADC-IN); therefore, it is possible to reduce the area.

Owing to the dither signal (Dither), in the A/D conversion correction mode (CM), the correction coefficient (CC) for the digital correction of the first A/D conversion result (D1R) and the correction coefficient (CC) for the digital correction of the second A/D conversion result (D2R) are different in their higher-order bits. Therefore, it is possible to search the correction coefficient (CC), speedily and surely.

Modified Example 2

Figure 14:
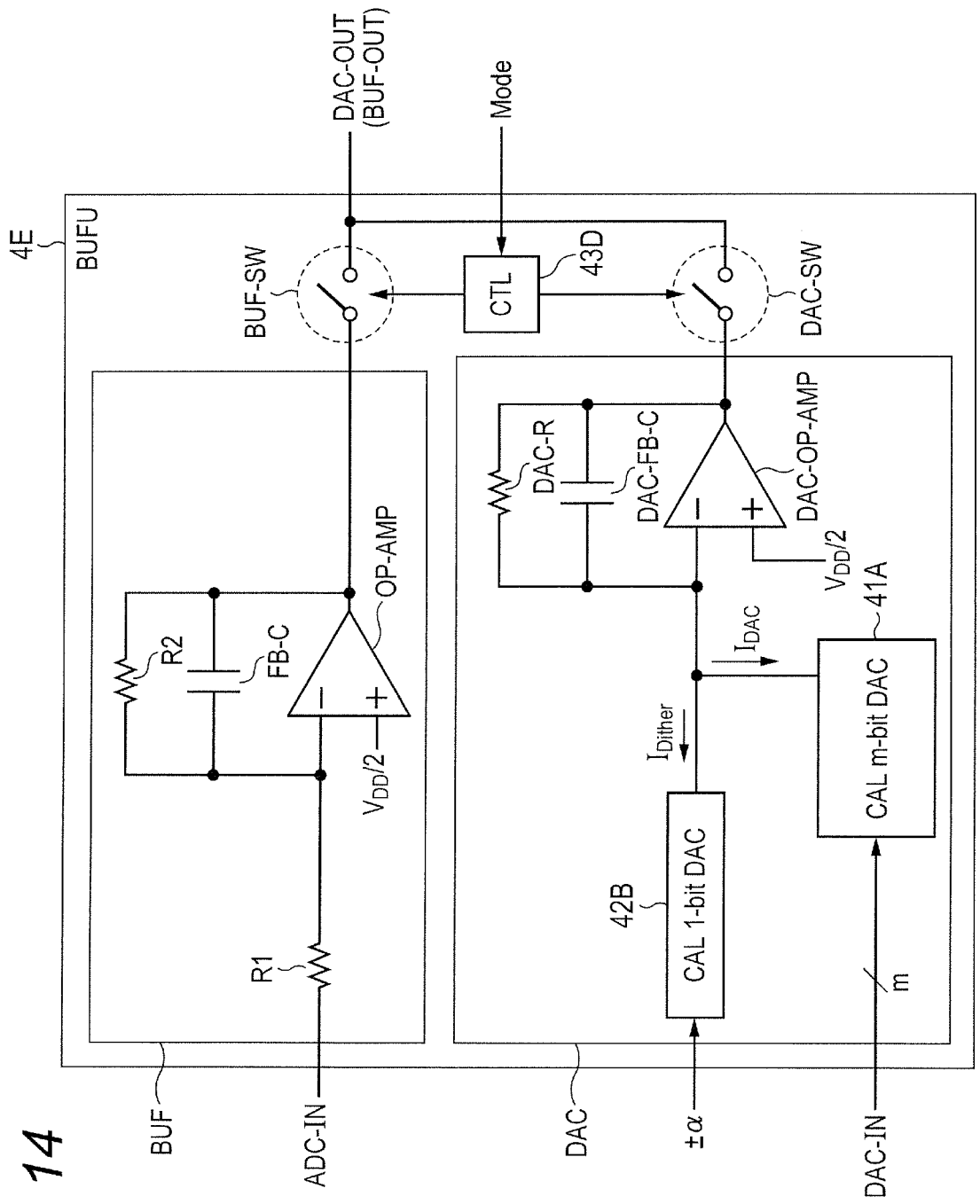
FIG. 14 is a drawing illustrating a configuration of a buffer unit according to Modified Example 2 of Implementation Example 2.

FIG. 14 illustrates a configuration of a buffer unit according to Modified Example 2 of Implementation Example 2.

A buffer unit 4E according to Modified Example 2 is configured with an input buffer circuit BUF, a D/A converter DAC, a switch BUF-SW, and a switch DAC-SW. The input buffer circuit BUF and the switch BUF-SW are the same as those of the buffer unit 4D (FIG. 13A) according to Implementation Example 4. When the switch DAC-SW is set to ON, the output signal of the D/A converter DAC is outputted as an output signal of the buffer unit 4E.

The D/A converter DAC is configured with a resistor DAC-R, a capacitor DAC-FB-C, an operational amplifier DAC-OP-AMP, a D/A conversion circuit 41A, and a D/A conversion circuit 42B. The D/A conversion circuit 41A is the same as that of the buffer unit 4A (FIG. 5) according to Implementation Example 1, and the D/A conversion circuit 42B is the same as that of the buffer unit 4B (FIG. 8) according to Implementation Example 2. The resistor DAC-R corresponds to the resistor R2 of FIG. 5, the capacitor DAC-FB-C corresponds to the capacitor FB-C of FIG. 5, and the operational amplifier DAC-OP-AMP corresponds to the operational amplifier OP-AMP.

At the time of the A/D conversion test operation, an A/D conversion correction mode (CM) is set to the mode register 5A. A mode signal (Mode) is inputted to the control circuit (CNT) 43D, to set the switch BUF-SW to OFF and to set the switch DAC-SW to ON. At the time of the A/D conversion test operation, the buffer unit 4E performs the same operation as the buffer unit 4B according to Implementation Example 2. However, naturally there is no operation of the switch ADC-SW.

At the time of an A/D conversion normal operation, an A/D conversion normal operation mode (RM) is set to the mode register 5A. A mode signal (Mode) is inputted to the control circuit 43D, to set the switch BUF-SW to ON and to set the switch DAC-SW to OFF. The operation of the input buffer circuit BUF is the same as that of the buffer unit 4D (FIG. 13A) according to Implementation Example 4.

This buffer unit 4E can be applied as a substitute of the buffer unit according to Implementation Example 2. The buffer unit 4E can be also applied as a substitute of the buffer unit according to Implementation Example 3. The buffer unit 4E may be applied to the buffer unit 4A according to Implementation Example 1 after removing the D/A conversion circuit 42B from the buffer unit 4E.

Implementation Example 5

Figure 15:
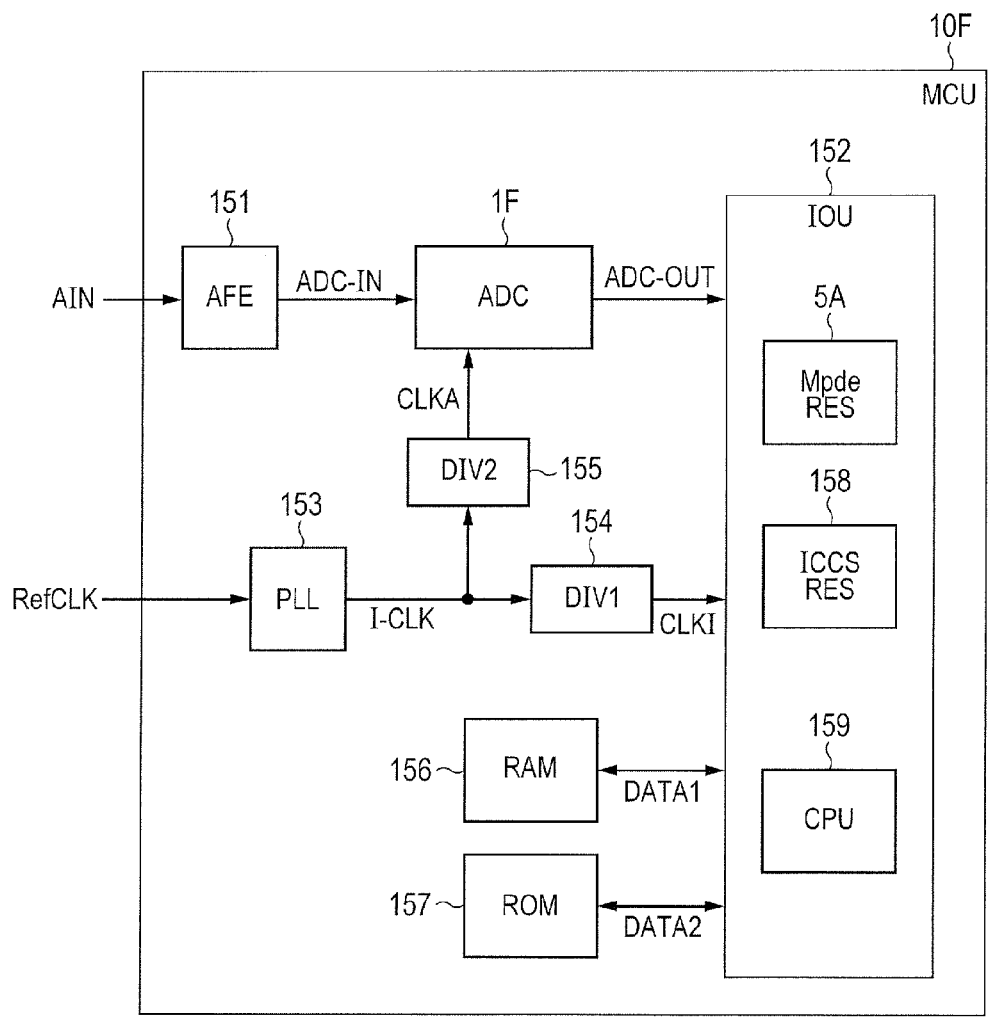
FIG. 15 is a drawing illustrating a configuration of a microcomputer according to Implementation Example 5.

FIG. 15 illustrates a configuration of a microcomputer according to Implementation Example 5.

A microcomputer (MCU) 10F is a semiconductor integrated circuit device formed overlying a single semiconductor substrate. The microcomputer 10F is configured with an analog front-end unit (AFE) 151, an A/D converter (ADC) 1F, and an internal operation unit (IOU) 152. The microcomputer 10F is further configured with a phase-locked loop (PLL) 153, a first divider (DIV1) 154, a second divider (DIV1) 155, a random access memory (RAM) 156, and a nonvolatile memory (ROM) 157. The internal operation unit 152 is configured with a mode register (ModeRES) 5A, an initial value setting register (ICCSRES) 158, and a central processing unit (CPU) 159.

The analog front-end unit 151 receives an analog signal (AIN) from the exterior, performs a signal processing such as selecting one analog signal input from plural analog input signals for example, and outputs the generated input signal (ADC-IN) to the A/D converter 1F. The A/D converter 1F may be any one of the A/D converter 1A according to Implementation Example 1 and its modified example, the A/D converter 1B according to Implementation Example 2 and its modified example, the A/D converter 1C according to Implementation Example 3 and its modified example, and the A/D converter 1D according to Implementation Example 4 and its modified example. The A/D converter 1F performs A/D converting to an input signal (ADC-IN), and outputs an output signal (ADC-OUT) to the internal operation unit 152. Receiving a clock signal (Ref CLK) from the exterior, the phase-locked loop 153 generates a clock signal (I-CLK) on the basis of the clock signal (RefCLK). The divider 154 divides the clock signal (I-CLK), and generates and outputs a clock signal (CLKI) for operation of the internal operation unit 152. The divider 155 divides the clock signal (I-CLK), and generates and outputs a clock signal (CLKA) for the operation of the A/D converter 1F. The internal operation unit 152 controls the whole of the microcomputer 10F and also processes an output signal (ADC-OUT). The central processing unit 159 controls the whole of the internal operation unit 152, and performs write and read of various data (DATA1, DATA2) to and from the random access memory 156 and the nonvolatile memory 157. The random access memory 156 configured with an SRAM, etc. is employed as a work space of the central processing unit 159, and is employed as a temporary storing area of various data. The nonvolatile memory 157 configured with a flash memory, etc. stores the program and various data which the central processing unit 159 uses. The central processing unit 159 sets up the various modes to the mode register 5A, and sets up various kinds of initial values necessary for control of the microcomputer 10F to the initial value setting register 158. The various kinds of initial values includes the correction coefficient (CC) which is first set up to the correction coefficient register (CCRES) 3311A in order to perform the A/D conversion test operation.

In summary, the microcomputer 10F according to Implementation Example 5 employs the A/D converter according to Implementation Example 1 to Implementation Example 4 and their modified examples. Therefore, the operation effects of Implementation Example 1 to Implementation Examples 4 and their modified examples are produced.

Implementation Example 6

Figure 16A:
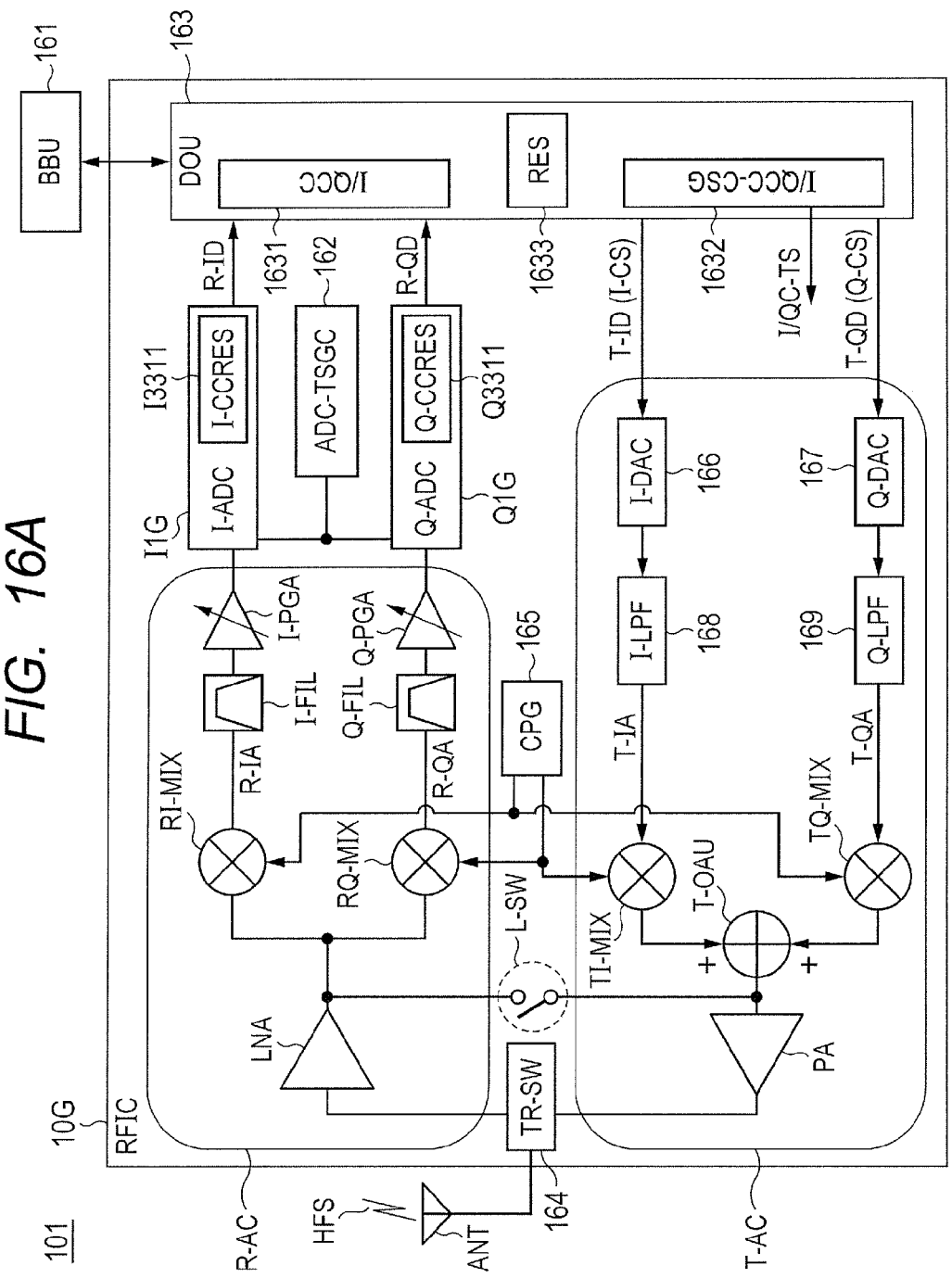
FIG. 16A is a drawing illustrating a configuration of a semiconductor integrated circuit device and a communication system including the semiconductor integrated circuit device according to Implementation Example 6.
Figure 16B:
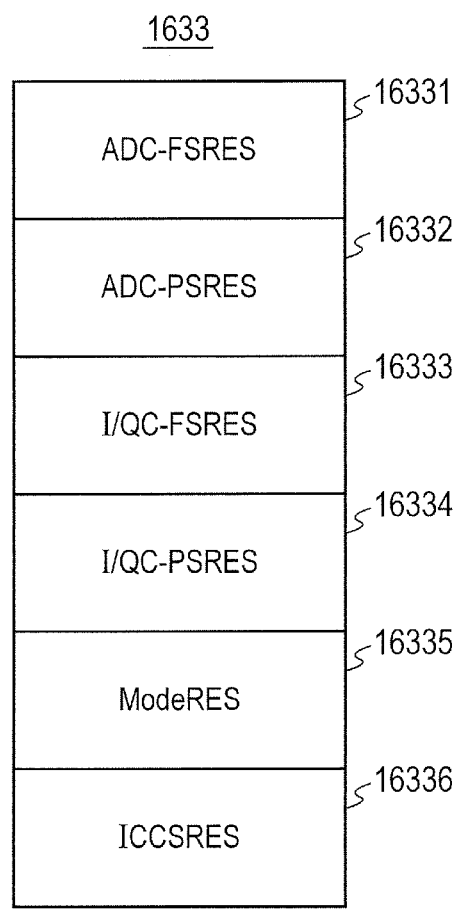
FIG. 16B is a drawing illustrating a register provided in a digital operation unit according to Implementation Example 6.

FIG. 16A illustrates a configuration of a semiconductor integrated circuit device and a communication system including the semiconductor integrated circuit device according to Implementation Example 6. FIG. 16B illustrates a register provided in a digital operation unit.

(1) Communication System

The communication system 101 is configured with an antenna ANT, a semiconductor integrated circuit device (RFIC) 10G for wireless communications, and a baseband processing unit (BBU) 161. The antenna ANT receives a high frequency signal (HFS) as a communication signal from the exterior. The semiconductor integrated circuit device (RFIC) 10G for wireless communications down-converts and demodulates the high frequency signal HFS to a baseband signal. The baseband processing unit 161 receives the baseband signal and performs the communication signal analysis and the data processing by digital processing. The semiconductor integrated circuit device 10G supports the GSM (Global System Mobile Communication), the WCDMA (Wide Band CDMA), and the LTE (Long Term Evolution).

(2) Semiconductor Integrated Circuit Device

The semiconductor integrated circuit device 10G is configured with an analog circuit R-AC, an A/D converter (I-ADC) I1G, an A/D converter (Q-ADC) Q1G, a test signal generating unit (ADC-TSGC) 162, a digital operation unit (DOU) 163, and an analog circuit T-AC. The analog circuit R-AC receives a high frequency signal (HFS) via the antenna ANT, and generates an analog I signal (R-IA) and an analog Q signal (R-QA) which is shifted 90 degrees in phase from the analog I signal (R-IA). Although it is said that the analog I signal (R-IA) and the analog Q signal (R-QA) are orthogonal, from a practical point of view, they are not necessarily shifted 90 degrees strictly due to variations, such as a process variation. The A/D converter I1G receives the analog I signal (R-IA) corresponding to the input signal (ADC-IN), and performs A/D converting to generate a digital I signal (R-ID) corresponding to the output signal (ADC-OUT). The A/D converter Q1G receives the analog Q signal (R-QA) corresponding to the input signal (ADC-IN), and performs A/D converting to generate a digital Q signal (R-QD) corresponding to the output signal (ADC-OUT). The digital operation unit 163 receives the digital I signal (R-ID) and the digital Q signal (R-QD), and performs digital processing to generate a baseband signal and to output it to the baseband processing unit 161. The analog circuit T-AC receives, from the digital operation unit 163, the digital I signal (T-ID) and the digital Q signal (T-QD) based on a baseband signal from the baseband processing unit 161, and performs modulation to generate a high frequency signal (HFS) for output.

The test signal generating unit (ADC-TSGC) 162 can be applied also to the semiconductor integrated circuit devices 10A, 10B, 10C, 10D, and 10E according to Implementation Example 1 to Implementation Example 5.

The analog I signal is an I signal in an analog form, and the analog Q signal is a Q signal in an analog form. The digital I signal is an I signal in a digital form, and the digital Q signal is a Q signal in a digital form. The I signal is an in-phase signal, and the Q signal is a quadrature-phase signal.

Here, the analog circuit R-AC, the A/D converter I1G, the A/D converter Q1G, the digital operation unit 163, and the analog circuit T-AC excluding the power amplifier PA (to be explained later) are formed overlying a first semiconductor substrate. The power amplifier PA is formed overlying a second semiconductor substrate. The first and the second semiconductor substrate are sealed in one package as the semiconductor integrated circuit device 10G. It is also preferable to eliminate the second semiconductor substrate and to provide the power amplifier PA separately from the semiconductor integrated circuit device 10G. The baseband processing unit 161 is another semiconductor integrated circuit device from the semiconductor integrated circuit device 10G, and the antenna ANT is also another circuit device from the semiconductor integrated circuit device 10G.

(A) A Reception Analog Circuit

The analog circuit R-AC is configured with a transmitting/receiving change-over switch (TR-SW) 164, a low-noise amplifier LNA, a mixer RI-MIX, a mixer RQ-MIX, a filter I-FIL, and a filter Q-FIL. The analog circuit R-AC is further configured with a programmable gain amplifier I-PGA, a programmable gain amplifier Q-PGA, a clock pulse generator (CPG) 165, and a loop switch L-SW. The transmitting/receiving change-over switch 164 is for inputting the necessary signal component of the high frequency signal (HFS) via the antenna ANT into the interior of the analog circuit R-AC. The transmitting/receiving change-over switch 164 is also for cutting the unnecessary signal component from the analog circuit T-AC, so as not to be inputted to the analog circuit R-AC. The low-noise amplifier LNA amplifies the high frequency signal (HFS) supplied by the transmitting/receiving change-over switch 164, with a low noise and at the amplification factor specified by the baseband processing unit 161. The mixer RI-MIX performs down-converting to the high frequency signal (HFS) from the low-noise amplifier LNA to generate an analog I signal (R-IA), by mixing the high frequency signal (HFS) with a first mixer signal which is a high frequency signal with a predetermined frequency, thereby performing frequency conversion to a low frequency. The mixer RQ-MIX performs down-converting to the high frequency signal (HFS) from the low-noise amplifier LNA to generate an analog Q signal (R-QA), by mixing the high frequency signal (HFS) with a second mixer signal which is a high frequency signal with a predetermined frequency and a 90-degree phase difference from the first mixer signal, thereby performing frequency conversion to a low frequency. The filter I-FIL receives the analog I signal (R-IA) from the mixer RI-MIX, and outputs an analog I signal (R-IA) by passing the frequency of the band specified by the baseband processing unit 161. The filter Q-FIL receives the analog Q signal (R-QA) from the mixer RQ-MIX, and outputs an analog Q signal (R-QA) by passing the frequency of the band specified by the baseband processing unit 161. The programmable gain amplifier I-PGA receives the analog I signal (R-IA) from the filter I-FIL, and outputs an analog I signal (R-IA) amplified at the amplification factor specified by the baseband processing unit 161. The programmable gain amplifier Q-PGA receives the analog Q signal (R-QA) from the filter Q-FIL, and outputs an analog Q signal (R-QA) amplified at the amplification factor specified by the baseband processing unit 161. The clock pulse generator 165 generates the first mixer signal and the second mixer signal.

(B) An A/D Converter for an I Signal, and an A/D Converter for a Q Signal (a) Configuration The A/D converter I1G may be any one of the A/D converter 1A according to Implementation Example 1 and its modified example, the A/D converter 1B according to Implementation Example 2 and its modified example, the A/D converter 1C according to Implementation Example 3 and its modified example, and the A/D converter 1D according to Implementation Example 4 and its modified example. The A/D converter Q1G may be any one of the A/D converter 1A according to Implementation Example 1 and its modified example, the A/D converter 1B according to Implementation Example 2 and its modified example, the A/D converter 1C according to Implementation Example 3 and its modified example, and the A/D converter 1D according to Implementation Example 4 and its modified example. However, it is preferable that the A/D converter Q1G has the same type as the A/D converter I1G. The correction coefficient register (I-CCRES) I3311 is a correction coefficient register of the A/D converter I1G, and the correction coefficient register (Q-CCRES) Q3311 is a correction coefficient register of the A/D converter Q1G.

(b) A/D Conversion Test Operation

At first, in order to perform the A/D conversion test operation, a correction coefficient (I-CC) and a correction coefficient (Q-CC) are set to the correction coefficient register (I-CCRES) I3311 and the correction coefficient register (Q-CCRES) Q3311 from the initial value setting register (ICCSRES) to be explained later. The correction coefficient (I-CC) is a correction coefficient (CC, GC) for the A/D converter I1G, and the correction coefficient (Q-CC) is a correction coefficient (CC, GC) for the A/D converter Q1G. A test signal adjusted to the type of the A/D converter I1G or the A/D converter Q1G (an m-bit input signal (DAC-IN) (m is a natural number) and a 1-bit dither signal (Dither)) is inputted from the test signal generating circuit 162. Here, the value of the dither signal (Dither) is ±α. The operation at the time of the A/D conversion test operation which is adjusted to the type of the A/D converter I1G or the A/D converter Q1G as described above is executed. As a result, the correction coefficient of the correction coefficient register (I-CCRES) I3311 or the correction coefficient register (Q-CCRES) Q3311 is updated. In the present case, the test signal inputted from the test signal generating circuit 162 may be common or may be different. However, the test signal is not necessary to be different in particular, therefore, the common test signal is easier to treat.

(c) A/D Conversion Normal Operation

With the use of the correction coefficient (I-CC) calculated at the time of the A/D conversion test operation, the A/D converter I1G inputs an analog I signal (R-IA) as the input signal (ADC-IN) and performs A/D converting to output a digital I signal (R-ID) as the output signal (ADC-OUT). The test signal generating circuit 162 does not operate.

With the use of the correction coefficient (Q-CC) calculated at the time of the A/D conversion test operation, the A/D converter Q1G inputs an analog Q signal (R-QA) as the input signal (ADC-IN) and performs A/D converting to output a digital Q signal (R-QD) as the output signal (ADC-OUT).

(C) A Digital Operation Unit

The digital operation unit 163 is configured with an I/Q imbalance correction circuit (I/QCC) 1631, a calibration signal generating circuit (I/QCC-CSG) 1632, and a register (RES) 1633. As illustrated in FIG. 16B, the register (RES) 1633 is configured with a frequency setting register (ADC-FSRES) 16331, a period setting register (ADC-PSRES) 16332, a frequency setting register (I/QC-FSRES) 16333, a period setting register (I/QC-PSRES) 16334, a mode setting register (ModeRES) 16335, and an initial value setting register (ICCSRES) 16336. The I/Q imbalance correction circuit (I/QCC) 1631 detects and corrects a mismatch in gain, phase, and direct current offset, arising in the path from the mixer RI-MIX to the programmable gain amplifier I-PGA in the analog circuit R-AC. The I/Q imbalance correction circuit (I/QCU) 1631 also detects and corrects a mismatch in gain, phase, and direct current offset, arising in the path from the mixer RQ-MIX to the programmable gain amplifier Q-PGA. The calibration signal generating circuit (I/QCC-CSG) 1632 generates a test signal (I/QC-TS) for calculating the correction coefficient for the I/Q imbalance correction circuit (I/QCC) 1631. The baseband processing unit (BBU) 161 sets up various kinds of initial values necessary for the control of the semiconductor integrated circuit device (RFIC) 10G, to the initial value setting register (ICCSRES) 16336. The various kinds of the initial values include the correction coefficient (I-CC) to be first set to the correction coefficient register (I-CCRES) I3311 and the correction coefficient (Q-CC) to be first set to the correction coefficient register (Q-CCRES) Q3311, in order to perform the A/D conversion test operation. The details of I/Q imbalance correction will be described later.

(D) A Transmission Analog Circuit

The analog circuit T-AC is configured with a D/A converter (I-DAC) 166, a D/A converter (Q-DAC) 167, a low pass filter (I-LPF) 168, and a low pass filter (Q-LPF) 169. The analog circuit T-AC is further configured with a mixer TI-MIX, a mixer TQ-MIX, an output adding unit T-OAU, and a power amplifier PA. The D/A converter (I-DAC) 166 receives a digital I signal (T-ID) which is based on a baseband signal from the baseband processing unit 161 and outputted from the digital operation unit 163, and performs D/A converting to generate an analog I signal (T-IA). The D/A converter (Q-DAC) 167 receives a digital Q signal (T-QD) which is based on a baseband signal from the baseband processing unit 163 and outputted from the digital operation unit 163, and performs D/A converting to generate an analog Q signal (T-QA). The low pass filter I-LPF receives the analog I signal (T-IA) supplied by the D/A converter (I-DAC) 166, and passes a signal of a lower frequency region than the frequency specified by the baseband processing unit 161 and outputs the signal. The low pass filter Q-LPF receives the analog Q signal (T-QA) supplied by the D/A converter (Q-DAC) 167, and passes a signal of a lower frequency region than the frequency specified by the baseband processing unit 161 and outputs the signal. The mixer TI-MIX performs up-converting to the analog I signal (T-IA) from the low pass filter I-LPF, by mixing a third mixer signal which is a high frequency signal with a predetermined frequency, and outputs a high frequency signal after the frequency conversion. The mixer TQ-MIX performs up-converting to the analog Q signal (T-QA) from the low pass filter Q-LPF, by mixing a fourth mixer signal which is a high frequency signal with a predetermined frequency and has a 90-degree phase difference from the third mixer signal, and outputs a high frequency signal after the frequency conversion. The output adding unit T-OAU adds the output from the mixer TI-MIX and the output from the mixer TQ-MIX, to generate a transmission high frequency signal for communication. The power amplifier PA amplifies the output from the output adding unit T-OAU.

The clock pulse generator 165, the loop switch L-SW, and the transmitting/receiving change-over switch 164 are shared with the analog circuit R-AC. As for the output from the power amplifier PA, a predetermined frequency area is cut so that noise may not be inputted into the analog circuit R-AC through the transmitting/receiving change-over switch 164. As for the high frequency signal (HFS) via the antenna ANT as well, the predetermined frequency area is cut so that noise may not be inputted into the power amplifier through the transmitting/receiving change-over switch 164. Among the output from the power amplifier PA, the signal component of the transmission high frequency signal which has passed the transmitting/receiving change-over switch 164 is transmitted externally via the antenna ANT.

(3) I/Q Imbalance Correction (a) The I/Q Imbalance Correction Test Operation as a Semiconductor Integrated Circuit Device When the correction coefficient (I-I/QCC) and the correction coefficient (Q-I/QCC) are calculated, the following operation is performed. In Implementation Example 6, the operation at this time is called an I/Q imbalance correction test operation. In the whole present specification, the operation to calculate an I/Q imbalance correction coefficient on the basis of the output from the calibration signal generating circuit (I/QCC-CSG) 1632 is regarded as the I/Q imbalance correction test operation.

In order to perform the I/Q imbalance correction test operation, the correction coefficient (I-I/QCC) and the correction coefficient (Q-I/QCC) are retrieved at first from the initial value setting register (ICCSRES) to the correction coefficient register (I-I/QCCRES) 181 and the correction coefficient register (Q-I/QCCRES) 183. The loop switch L-SW is set to ON. A calibration signal (I-CS) is outputted from the calibration signal generating circuit (I/QCC-CSG) 1632 to the D/A converter (I-DAC) 166. A calibration signal (Q-CS) is also outputted from the calibration signal generating circuit (I/QCC-CSG) 1632 to the D/A converter (Q-DAC) 167. The A/D conversion normal operation is performed. As a result, the following operation is performed.

The calibration signal (I-CS) and the calibration signal (Q-CS) are outputted to the analog circuit T-AC. The calibration signal (I-CS) and the calibration signal (Q-CS) undergo various kinds of conversion processing by the analog circuit T-AC. Then, the result of the various kinds of conversion processing is inputted from the output adding unit T-OAU to the analog circuit R-AC via the loop switch L-SW. This result is inputted into the mixer RI-MIX and the mixer RQ-MIX of the analog circuit R-AC, and undergoes various kinds of conversion processing. As the result of these various kinds of conversion processing, an analog I signal (R-IA) is outputted to the A/D converter I1G and an analog Q signal (R-QA) is outputted to the A/D converter Q1G. The A/D converter I1G and the A/D converter Q1G perform the A/D conversion normal operation, and output a digital I signal (R-ID) and a digital Q signal (R-QD) to the I/Q imbalance correction circuit 1631. The I/Q imbalance correction circuit 1631 performs the correction process of the digital I signal (R-ID) and the digital Q signal (R-QD), and calculates a correction coefficient (I-I/QCC) and a correction coefficient (I-I/QCC) on the basis of the present correction result. The detailed configuration and operation of the I/Q imbalance correction circuit 1631 are described later.

(b) The I/Q Imbalance Correction Normal Operation as a Semiconductor Integrated Circuit Device When detecting and correcting the mismatch of gain, phase, and direct current offset as described above, with the use of the correction coefficient (I-I/QCC) and correction coefficient (Q-I/QCC) which have been calculated in the I/Q imbalance correction test operation, the following operation is performed. In Implementation Example 6, the operation at this time is called an I/Q imbalance correction normal operation. In the whole present specification, the operation to generate a correction digital signal, by performing digital correcting to the received digital signal from the A/D converter with the use of the I/Q imbalance correction coefficient which has been calculated in the test operation for I/Q imbalance correction, is regarded as the I/Q imbalance correction normal operation.

The loop switch L-SW is set to OFF. The calibration signal generating circuit 1632 is set to a disable state. The A/D conversion normal operation is performed. As a result, the following operation is performed.

Upon receiving the high frequency signal (HFS) via the antenna ANT, the analog circuit R-AC generates the analog I signal (R-IA) and the analog Q signal (R-QA). The A/D converter I1G receives the analog I signal (R-IA) and performs A/D converting to generate the digital I signal (R-ID). The A/D converter Q1G receives the analog Q signal (R-QA) and performs A/D converting to generate the digital Q signal (R-QD). The I/Q imbalance correction circuit 1631 receives the digital I signal (R-ID) and the digital Q signal (R-QD), detects the mismatch of gain, phase, and direct current offset, and performs digital correcting. The mismatch is detected with the use of the correction coefficient (I-I/QCC) and the correction coefficient (Q-I/QCC), which have been calculated in the I/Q imbalance correction test operation. As a result, the I/Q imbalance correction circuit 1631 generates a correction digital I signal (CID) and a correction digital Q signal (CQD). The digital operation unit 163 performs necessary digital processing to the correction digital I signal (CID) and the correction digital Q signal (CQD), generates a baseband signal, and transmits it to the baseband processing unit 161. If any digital processing is not necessary, no digital processing is performed. In that case, the correction digital I signal (CID) and the correction digital Q signal (CQD) become a demodulated baseband signal.

(4) The I/Q Imbalance Correction Circuit

Figure 18:
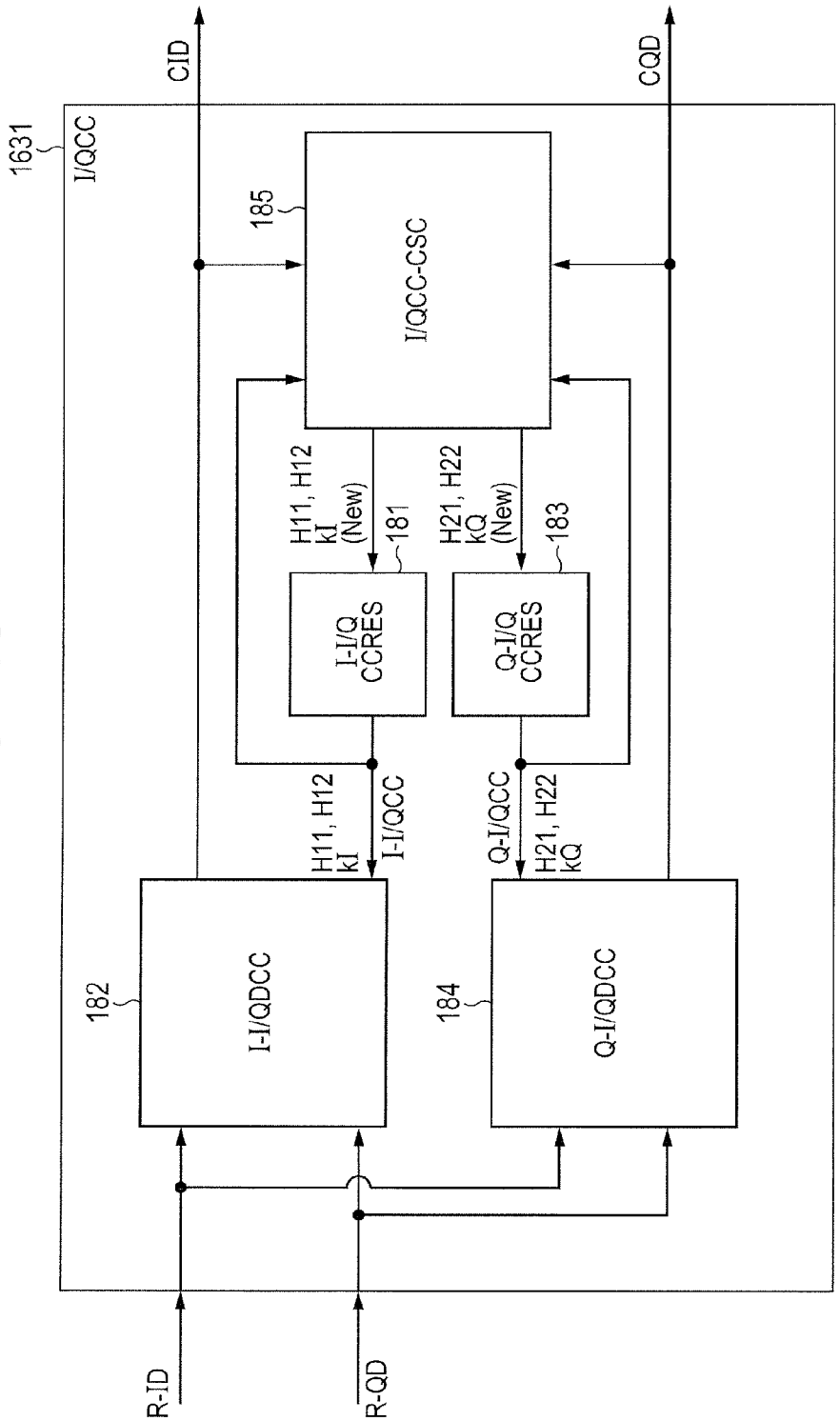
FIG. 18 is a drawing illustrating an I/Q imbalance correction circuit in the semiconductor integrated circuit device according to Implementation Example 6.

FIG. 18 illustrates an I/Q imbalance correction circuit in the semiconductor integrated circuit device according to Implementation Example 6.

(a) Configuration

As illustrated in FIG. 18, the I/Q imbalance correction circuit (I/QCC) 1631 is configured with a correction coefficient register (I-I/QCCRES) 181, a digital correction circuit (I-I/QDCC) 182, a correction coefficient register (Q-I/QC-CRES) 183, a digital correction circuit (I-I/QDCC) 184, and a correction coefficient search circuit (I/QCC-CSC) 185. The digital correction circuit 182 performs digital correcting to the digital I signal (R-ID) and the digital Q signal (R-QD) according to the correction coefficient (I-I/QCC), and outputs the correction digital I signal (CID). The correction coefficient (I-I/QCC) is the one that is stored in the correction coefficient register 181. The digital I signal (R-ID) is supplied by the A/D converter I1G. The digital Q signal (R-QD) is supplied by the A/D converter G1G. The digital correction circuit 184 performs digital correcting to the digital I signal (R-ID) and the digital Q signal (R-QD) according to the correction coefficient (Q-I/QCC), and outputs the correction digital Q signal (CQD). The correction coefficient (Q-I/QCC) is the one that is stored in the correction coefficient register 183. The correction coefficient search circuit 185 searches for the correction coefficient (I-I/QCC) and the correction coefficient (Q-I/QCC) by the predetermined algorithm, such as the LMS algorithm, according to the correction digital I signal (CID) and the correction digital Q signal (CQD).

By digital correcting by the digital correction circuit 182, the detection and correction of the mismatch of the gain, phase, or direct current offset of the digital I signal (R-ID) to the digital Q signal (R-QD) are executed. Here, the mismatch of gain, phase, or direct current offset originates in the path from the mixer RI-MIX to the programmable gain amplifier I-PGA and the path from the mixer RQ-MIX to the programmable gain amplifier Q-PGA, in the analog circuit R-AC. By digital correcting by the digital correction circuit 184, the detection and correction of the mismatch of the gain, phase, or direct current offset of the digital Q signal (R-QD) to the digital I signal (R-ID) are executed. Here, the mismatch of gain, phase, or direct current offset originates in the path from the mixer RI-MIX to the programmable gain amplifier I-PGA and the path from the mixer RQ-MIX to the programmable gain amplifier Q-PGA, in the analog circuit R-AC.

(b) Digital Correcting

The digital correction circuit 182 performs digital correcting to the digital I signal (R-ID) and the digital Q signal (R-QD) according to the correction coefficient (I-I/QCC), and outputs the correction digital I signal (CID).

The digital correction circuit 184 performs digital correcting to the digital I signal (R-ID) and the digital Q signal (R-QD) according to the correction coefficient (Q-I/QCC), and outputs the correction digital Q signal (CQD).

Here, the digital I signal (R-ID), the digital Q signal (R-QD), the correction digital I signal (CID), and the correction digital Q signal (CQD) have a relation given by the following expression (3). In the expression (3), the digital I signal (R-ID) is expressed as R-ID and the digital Q signal (R-QD) as R-QD.

[Mathematical 3]

$$\begin{pmatrix} CID \\ CQD \end{pmatrix} = \begin{pmatrix} H_{11} & H_{12} \\ H_{21} & H_{22} \end{pmatrix} \begin{pmatrix} R - ID \\ R - QD \end{pmatrix} - \begin{pmatrix} kI \\ kQ \end{pmatrix} \quad (3)$$

Here, H11 and H22 are coefficients for correcting the amplitude mismatch between the digital I signal (R-ID) and the digital Q signal (R-QD) and have values close to 1. H12 and H21 are coefficients for correcting the phase mismatch between the digital I signal (R-ID) and the digital Q signal (R-QD) and have values close to 0. kI and kQ are coefficients for removing the direct current offset of the digital I signal (R-ID) and the digital Q signal (R-QD), respectively.

(c) I/Q Imbalance Correction Test Operation

At the time of the I/Q imbalance correction test operation, the following operation is performed. At the time of the I/Q imbalance correction test operation, the A/D conversion normal operation is performed.

The digital correction circuit 182 performs digital correcting to the digital I signal (R-ID) supplied by the A/D converter I1G, and to the digital Q signal (R-QD) supplied by the A/D converter Q1G. Here, the digital correcting is performed according to the correction coefficient (I-I/QCC) (also described as H11, H12, and kI in FIG. 18) stored in the correction coefficient register 181. Then, the digital correction circuit 182 outputs a correction digital I signal (CID) to the correction coefficient search circuit 185.

The digital correction circuit 184 performs digital correcting to the digital I signal (R-ID) supplied by the A/D converter I1G, and to the digital Q signal (R-QD) supplied by the A/D converter Q1G. Here, the digital correcting is performed according to the correction coefficient (Q-I/QCC) (also described as H21, H22, and kQ in FIG. 18) stored in the correction coefficient register 183. Then, the digital correction circuit 184 outputs a correction digital Q signal (CQD) to the correction coefficient search circuit 185.

The correction coefficient search circuit 185 searches for the correction coefficient (I-I/QCC) and the correction coefficient (Q-I/QCC) by the predetermined algorithm, such as the LMS algorithm. Here, the search is performed according to the correction digital I signal (CID) from the digital correction circuit 182, the correction digital Q signal (CQD) from the digital correction circuit 184, the correction coefficient (I-I/QCC), and the correction coefficient (Q-I/QCC). The correction coefficient (I-I/QCC) employed for the search is the one that is stored in advance in the correction coefficient register 181. The correction coefficient (Q-I/QCC) employed for the search is the one that is stored in advance in the correction coefficient register 183. The correction coefficient (I-I/QCC) searched (described as H11, H12, and kI (New) in FIG. 18) is newly stored in the correction coefficient register 181. The correction coefficient (Q-I/QCC) searched (described as H21, H22, and kQ(New) in FIG. 18) is newly stored in the correction coefficient register 183.

Next, the digital I signal (R-ID) and the digital Q signal (R-QD) are inputted to the digital correction circuit 182 and the digital correction circuit 184. Accordingly, the values of the correction coefficient register 181 and the correction coefficient register 183 are updated. Such an updating operation is repeated at the time of the I/Q imbalance correction test operation.

(d) I/Q Imbalance Correction Normal Operation

At the time of the I/Q imbalance correction normal operation, the following operation is performed. At the time of the I/Q imbalance correction normal operation, the A/D conversion normal operation is performed.

The digital correction circuit 182 performs digital correcting to the digital I signal (R-ID) supplied by the A/D converter I1G, and to the digital Q signal (R-QD) supplied by the A/D converter Q1G. Here, the digital correcting is performed according to the correction coefficient (I-I/QCC) which has been calculated at the time of the I/Q imbalance correction test operation, and stored in the correction coefficient register 181. Then, the digital correction circuit 182 outputs a correction digital I signal (CID) to the interior of the digital operation unit 163. Then, the digital operation unit 163 outputs a baseband signal to the baseband processing unit 161.

The digital correction circuit 184 performs digital correcting to the digital I signal (R-ID) supplied by the A/D converter I1G, and to the digital Q signal (R-QD) supplied by the A/D converter Q1G. Here, the digital correcting is performed according to the correction coefficient (Q-I/QCC) which has been calculated at the time of the I/Q imbalance correction test operation, and stored in the correction coefficient register 183. Then, the digital correction circuit 184 outputs a correction digital Q signal (CQD) to the interior of the digital operation unit 163. Then, the digital operation unit 163 outputs a baseband signal to the baseband processing unit 161.

(5) Operation of a Communication System

FIG. 17 illustrates an operation of the communication system including the semiconductor integrated circuit device according to Implementation Example 6. With reference to FIG. 17, the operation of the communication system according to Implementation Example 6 is explained.

(a) Operating Sequence

The operating sequence includes an initial sequence period (ISP) taking place after activation of the communication system, a no-signal period (NSP) taking place after the initial sequence period, and a reception signal processing period (RSP) taking place after the no-signal period. The repetition period which is a set of the second no-signal period (NSP (2)) and the reception signal processing period (RSP (2)) is repeated with a constant period.

The initial sequence period (ISP) is a period which performs the reset operation of the flip-flop in the communication system, the power supply boot-up process in the communication system, and the calibration process for canceling the various offsets of each element circuit in the communication system. The typical circuit which performs the calibration process is the analog circuit R-AC and the analog circuit T-AC. The circuit which performs the calibration process includes the low-noise amplifier LNA, the filter I-FIL, the filter Q-FIL, the programmable gain amplifier I-PGA, the programmable gain amplifier Q-PGA, and the clock pulse generator (CPG) 165. In addition, the circuit which performs the calibration process includes the D/A converter (I-DAC) 166, the D/A converter (Q-DAC) 167, the low pass filter (I-LPF) 168, the low pass filter (Q-LPF) 169, and the power amplifier PA.

The no-signal period (NSP) is a period during which the high frequency signal (HFS) from the exterior does not arrive.

The reception signal processing period (normal operation period) (RSP) is a period during which the high frequency signal (HFS) from the exterior is down-converted and demodulated to a baseband signal.

(b) Operation mode

The operation mode is determined when a value is set at the mode setting register (ModeRES) 16335 of the digital operation unit (DOU) 163 by the baseband processing unit (BBU) 161. The operation mode is set so as to be identical for the I signal path and the Q signal path in each of the transmission system and the receiving system.

The operation mode includes an A/D conversion correction mode (CM), an I/Q imbalance correction mode (I/Q-CM), and a reception signal processing mode (RSPM). The A/D conversion correction mode (CM) is a mode for calculating the correction coefficient (I-CC) and the correction coefficient (Q-CC) for the A/D converting. The I/Q imbalance correction mode (I/Q-CM) is a mode for calculating the correction coefficient (I-I/QCC) and the correction coefficient (Q-I/QCC) for the I/Q imbalance correction circuit 1631. The reception signal processing mode (RSPM) is a mode for down-converting the high frequency signal (HFS) from the exterior and for demodulating to a baseband signal.

There are modes other than the operation modes explained in the above, and the mode which does not fall under the category of the operation mode explained in the above is described collectively as the other mode (OM). In the other mode (OM) immediately after the activation of the communication system, the reset operation of a flip-flop in the communication system and the power supply boot-up process in the communication system are executed.

In the A/D conversion correction mode (CM), the A/D conversion test operation is executed. In the I/Q imbalance correction mode (I/Q-CM), the A/D conversion normal operation is executed and the I/Q imbalance correction test operation is executed. In the reception signal processing mode (RSPM), the A/D conversion normal operation is executed and the I/Q imbalance correction normal operation is executed.

In FIG. 17, the A/D conversion correction mode (CM) is set in the initial sequence period (ISP). The A/D conversion correction mode (CM) and the I/Q imbalance correction mode (I/Q-CM) are set in the no-signal period (NSP, NSP (2)). The reception signal processing mode (RSPM) is set in the reception signal processing period (RSP, RSP (2)).

(c) Registers

The frequency setting register (ADC-FSRES) can set whether the A/D conversion test operation takes place or not in the initial sequence period (ISP). It is also possible to set whether the A/D conversion test operation takes place every one no-signal period (NSP) or the A/D conversion test operation takes place every M no-signal periods (NSP). Here, M is a natural number of 2 or greater.

The period setting register (ADC-PSRES) can set to the initial sequence period (ISP) how long the A/D conversion test operation is performed. It is also possible to set how long the A/D conversion test operation in the no-signal period (NSP) is performed.

The frequency setting register (I/QC-FSRES) can set whether the I/Q imbalance correction test operation takes place in the initial sequence period (ISP). It is also possible to set whether the I/Q imbalance correction test operation takes place every one no-signal period (NSP) or the I/Q imbalance correction test operation takes place every N no-signal periods. Here, N is a natural number of 2 or greater.

The period setting register (I/QC-PSRES) can set how long the I/Q imbalance correction test operation is performed in the initial sequence period (ISP). It is also possible to set how long the I/Q imbalance correction test operation in the no-signal period (NSP) is performed.

When both of the A/D conversion correction mode (CM) and the I/Q imbalance correction mode (I/Q-CM) are performed in the initial sequence period (ISP), the A/D conversion correction mode (CM) is always performed first. Subsequently, the I/Q imbalance correction mode (I/Q-CM) is performed. When both of the A/D conversion correction mode (CM) and the I/Q imbalance correction mode (I/Q-CM) are performed also in the no-signal period (NSP), the A/D conversion correction mode (CM) is always performed first. Subsequently, the I/Q imbalance correction mode (I/Q-CM) is performed.

A first graph from the bottom of FIG. 17 is an example illustrating how the temperature or the supply voltage value changes with the time progress, and a second graph from the bottom is an example illustrating how the correction coefficient value for the A/D converter changes with the time progress.

(6) The summary of Implementation Example 6

(a) The semiconductor integrated circuit device (RFIC) is configured with the first A/D converter (A/D converter (I-ADC)) which performs A/D converting by performing digital correcting to the received analog I signal (R-IA) to generate the first digital signal (digital I signal (R-ID)), and the second A/D converter (A/D converter (Q-ADC)) which performs A/D converting by performing digital correcting to the received analog Q signal (R-QA) to generate the second digital signal (digital Q signal (R-QD)). The first A/D converter and the second A/D converter perform foreground correction. The execution period of the first mode of the foreground correction is the same for the first A/D converter and the second A/D converter. That is, the execution of the first mode of the foreground correction is performed in parallel in the first A/D converter and in the second A/D converter. The execution period of the second mode of the foreground correction is the same for the first A/D converter and the second A/D converter. That is, the execution of the second mode of the foreground correction is performed in parallel in the first A/D converter and in the second A/D converter. Here, the foreground correction means that calculation of the correction coefficient is performed in a manner that the first mode for calculating the correction coefficient for the digital correcting and the second mode for performing the A/D converting with the use of the calculated correction coefficient are separated in time.

The first A/D converter and the second A/D converter have the same execution period of the first mode and the same execution period of the second mode as well. Accordingly, it is possible to set the setting sequence of the first mode and the second mode in common, leading to a simplified setting. Furthermore, it is possible to effectively perform the calculation of the A/D conversion correction coefficient in the first mode and the A/D converting in the second mode.

When the analog circuit R-AC generates the analog I signal (R-IA) and the analog Q signal (R-QA) from one high frequency signal (HFS), the first mode and the second mode can be made the same between the first A/D converter and the second A/D converter.

(b) The semiconductor integrated circuit device (RFIC) calculates the A/D conversion correction coefficient of the first and the second A/D converter in the first mode, then calculates the I/Q imbalance correction coefficient in the third mode (the I/Q imbalance correction mode (I/Q-CM)), as follows. The digital error correction circuit (the I/Q imbalance correction circuit (I/QCC)) receives the first digital signal from the first A/D converter that operates in the second mode, and receives the second digital signal from the second A/D converter that operates in the second mode. The third correction coefficient (the correction coefficient (I-I/QCC)) and the fourth correction coefficient (the correction coefficient (Q-I/QCC)) are calculated by performing digital correcting to the first digital signal and the second digital signal.

Accordingly, the A/D conversion correction coefficient is calculated in the first mode. Therefore, in the second mode, the optimal A/D converter correction coefficient for the first and the second A/D converter can be employed. Therefore, in the third mode, the output of the first and the second A/D converter is optimized; accordingly, it is possible to obtain more correctly the third correction coefficient and the fourth correction coefficient.

(c) The semiconductor integrated circuit device (RFIC) is configured such that, in the initial sequence period (ISP), the first and the second A/D converter operate in the first mode, and that, also in the no-signal period (NSP), the first and the second A/D converter operate in the first mode. The reception signal period (RSP) and the no-signal period (NSP) are alternately executed, changing periodically.

Accordingly, in the initial sequence period, when the first and the second A/D converter operate in the first mode, it is possible to acquire the A/D conversion correction coefficient which reflects static variations, such as a process variation. Also in the no-signal period, the first and the second A/D converter operate in the first mode; therefore, it is possible to acquire the optimal A/D conversion correction coefficient which follows fluctuation of the temperature or the power supply voltage.

(d) The semiconductor integrated circuit device (RFIC) is configured such that, in the initial sequence period (ISP), the digital error correction circuit (I/QCC) operates in the third mode, and that, also in the no-signal period (NSP), the digital error correction circuit operates in the third mode. The reception signal period (RSP) and the no-signal period (NSP) are alternately executed, changing periodically.

Accordingly when the digital error correction circuit operates in the third mode in the initial sequence period, it is possible to acquire the first correction coefficient (the correction coefficient (I-CC)) and the second correction coefficient (the correction coefficient (Q-CC)) which reflect static variations, such as a process variation. Also in the no-signal period, the digital error correction circuit operates in the third mode; therefore, it is possible to acquire the optimal first correction coefficient and the optimal second correction coefficient which follow fluctuation of the temperature or the power supply voltage.

(e) The semiconductor integrated circuit device (RFIC) is configured with the frequency setting register (ADC-FSRES) and the period setting register (ADC-PSRES).

Accordingly, by setting the frequency setting register (ADC-FSRES) and the period setting register (ADC-PSRES) in accordance with the characteristics of the communication system of a mobile-phone, for example, to which the baseband unit (BBU), the semiconductor integrated circuit device (RFIC), and the antenna ANT have been incorporated, it is possible to calculate the A/D conversion correction coefficient with accuracy and power consumption which have been appropriately adjusted to the communication system.

(f) The semiconductor integrated circuit device (RFIC) is configured with the frequency setting register (I/Q-FSRES) and the period setting register (I/Q-PSRES).

Accordingly, by setting the frequency setting register (I/Q-FSRES) and the period setting register (I/Q-PSRES) in accordance with the characteristics of the communication system of a mobile-phone, for example, to which the baseband unit (BBU), the semiconductor integrated circuit device (RFIC), and the antenna ANT have been incorporated, it is possible to calculate for the third correction coefficient and the fourth correction coefficient with accuracy and power consumption which have been appropriately adjusted to the communication system.

(g) The semiconductor integrated circuit device (RFIC) employs the A/D converter according to Implementation Example 1 to Implementation Example 4 and their modified examples. Therefore, the operation effects of Implementation Example 1 to Implementation Examples 4 and their modified examples are produced.

Modified Example 3

Figure 19A:
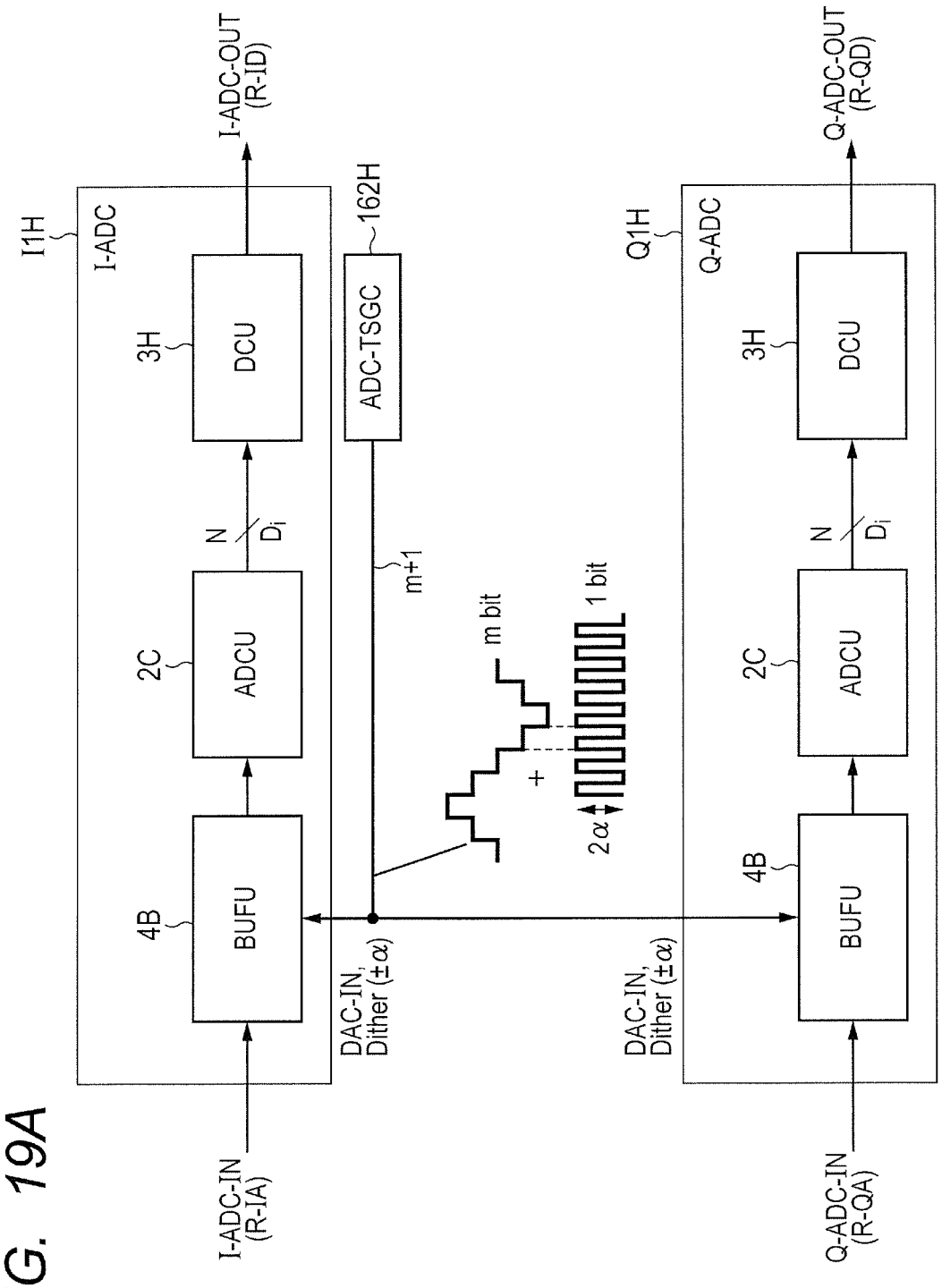
FIG. 19A is a drawing illustrating a configuration of an I signal A/D converter, a Q signal A/D converter, and a test signal generating unit according to Modified Example 3 of Implementation Example 6.

FIG. 19A illustrates a configuration of an I signal A/D converter, a Q signal A/D converter, and a test signal generating unit according to Modified Example 3 of Implementation Example 6. FIG. 19B is a block diagram illustrating a correction coefficient search unit according to Modified Example 3 of Implementation Example 6.

An A/D converter (I-ADC) 11H, an A/D converter (Q-ADC) Q1H, and a test signal generating unit (ADC-TSGC) 162H according to Modified Example 3 as illustrated in FIG. 19A are applied to corresponding Implementation Example 6. The A/D converter according to Modified Example 3 is also a modified example of the A/D converter according to Implementation Example 4.

The A/D converter (I-ADC) 11H is explained. The A/D converter (Q-ADC) Q1H performs the Q signal processing in lieu of the I signal processing. Except for this point, the A/D converter (Q-ADC) Q1H is not different basically from the A/D converter (I-ADC) 11H. Therefore, the duplicated explanation thereof is omitted.

The A/D converter (I-ADC) 11H is improved from the A/D converter 1C according to Implementation Example 3, and is different in the following points. The digital correction unit (DCU) 3C of the A/D converter 1C is provided with two digital correction circuits, the first digital correction circuit (DCC) 31A and the second digital correction circuit (DCC) 32A. However, as illustrated in FIG. 19B, the digital correction unit (DCU) 3H shares a digital correction circuit (DCC) 32C. According to the sharing, the following input/output relation of the signal to the component is realized.

The output of the A/D conversion unit 2C is inputted into the digital correction circuit (DCC) 32C. The output of the digital correction circuit (DCC) 32C is inputted into a multiplexer (MUX) 36C, a delay circuit (DL) 34C, and a gain correction circuit (GC) 35C. The output of the gain correction circuit 35C is inputted into the multiplexer 36C. The conversion error generating circuit EGC generates a conversion error (e) by subtracting an output of the gain correction circuit 35C and 2α as the dither signal (Dither) component from the output of the delay circuit 34C, and this conversion error (e) is inputted into the correction coefficient calculation circuit (CCRev) 3312C. The other signal relation except for the above is basically the same as in the A/D converter 1C according to Implementation Example 3. Therefore, the components of the digital correction unit 3H is configured such that the first digital correction circuit 31A and the second digital correction circuit 32A of the digital correction unit 3C according to Implementation Example 3 share the digital correction circuit 32C.

At the time of the A/D conversion test operation, the following operation is performed.

The drawing of the timing flow at the time of the A/D conversion test operation is the same as the drawing of the timing flow illustrated in FIG. 9 of Implementation Example 3.

(1) Sampling Period (SHC1-S)

In the sampling period (SHC1-S) with the length of one conversion period (1/fs), an m-bit input signal (DAC-IN) (m is a natural number) and a 1-bit dither signal (Dither) are inputted from the test signal generating unit 162H. Accordingly, an output signal (DAC-OUT) is outputted from the buffer unit 4B. Here, the value of the dither signal (Dither) is ±α. The A/D conversion unit 2C samples the output signal (DAC-OUT) as the test signal for calculating the correction coefficient (CC) and the correction coefficient (GC). The waveform of the output signal (DAC-OUT) has a shape of the output signal (DAC-OUT) explained in Implementation Example 2. The sampling is performed in the sampling circuit 21C by setting to ON the switch SHSW1 and setting to OFF the switch CSSW1, the switch SHSW2, and the switch CSSW2, and by storing the output signal (DAC-OUT) in the capacitor SHC1.

(2) Sampling Period (SHC2-S) and Conversion Period (SHC1-C)

After one conversion period (1/fs) of the processing described in (1), the A/D conversion unit 2C samples the output signal (DAC-OUT) in a sampling period (SHC2-S), and at the same time, the A/D conversion unit 2C performs A/D converting to the output signal stored in the capacitor SHC1, and outputs the result to the digital correction unit 3H as the first A/D conversion result (D1R). The sampling is performed in the sampling circuit 21 by setting to OFF the switch SHSW1, setting to ON the switch CSSW1 and the switch SHSW2, and setting to OFF the switch CSSW2, and by storing the output signal (DAC-OUT) in the capacitor SHC2. In parallel with the present sampling, the conversion circuit 22C performs A/D converting to the output signal (DAC-OUT) stored in the capacitor SHC1 and outputs the result as the first A/D conversion result (D1R). Therefore, the sampling period (SHC2-S) is overlapped with the A/D conversion period (SHC1-C). The dither signal (Dither) component α is superimposed on the output signal (DAC-OUT) of this period. The digital correction circuit 32C performs digital correction of the first A/D conversion result (D1R) with the use of the correction coefficient (CC) (labeled as Wi(OLD) in FIG. 19B) and outputs the digital correction result (DC1R) to the delay circuit 34C.

(3) Sampling Period (SHC1-S) and Conversion Period (SHC2-C)

After one conversion period (1/fs) of the processing described in (2), the A/D conversion unit 2C samples the output signal (DAC-OUT) in a sampling period (SHC1-S), and at the same time, the A/D conversion unit 2C performs A/D converting to the output signal stored in the capacitor SHC2, and outputs the result to the digital correction unit 3H as the second A/D conversion result (D2R). The sampling is performed in the sampling circuit 21C by setting to ON the switch SHSW1, setting to OFF the switch CSSW1 and the switch SHSW2, and setting to ON the switch CSSW2, and by storing the output signal (DAC-OUT) in the capacitor SHC1. In parallel with the present sampling, the conversion circuit 22C performs A/D converting to the output signal (DAC-OUT) stored in the capacitor SHC2 and outputs the result as the second A/D conversion result (D2R). Therefore, the sampling period (SHC1-S) is overlapped with the A/D conversion period (SHC2-C). The dither signal (Dither) component −α is superimposed on the output signal (DAC-OUT) of this period. The digital correction unit 3H performs digital correction of the second A/D conversion result (D2R) with the use of the correction coefficient (CC) (labeled as Wi(OLD) in FIG. 19B) and outputs the digital correction result to the gain correction circuit 35C. The gain correction circuit 35C performs digital correction of the output (DC2R) from the digital correction circuit 32C with the use of the correction coefficient (GC) (labeled as W0(OLD) in FIG. 19B) and outputs the digital correction result (GC2R) to the conversion error generating circuit EGC. Since the digital correction result (GC2R) by the gain correction circuit 35C is not delayed in the delay circuit 34C, timing at which the digital correction result (DC1R) of the first A/D conversion result (D1R) is inputted into the conversion error generating circuit EGC and timing at which the digital correction result (GC2R) by the gain correction circuit 35C on the basis of the second A/D conversion result (DC2R) is inputted into the conversion error generating circuit EGC fall in the same period.

The conversion error generating circuit EGC generates the conversion error (e) by subtracting the output (GC2R) supplied by the gain correction circuit 35C from the result (DC1R) of the digital correction performed to the first A/D conversion result (D1R), and further subtracting 2α from the remains. On the basis of this conversion error (e), the correction coefficient calculation circuit 3312C searches for the correction coefficient (CC) and the correction coefficient (GC) by the LMS algorithm.

The correction coefficient calculation circuit 3312C calculates a correction coefficient (CC) with a predetermined algorithm, such as the LMS algorithm, according to the conversion error (e), the first A/D conversion result (D1R), the second A/D conversion result (D2R), and the correction coefficient (CC). Here, the correction coefficient (CC) is the one that is stored in the correction coefficient register (CCRES) 3311C in advance (labeled as W(OLD) combined with the correction coefficient (GC) in FIG. 19B). The newly calculated correction coefficient (CC) (labeled as W(NEW) combined with the correction coefficient (GC) in FIG. 19B) is newly stored in the correction coefficient register 3311C.

Furthermore, the correction coefficient calculation circuit 3312C calculates a correction coefficient (GC) with a predetermined algorithm, such as the LMS algorithm, according to the conversion error (e), the second A/D conversion result (D2R), and the correction coefficient (GC). Here, the correction coefficient (GC) is the one that is stored in the correction coefficient register 3311C in advance (labeled as W(OLD) combined with the correction coefficient (CC) in FIG. 19B). The newly calculated correction coefficient (GC) (labeled as W(NEW) combined with the correction coefficient (CC) in FIG. 19B) is newly stored in the correction coefficient register 3311C.

(4) Sampling Period (SHC2-S) and Conversion Period (SHC1-C) and Subsequent Periods Hereafter, the operation is repeated such that after one conversion period (1/fs) of the processing described in (3), the processing described in (2) is performed, and after one conversion period (1/fs) of the processing described in (2), the processing described in (3) is performed, and so on. Accordingly, the value of the correction coefficient register 3311C is updated. Therefore, the correction coefficient search period (CCS) occurs whenever the sampling period (SHC1-S) occurs.

At the time of the A/D conversion normal operation, the buffer unit 4B is supplied with an input signal (I-ADC-IN) and outputs an output signal (I-ADC-OUT).

The drawing of the timing flow at the time of the A/D conversion normal operation is the same as the drawing of the timing flow illustrated in FIG. 10 of Implementation Example 3. Therefore, the following processing as illustrated in the timing flow of FIG. 10 is executed.

(1) Sampling Period (SHC1-S)

The output signal (I-ADC-OUT) responding to the input signal (I-ADC-IN) is sampled in a sampling period (SHC1-S) with the length of one conversion period (1/fs). The sampling is performed in the sampling circuit 21C by setting to ON the switch SHSW1 and setting to OFF the switch CSSW1, the switch SHSW2, and the switch CSSW2, and by storing the output signal (BUF-OUT) in the capacitor SHC1.

(2) Sampling Period (SHC2-S) and Conversion Period (SHC1-C)

After one conversion period (1/fs) of the processing described in (1), the A/D conversion unit 2C samples the output signal (BUF-OUT) in a sampling period (SHC2-S), and at the same time, the A/D conversion unit 2C performs A/D converting to the output signal stored in the capacitor SHC1, and outputs the result to the digital correction unit 3H as the first A/D conversion result (D1R). The sampling is performed in the sampling circuit 21C by setting to OFF the switch SHSW1, setting to ON the switch CSSW1 and the switch SHSW2, and setting to OFF the switch CSSW2, and by storing the output signal (BUF-OUT) in the capacitor SHC2. In parallel with the present sampling, the conversion circuit 22C performs A/D converting to the output signal (BUF-OUT) stored in the capacitor SHC1 and outputs the result as the first A/D conversion result (D1R). Therefore, the sampling period (SHC2-S) is overlapped with the A/D conversion period (SHC1-C). The digital correction circuit 32C performs digital correction to the first A/D conversion result (D1R) with the use of the correction coefficient (CC) calculated at the time of the A/D conversion test operation and outputs the correction result to the multiplexer 36C. The multiplexer 36C selects the correction result (DC1R) supplied by the digital correction circuit 32C, and outputs it as the output signal (I-ADC-OUT).

(3) Sampling Period (SHC1-S) and Conversion Period (SHC2-C)

After one conversion period (1/fs) of the processing described in (2), the A/D conversion unit 2C samples the output signal (BUF-OUT) in a sampling period (SHC1-S), and at the same time, the A/D conversion unit 2C performs A/D converting to the output signal (BUF-OUT) stored in the capacitor SHC2, and outputs the result to the digital correction circuit 32C as the second A/D conversion result (D2R). The sampling is performed in the sampling circuit 21C by setting to ON the switch SHSW1, setting to OFF the switch CSSW1 and the switch SHSW2, and setting to ON the switch CSSW2, and by storing the output signal (BUF-OUT) in the capacitor SHC1. In parallel with the present sampling, the conversion circuit 22C performs A/D converting to the output signal (BUF-OUT) stored in the capacitor SHC2 and outputs the result as the second A/D conversion result (D2R). Therefore, the sampling period (SHC1-S) is overlapped with the A/D conversion period (SHC2-C). The digital correction circuit 32C performs digital correction to the second A/D conversion result (D2R) with the use of the correction coefficient (CC) calculated at the time of the A/D conversion test operation and outputs the correction result (DC2R) to the gain correction circuit 35C. The gain correction circuit 35C performs digital correction to the output (DC2R) from the digital correction circuit 32C with the use of the correction coefficient (GC) calculated at the time of the A/D conversion test operation, and outputs the correction result (GC2R) to the multiplexer 36C. The multiplexer 36C selects the correction result (GC2R) from the gain correction circuit 35C, and outputs it as the output signal (I-ADC-OUT). As illustrated in FIG. 19B, the delay circuit 34C, the correction coefficient calculation circuit 3312C, and the conversion error generating circuit EGC, which are surrounded by a dotted line, do not operate at the time of the A/D conversion normal operation.

(4) Sampling Period (SHC2-S) and Conversion Period (SHC1-C) and Subsequent Periods Hereafter, the operation is repeated such that after one conversion period (1/fs) of the processing described in (3), the processing described in (2) is performed, and after one conversion period (1/fs) of the processing described in (2), the processing described in (3) is performed, and so on.

In Modified Example 3, the same test signal is supplied from the test signal generating unit 162H to the A/D converter I1H and the A/D converter Q1H; however, the test signal may be different.

Modified Example 4

Figure 20:
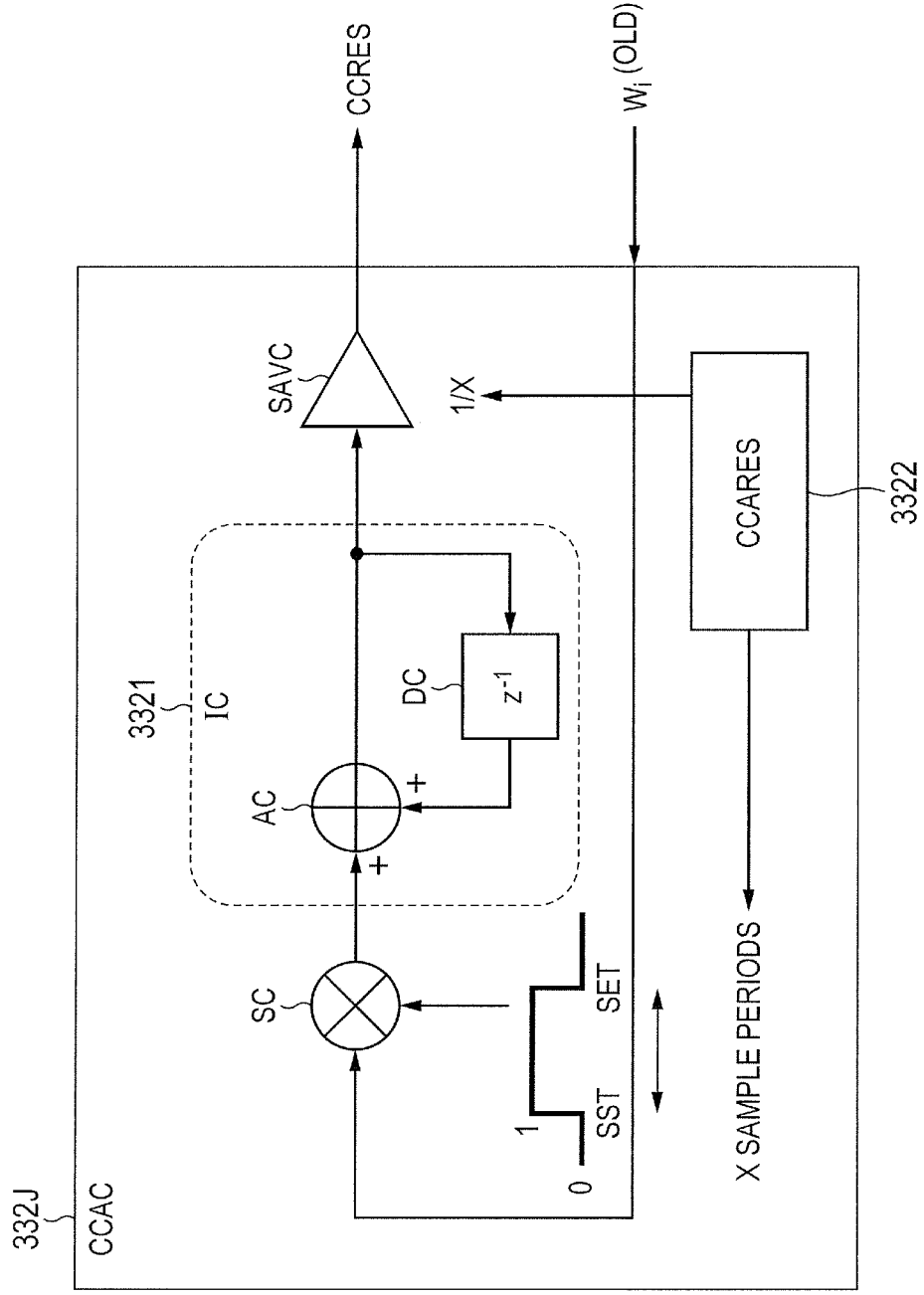
FIG. 20 is a drawing illustrating a configuration of a correction coefficient averaging circuit for an A/D converter according to Modified Example 4 of Implementation Example 6.

FIG. 20 illustrates a configuration of a correction coefficient averaging circuit according to the modified example of the correction coefficient search circuit.

The correction coefficient averaging circuit (CCAU) 332J is applied to the correction coefficient search circuit (CCSC) according to Implementation Example 1 to Implementation Example 4 and Modified Example 1 to Modified Example 2.

(1) Configuration

In order to average the correction coefficient (CC) employed by the first digital correction circuit 31A and the second digital correction circuit 32A, the correction coefficient search circuit (CCSC) is further configured with a correction coefficient averaging circuit (CCAC) 332J.

The correction coefficient averaging circuit (CCAC) 332J is configured with a sampling circuit SC, an integrating circuit (IC) 3321, an averaging circuit SAVC, and an accuracy setting register (CCARES) 3322. The sampling circuit CCSC performs multiplication of the correction coefficient (CC, Wi(OLD)) and X sample periods between the sampling start time (SST) indicating the start time of the sampling and the sampling end time (SET) indicating the end time of the sampling. Here, X is a positive integer. Accordingly, X-time sampling is performed in the X sample periods to the correction coefficient (CC, Wi(OLD)) and 0 is multiplied to the correction coefficient (CC, Wi(OLD)) except for in the X sample periods, thereby masking the correction coefficient (CC, Wi(OLD)). Here, the correction coefficient (CC, Wi(OLD)) is the one that is stored in the correction coefficient register (CCRES) 3311A. The integrating circuit (IC) 3321 is configured with an addition circuit AC and a delay circuit DC, and outputs a total of the X-time sampled data of the correction coefficient (CC, Wi(OLD)) as an output. Here, the addition circuit AC adds the correction coefficient (CC, Wi(OLD)) from the sampling circuit SC, and the previous correction coefficient (CC, Wi(OLD)). The delay circuit DC delays the correction coefficient (CC, Wi(OLD)) from the addition circuit AC by one sample period and returns it to the addition circuit AC. The averaging circuit SAVC divides the output from the integrating circuit (CCIC) 3321 by X. Accordingly, the mean value of the correction coefficient (CC, Wi(OLD)) in the X sample periods is outputted to the correction coefficient register (CCRES) 3311A. The accuracy setting register (CCARES) 3322 specifies the calculation accuracy of the correction coefficient (CC, Wi(OLD)) by setting the value of X.

(2) Operation

In the A/D conversion test operation, the correction coefficient (CC, Wi(OLD)) is updated as required. In this case, the first digital correction circuit 31A or the second digital correction circuit 32A performs digital correcting with the use of the correction coefficient (CC, Wi(OLD)) stored in the correction coefficient register (CCRES) 3311A. Then, the coefficient search circuit 331A makes searching in order to determine the correction coefficient (CC, Wi(OLD)) on the basis of the conversion error (e) calculated from the result of the digital correcting. Then, the correction coefficient (CC, Wi(OLD)) in the correction coefficient register (CCRES) 3311A is updated on the basis of the search results. The above is the operation of the search loop. In parallel to the operation of the search loop, the correction coefficient averaging circuit 332J operates. At this time, the averaging circuit SAVC is not operating and does not supply an output to the correction coefficient register (CCRES) 3311A. When the operation of the search loop stops, the averaging circuit SAVC performs the dividing to average the correction coefficient (CC, Wi(OLD)) to be used in the A/D converter, and outputs the result to the correction coefficient register (CCRES) 3311A.

(3) Summary

When an algorithm such as the LMS algorithm is employed, in order to converge the correction coefficient (CC, Wi(OLD)) quickly, the control loop gain which is the control gain of the above-described search loop for calculating the correction coefficient (CC, Wi(OLD)) is enlarged. This will result in the opposite effect that even after the convergence, the control loop gain will oscillate greatly. The control loop gain after the convergence will oscillate also by the influence of thermal noise or quantizing noise. The influence of the oscillation can be reduced by the averaging of the correction coefficient (CC, Wi(OLD)). In the search loop, no circuit is arranged for the averaging of the correction coefficient (CC, Wi(OLD)). Here, the circuit for the averaging is the correction coefficient averaging circuit 332J. This is because the operation of the search loop becomes slow. Therefore, the circuit for the averaging of the correction coefficient (CC, Wi(OLD)) is arranged out of the search loop. As for the operation, when the search loop is operating, the averaging circuit SAVC is not operating and does not supply an output to the correction coefficient register (CCRES) 3311A. When the operation of the search loop stops, the averaging circuit CCSAVC performs the dividing to average the correction coefficient (CC, Wi(OLD)), and outputs the result to the correction coefficient register (CCRES) 3311A. Accordingly, it is possible to quicken the response of operation of the search loop and to perform the averaging of the correction coefficient (CC, Wi(OLD)) at the same time.

When X of the accuracy setting register (CCARES) 3322 is enlarged, it is possible to increase the number of samples and to enhance the averaging effect; accordingly it is possible to obtain the high-accuracy correction coefficient (CC, Wi(OLD)). When X is small, the accuracy is low. However, the number of samples is small; therefore, it is possible to reduce the time required for averaging of the correction coefficient (CC, Wi(OLD)). When the value of X is restricted to the exponentiation of 2, the operation of the averaging circuit SAVC is not by the division operation but can be realized by the bit shift operation.

Modified Example 5

Figure 21:
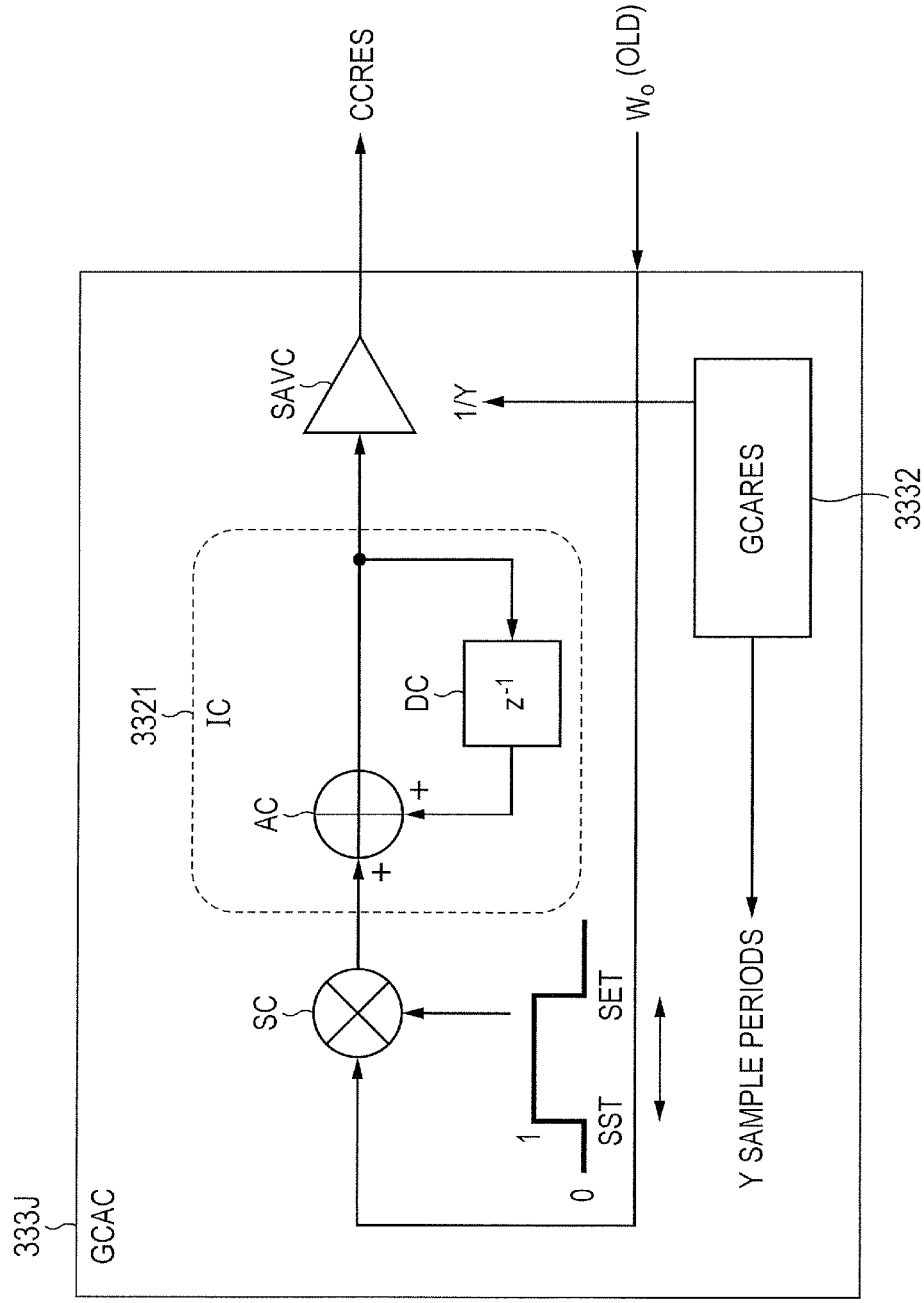
FIG. 21 is a drawing illustrating a configuration of a correction coefficient averaging circuit for an A/D converter according to Modified Example 5 of Implementation Example 6.

FIG. 21 illustrates a configuration of a correction coefficient averaging circuit according to a modified example of the correction coefficient search circuit.

The correction coefficient averaging circuit (GCAC) 333J according to Modified Example 5 is applied to the correction coefficient search circuit according to Implementation Example 3 and Modified Example 3. The correction coefficient averaging circuit (GCAC) 333J according to Modified Example 5 is applied to the correction coefficient search circuit according to Implementation Example 3 and Modified Example 3 in combination with the correction coefficient averaging circuit 332J according to Modified Example 4.

In order to average the correction coefficient (GC) employed by the gain correction circuit 35C, the correction coefficient search circuit is further configured with the correction coefficient averaging circuit (GCAC) 333J.

The configuration of the correction coefficient averaging circuit 333J is basically the same as the configuration of the correction coefficient averaging circuit 332J according to Modified Example 3, as illustrated in FIG. 21. That is, the correction coefficient averaging circuit 333J is configured with the sampling circuit SC, the integrating circuit (IC) 3321, the averaging circuit SAVC, and an accuracy setting register (GCARES) 3332. The points changed from the correction coefficient averaging circuit 332J according to Modified Example 3 are that the correction coefficient (CC, Wi(OLD)) inputted and outputted is changed to a correction coefficient (GC, Wo(OLD)), and the accuracy setting register (CCARES) 3322 is replaced with the accuracy setting register (GCARES) 3332. The accuracy setting register (CCARES) 3322 specifies the calculation accuracy of the correction coefficient (CC, Wi(OLD)) by setting the value of X. However, the accuracy setting register (GCARES) 3332 specifies the calculation accuracy of the correction coefficient (GC, Wo(OLD)) by setting the value of Y. Here, Y is a positive integer. That is, in the explanation of (1) Configuration, (2) Operations, and (3) Summary of Modified Example 3, when the correction coefficient averaging circuit 332J is read as the correction coefficient averaging circuit 333J, the accuracy setting register (CCARES) 3322 as the accuracy setting register (GCARES) 3332, X as Y, and the correction coefficient (CC, Wi(OLD)) as the correction coefficient (GC, Wo(OLD)), then, the explanation of the configuration, operation, and summary of Modified Example 4 is given.

As described above, the invention accomplished by the present inventors has been concretely explained based on Implementation Examples and Modified Examples. However, it cannot be overemphasized that the present invention is not restricted to them, and it can be changed variously in the range which does not deviate from the gist.

What is claimed is:
1. A semiconductor integrated circuit device comprising:
an A/D conversion unit;
a digital correction unit operable to output an A/D conversion result by performing digital correcting to a digital output received from the A/D conversion unit; and a holding unit operable to hold a test signal to the A/D conversion unit, wherein the A/D conversion unit is of a charge sharing type and operable to perform successive approximation, wherein, at the time of a test, a test signal with the same analog value from the holding unit is inputted into the A/D conversion unit in a first period and a second period different from the first period, a first dither signal is inputted into the A/D conversion unit in the first period, and an A/D conversion correction coefficient is determined, on the basis of a first digital correction result in the digital correction unit to a first digital output from the A/D conversion unit in the first period and a second digital correction result in the digital correction unit to a second digital output from the A/D conversion unit in the second period, and wherein, at the time of a normal operation, the digital correcting is performed with the use of the A/D conversion correction coefficient determined at the time of the test.

2. The semiconductor integrated circuit device according to claim 1, wherein the holding unit is provided with an operational amplifier and acts as a D/A converter operable to generate the test signal.

3. The semiconductor integrated circuit device according to claim 2, wherein the operational amplifier also acts as an input buffer circuit for the A/D conversion unit at the time of the normal operation.

4. The semiconductor integrated circuit device according to claim 1, wherein the holding unit is a sample hold circuit.

5. The semiconductor integrated circuit device according to claim 1, wherein, in the test period, a second dither signal different from the first dither signal is inputted into the A/D conversion unit in the second period.

6. The semiconductor integrated circuit device according to claim 1, wherein the A/D conversion unit comprises:

a first sampling circuit;

a second sampling circuit; and a conversion unit, wherein the A/D conversion unit operates by repetition of a first timing and a second timing, wherein, in the first timing, the first digital output is generated in the conversion unit by A/D converting the first analog signal as the test signal held in the first sampling circuit, and a second analog signal as the test signal from the holding unit is held in the second sampling circuit, wherein, in the second timing, the second digital output is generated in the conversion unit by A/D converting the second analog signal held in the second sampling circuit, and a first analog signal from the holding unit is held in the first sampling circuit, and wherein the digital correction unit comprises:

a gain correction circuit operable to correct the gain error caused by the difference between the first sampling circuit and the second sampling circuit.

7. The semiconductor integrated circuit device according to claim 2, wherein the D/A converter comprises:

a first D/A conversion circuit operable to generate the first dither signal; and a second D/A conversion circuit operable to generate the test signal, and wherein, in the first period at the time of the test, the first dither signal superimposed on the test signal is inputted to the A/D conversion unit from the holding unit.

8. A semiconductor integrated circuit device comprising:

an A/D conversion unit;

a digital correction unit operable to output an A/D conversion result by performing digital correcting to a digital output received from the A/D conversion unit; and a holding unit operable to hold a test signal to the A/D conversion unit, wherein the digital correction unit comprises:

a delay circuit, wherein the A/D conversion unit is of a charge sharing type and operable to perform successive approximation, wherein a test signal with the same analog value from the holding unit is inputted into the A/D conversion unit in a first period and a second period different from the first period, a first dither signal is inputted into the A/D conversion unit in the first period, and an A/D conversion correction coefficient is calculated, on the basis of a first digital correction result in the digital correction unit to a first digital output from the A/D conversion unit in the first period and a second digital correction result in the digital correction unit to a second digital output from the A/D conversion unit in the second period, and wherein the A/D conversion correction coefficient is calculated by comparing the first digital correction result with the second digital correction result, with the aid of delay processing by the delay circuit.

9. A semiconductor integrated circuit device comprising:

an A/D conversion unit of a charge sharing type operable to perform successive approximation;

a digital correction unit operable to output an A/D conversion result by performing digital correcting to a digital output received from the A/D conversion unit; and a holding unit operable to hold a test signal, wherein a test signal of a common value from the holding unit is inputted into the A/D conversion unit in a first period and a second period different from the first period, and wherein an A/D conversion correction coefficient for the digital correction unit is calculated, on the basis of a first digital correction result in the digital correction unit in the first period and a second digital correction result in the digital correction unit in the second period.

10. The semiconductor integrated circuit device according to claim 9, wherein the A/D conversion unit comprises:

a first sampling circuit;

a second sampling circuit; and a conversion unit, wherein the A/D conversion unit operates by repetition of a first timing and a second timing, wherein, in the first timing, the first digital output is generated in the conversion unit by A/D converting the first analog signal held in the first sampling circuit, and a second analog signal from the holding unit is held in the second sampling circuit, and wherein, in the second timing, the second digital output is generated in the conversion unit by A/D converting the second analog signal held in the second sampling circuit, and a first analog signal from the holding unit is held in the first sampling circuit.

11. The semiconductor integrated circuit device according to claim 10, wherein the digital correction unit comprises a gain correction circuit operable to correct the gain error caused by the difference between the first sampling circuit and the second sampling circuit.

* * * * *